United States Patent [19]

Iwahashi

[11] Patent Number: 5,579,260
[45] Date of Patent: Nov. 26, 1996

[54] NON-VOLATILE SEMICONDUCTOR MEMORY DEVICE AND DATA PROGRAMMING METHOD

[75] Inventor: Hiroshi Iwahashi, Yokohama, Japan

[73] Assignee: Kabushiki Kaisha Toshiba, Tokyo, Japan

[21] Appl. No.: 296,747

[22] Filed: Aug. 26, 1994

[30] Foreign Application Priority Data

Aug. 27, 1993 [JP] Japan .................................. 5-235576

[51] Int. Cl.$^6$ ...................................................... G11C 7/00
[52] U.S. Cl. ................ 365/185.24; 365/189.05; 365/185.01
[58] Field of Search ............................... 365/185, 218, 365/900, 189.05, 230.08, 185.24, 185.01

[56] References Cited

U.S. PATENT DOCUMENTS

| | | | |
|---|---|---|---|
| 4,933,904 | 6/1990 | Stewart | 365/195 |
| 4,953,129 | 8/1990 | Kobayashi et al. | 365/185 |
| 4,962,481 | 10/1990 | Choi et al. | 365/185 |
| 5,299,162 | 3/1994 | Kim et al. | 365/185 |
| 5,369,609 | 11/1994 | Wang et al. | 365/185 |
| 5,414,658 | 5/1995 | Challa | 365/185 |

FOREIGN PATENT DOCUMENTS

| | | |
|---|---|---|
| 56-114199 | 9/1981 | Japan . |
| 56-130891 | 10/1981 | Japan . |
| 6417296 | 1/1989 | Japan . |
| 143400 | 9/1989 | Japan . |

*Primary Examiner*—David C. Nelms
*Assistant Examiner*—Vu A. Le
*Attorney, Agent, or Firm*—Loeb & Loeb LLP

[57] ABSTRACT

In a non-volatile semiconductor memory, a large current can be flowed through the memory cell during reading. The number of the column lines can be reduced. The electron injection to the floating gates of the respective memory cells is averaged to reduce the dispersion of the threshold voltages thereof. The electron emission from the floating gates of the respective memory cells is also averaged to reduce the dispersion of the threshold voltages thereof. An increase in chip size due to latch circuits can be prevented. By noting that either of a plurality of "0" or "1" of the binary data are stored much in the memory cells of the memory cell bundle or block, a negative threshold voltage is allocated to the memory cells for storing the more bit side data of the binary data. A single column line is used in common for the two adjacent memory blocks. To inject electrons to the floating gates of the memory cells, voltage is increased gradually and stopped when electrons have been injected up to a predetermined injection rate. Electrons are once emitted from the floating gates, and thereafter the electrons are injected again to store one of a binary data. Further, the data latch circuits can be formed at any positions remote from the memory cell array.

4 Claims, 35 Drawing Sheets

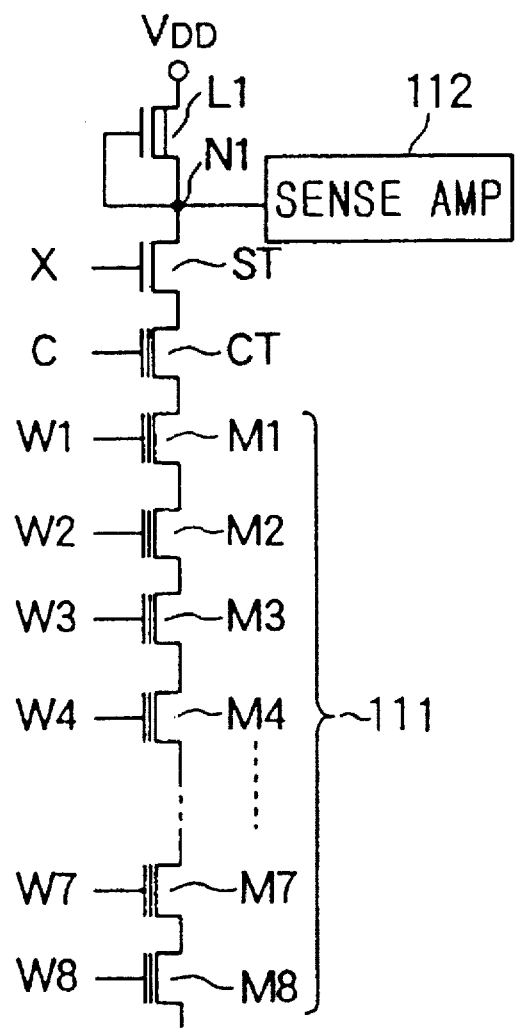
F I G. 1

| | NUMBER OF "1" OR "0" IN 8 MEMORY CELLS | | THRESHOLD OF TRANSISTOR TO "1" OR "0" | | THRESHOLD OF CHECK BIT TRANSISTOR |
|---|---|---|---|---|---|
| | "1" | "0" | "1" | "0" | |
| no.1 | 0 | 8 | + | − | + |
| no.2 | 1 | 7 | + | − | + |
| no.3 | 2 | 6 | + | − | + |
| no.4 | 3 | 5 | + | − | + |
| no.5 | 4 | 4 | − | + | − |
| no.6 | 5 | 3 | − | + | − |
| no.7 | 6 | 2 | − | + | − |
| no.8 | 7 | 1 | − | + | − |
| no.9 | 8 | 0 | − | + | − |

FIG. 2

| A0 | D1L | DIR | Z1 | |
|---|---|---|---|---|
| 0 | 0 | 0 | 1 | |
| 0 | 1 | 0 | 0 | DIL:DATA |
| 0 | 0 | 1 | 0 | DIR:CHECK DATA |
| 0 | 1 | 1 | 1 | |
| 1 | 0 | 0 | 1 | |
| 1 | 0 | 1 | 0 | DIL:CHECK DATA |
| 1 | 1 | 0 | 0 | DIR:DATA |
| 1 | 1 | 1 | 1 | |

YNR,YNL ——————————— "0"
X1R,X1L ——————————— "1"

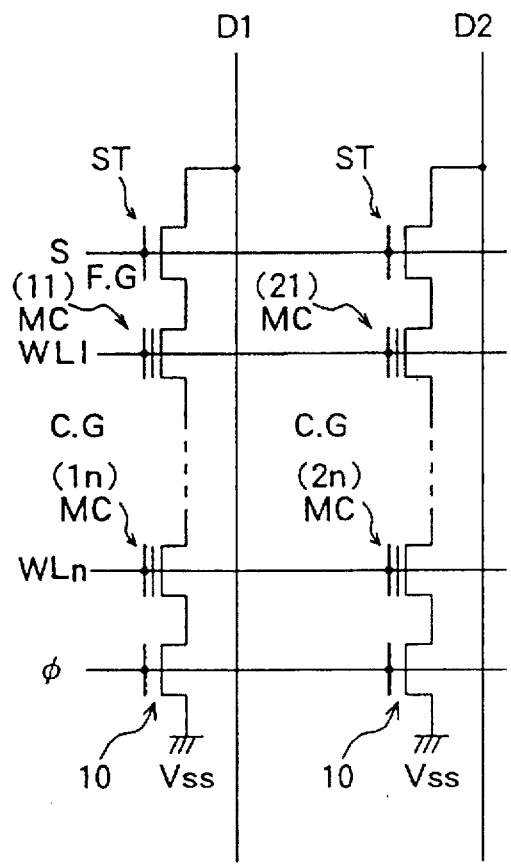
FIG. 29 (a) PRIOR ART
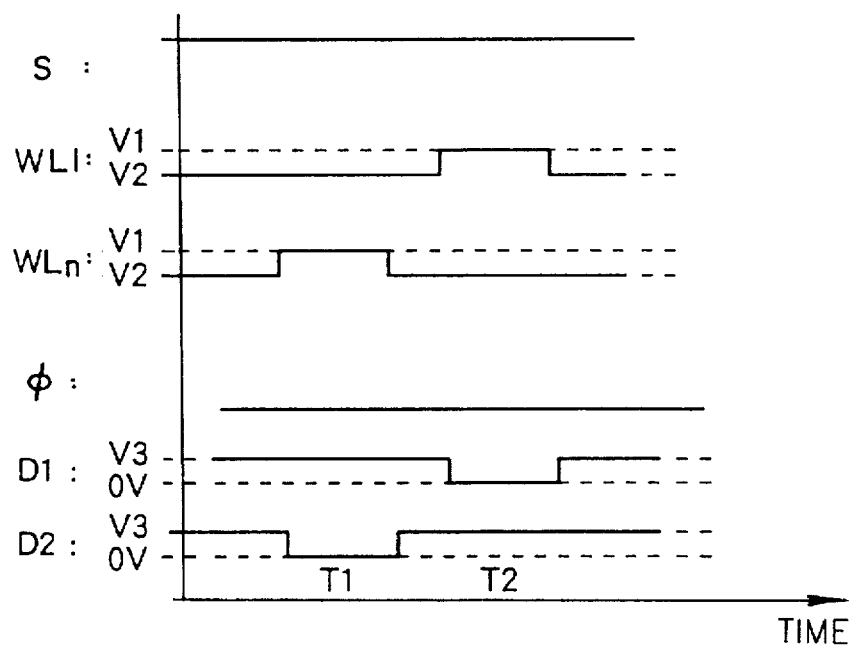
FIG. 29 (b) PRIOR ART

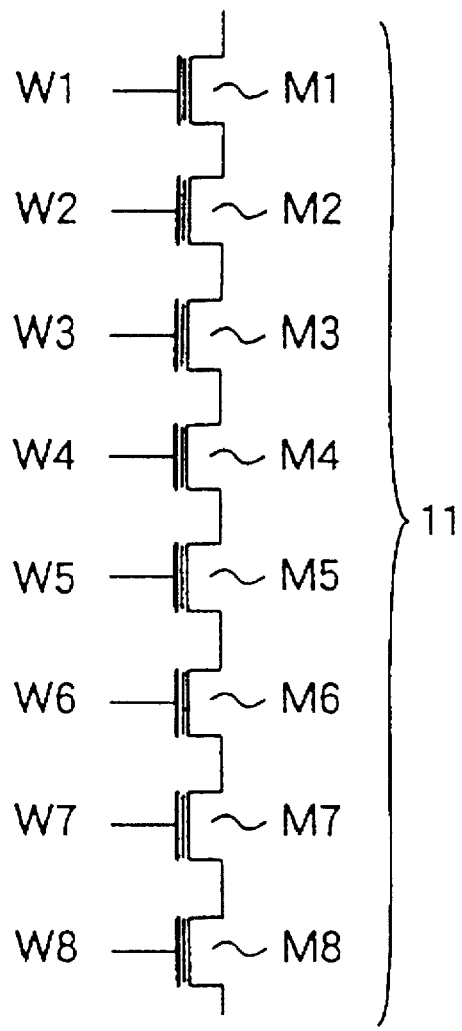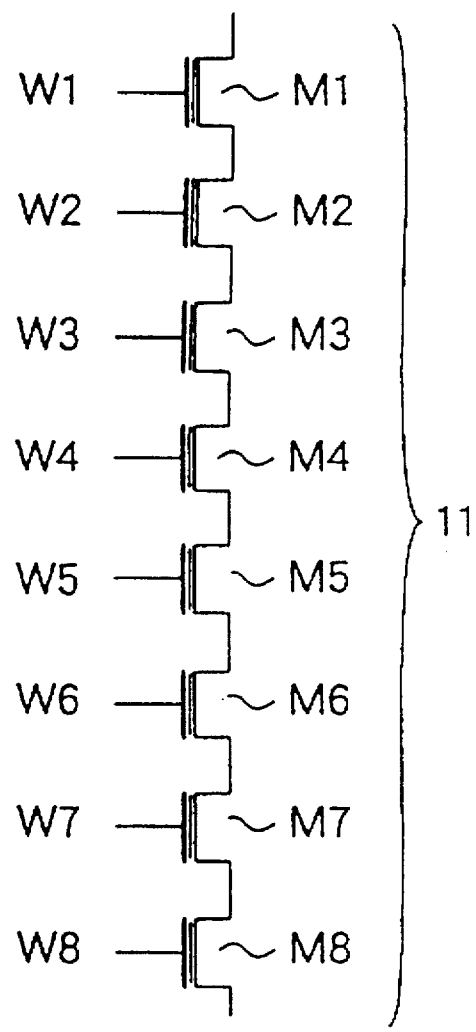
FIG. 32 (a)
PRIOR ART
FIG. 32 (b)
PRIOR ART

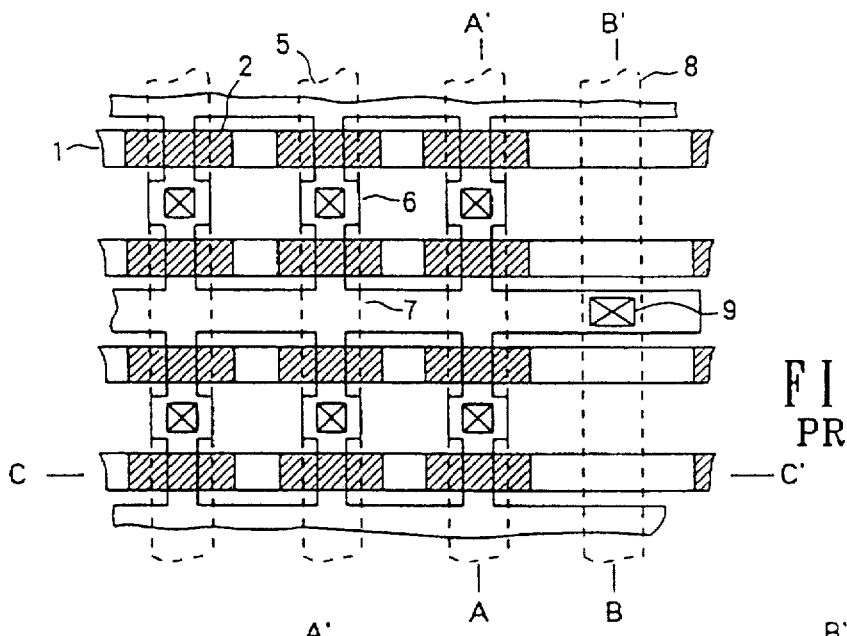
FIG. 33 (a)
PRIOR ART
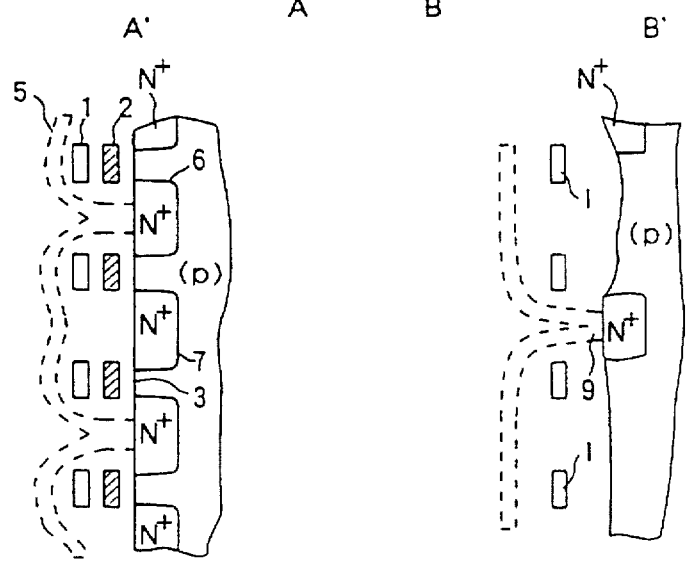
FIG. 33 (b)
PRIOR ART
FIG. 33 (c)
PRIOR ART
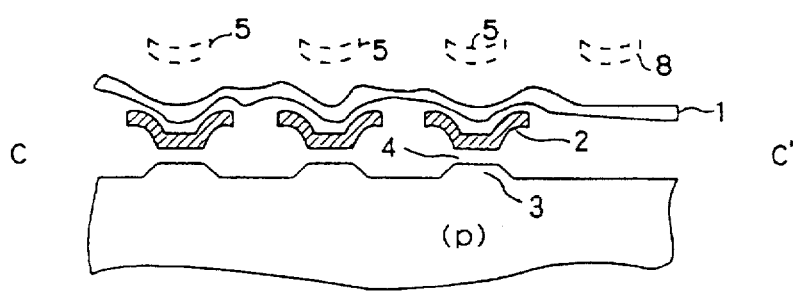
FIG. 33 (d)
PRIOR ART 5,579,260

1

NON-VOLATILE SEMICONDUCTOR MEMORY DEVICE AND DATA PROGRAMMING METHOD

FIELD OF THE INVENTION

The present invention relates to a non-volatile semiconductor memory device and its data programming method.

BACKGROUND OF THE INVENTION

A memory cell of an NAND type EEPROM is shown in FIG. 28. FIG. 28 is a schematic sectional view of the memory cell MC. The gate insulation film GO which is formed between floating gate FG and channel region CA is sufficiently thin to allow an electron tunnel effect to occur between the floating gate FG and the channel region CA. Electrons are emitted from the floating gate FG to the channel region CA by supplying a high voltage to the substrate Sb, and 0 V to the control gate CG, so that one of a binary data is stored in the memory cell. On the other hand, when the other of a binary data is stored in the memory cell, electrons are injected from the channel region CA to the floating gate FG. In order to inject electrons to the floating gate FG, a high voltage is supplied to the control gate CG, and 0 V is supplied to the channel region CA, source S and drain D. A part of a memory cell array of the NAND type EEPROM is shown in FIG. 29(a). The memory cells MC are serially connected between the select transistor ST and the transistor 10. Further, FIG. 29(b) shows voltage waveform diagrams at the respective nodes shown in FIG. 29(a). When data are programmed to the memory cells MC, first electrons are emitted from the floating gates FG of all the memory cells MC to the substrate by setting all the row lines WL1 to WLn connected to the control gates CG to 0 V and the substrate to a high voltage. After that, a high voltage is supplied to the row select line S connected to the gates of the select transistors ST connected to the memory cells MC to which data are to be written. At the same time, signal φ which is applied to the gates of the transistors 10 is set to 0 V to turn off transistors 10 to disconnect the memory cells MC from the reference potential VSS. When electrons are injected to the floating gates FG of the memory cells MC, the row line WL corresponding thereto is set to the high potential V1, and column lines D corresponding thereto are set to 0 V. At this time, a potential difference between the floating gates FG and the channel region CA becomes large enough to occur the electron tunnel effect, so electrons are injected to the floating gates FG from the channel region CA. On the other hand, the non-selected row lines WL are set to the potential V2 lower than the high potential V1. At this time, although the potential of the column lines D is 0 V, since the potential V2 is low, the potential difference between the floating gates FG of the memory cells applied the potential V2 and the channel region CA is not large enough to cause the electron tunnel effect, so electrons are not injected to the floating gates FG of the memory cells applied the potential V2. In the memory cells connected to the row line WL of the high potential V1, if the column lines D are set to the potential V3, since the potential difference between the floating gates FG and the channel region CA is not large enough to cause the electron tunnel effect, electrons are not injected to the floating gates FG. In FIG. 29(b), at time T1, electrons are injected to the floating gate FG of memory cell 2n, but not injected into the floating gate FG of the memory cell 1n because the voltage of the column line D1 is the

2 potential V3. In the same way, at time T2, electrons are injected to the floating gate FG of memory cell 11, but not injected to the floating gate FG of the memory cell 21.

In the memory cells MC, if the electrons are injected to the floating gate FG thereof, the threshold voltage thereof becomes a positive value; and if the electrons are emitted from the floating gate FG thereof, the threshold voltage thereof becomes a negative value. In a data read mode, when the memory cell MC is selected, the gate thereof is set to a logic "0", for instance to 0 V. When the threshold voltage of the selected memory cell MC is the negative value, the selected memory cell MC is turned on. However, when the threshold voltage of the selected memory cell MC is the positive value, the selected memory cell MC is turned off. The data stored in the selected memory cell MC is detected depending on whether or not the selected memory cell MC is turned on. On the other hand, the gate of the non-selected memory cell MC connected to the selected memory cell is set to a logic "1", for instance to 5 V. So the non-selected memory cell MC is turned on even when electrons are injected into the floating gate.

Referring to FIG. 30, the data reading operation will be explained. The depletion type MOS transistor L1 which acts as a load for the memory cell, the select transistor (enhancement type) ST, the memory cells M1 to M8, and the transistor 10 are connected in series between the power supply voltage VDD and the reference potential (VSS). The gate of the transistor L1 is connected to a connecting point (node N1) between the transistor L1 and the select transistor ST. The signal X for selecting memory block 11 composed of the memory cells M1 to M8 is supplied to the gate of the select transistor ST. Further, the signals W1 to W8 for selecting one of the memory cell of the memory block 11 are supplied to the gates of the memory cells M1 to M8, respectively. The sense amplifier 12 is connected to the node N1. The data stored in the selected memory cell can be read by being detected the voltage level of the node N1 by the sense amplifier 12. In the data read mode, the signal φ which is applied to the gate of the transistor 10 is a logic "1". So the transistor 10 is turned on. The memory block 11 is connected to the reference potential through the transistor 10 in the data read mode. In the circuit shown in FIG. 30, the assumption is made that electrons are emitted from the floating gates of the memory cells M2 and M4, so the threshold voltages of the memory cells M2 and M4 are negative, and further the memory cell transistor M4 is selected, for instance. The threshold voltages of the other memory cells M1, M3, and M5 to M8 are positive. In this case, as shown by a timing chart in FIG. 31, the signal X is set to a logic "1", the signals W1 to W3, W5 to W8 are set to a logic "1", and the signal W4 is set to a logic "0". By the above-mentioned setting, the select transistor ST and the memory cells M1 to M3 and M5 to M8 are turned on. Further, since the threshold voltage of the memory cell M4 is negative, this memory cell M4 is also turned on. Accordingly, the node N1 is discharged toward the reference potential through the select transistor ST, the memory cells M1 to M8, and the transistor 10. The data stored in the memory cell M4 can be read by being detected the voltage of the node N1 by the sense amplifier 12. After that, the memory cell M3 is assumed to be selected. In this case, the signal W3 is set to a logic "0", and all other signals are set to a logic "1". In this case, since the threshold voltage of the memory cell M3 is positive, the memory cell M3 is turned off. Thus, since the discharging path of the node N1 toward the reference potential is cut off, this node N1 is charged toward the power source voltage VDD through the transistor L1. By detecting the charged voltage of the node N1, the data can be read from the memory cell M3.

However, in the case where data of a logic "1" or a logic "0" is stored in the memory cell depending on whether the threshold voltage of the memory cell is negative or positive, the amount of current flowing through the memory block is according to the number of the memory cells having positive threshold voltages and the number of the memory cells having negative threshold voltages which are included in the memory block. So the amount of current flowing through each of the memory blocks is different from each other. Thus, the discharging speed at the node N1 differs according to the number of the memory cells whose threshold voltages are positive and the number of the memory cells whose threshold voltages are negative in the series-connected memory cells of the memory block.

For instance, as shown in FIG. 32(a), in the case where electrons are injected to the floating gates of the memory cells M1 to M7 so that these memory cells have a positive threshold voltage and further where only the memory cell M8 has a negative threshold voltage. If the memory cell M8 is selected, since the threshold voltages of all the other transistors M1 to M7 are positive, the amount of the current flowing through the memory block 11 is a minimum. On the other hand, as shown in FIG. 32(b), in the case where all the memory cells M1 to M8 for constituting the memory block 11 have a negative threshold voltage, the amount of the current flowing through the memory block 11 is a maximum. Since the potentials of the signals W1 to W8 shown in FIG. 32(b) are the same as those shown in FIG. 32(a), a larger current flows through the memory cells whose threshold voltages are negative, compared with the memory cells whose threshold voltages are positive. Accordingly, in the NAND type EEPROM, there exist shortcomings in that the data read speed is determined depending on the ratio of the number of the memory cells having the positive threshold voltage to the number of the memory cells having the negative threshold voltage in the memory block, as described above. In addition, since the current flowing through the memory block of FIG. 32(a) is the minimum, it is necessary to determine the current driving capability of the load transistor L1 in accordance with the minimum current of the memory block, for this reason it is impossible to increase the current driving capability of the load transistor L1. Consequently, the charging speed at the node N1 is also lowered.

Furthermore, in the above-mentioned conventional memory device, one memory cell block corresponds to one column line. So, the area occupied by the memory cell array has been determined the junction portions between the memory cell blocks and the column lines at the two adjacent memory cell blocks. Further, the production yield has been influenced by an increase in the number of the column line wires and the number of the junction portions.

Further, one of a binary data are written by emitting electrons from the floating gates of all the memory cells at the same time to set the threshold voltages of the memory cells to the negative value. After that, the other of a binary data are written by selectively injecting electrons to the floating gates thereof.

When data are read from the memory cells, the selected row line is set to a logic "0" (e.g., 0 V) and the non-selected row lines are set to a logic "1" (e.g., 5 V). Since the non-selected row lines are at a logic "1", the non-selected memory cells are turned on irrespective of whether the threshold voltages thereof are positive or not. On the other hand, the selected row line is at 0 V. Accordingly, if the threshold voltage of the selected memory cell is positive, the selected memory cell is turned off, and if the threshold voltage of the selected memory cell is negative, the selected memory cell is turned on. As already described above, the data stored in the memory cell is detected depending on whether the selected memory cell is turned on or off. The memory cell which has a positive threshold voltage is turned on if a logic "1" level signal is applied to the control gate thereof, and is turned off if a logic "0" level signal is applied to the control gate thereof. Therefore, care must be taken about the quantity of electrons injected into the floating gate. Accordingly, the injection of electrons and the reading for checking the quantity of electrons injected into the floating gate are carried out repeatedly, and the injection of electrons is stopped whenever the threshold voltage of the memory cell reaches an appropriate value. However, since electrons are injected through an extremely thin gate insulation film, the threshold voltages of the memory cells after the injecting of electrons do not become uniform and vary according to a certain distribution owing to subtle variations in the quality of the gate insulation film and a manufacturing process. Thus, the threshold voltages of the memory cells in which electrons are injected are distributed within a range. Accordingly, a difference in the threshold voltage between the memory cell having the maximum threshold voltage and that having the minimum threshold voltage causes a difference in current flowing through the memory cell between the two, so that the data reading speeds from the selected memory cells differ according to the threshold voltages of the memory cells. In other words, since the current flows through the selected memory cell and the non-selected memory cells connected to the selected memory cell in series, the distribution of the threshold voltages of the non-selected memory cells causes directly the dispersion in the current flowing through the non-selected memory cells, so that the data read speed distributes according to the non-selected memory cells connected to the selected memory cell. To get a high data read speed, it is preferable to flow a large current through the memory cell. However, the threshold voltages of the memory cells in which electrons are injected must have a positive value. So, even if the threshold voltage of the memory cell having a minimum value is set to a value slightly higher than 0 V, the threshold voltage of the memory cell having a maximum value is inevitably a value far higher than 0 V due to the distribution of the threshold voltages of the memory cells in which electrons are injected.

In addition, in conventional NOR type flash EEPROM, when data is programmed, first, electrons are injected to the floating gates of all the memory cells to uniformalize the quantities of electrons stored in the floating gates of all the memory cells, and then electrons are emitted from the floating gates of all the memory cells. The other of a binary data is selectively written in the selected memory cell by applying a high voltage to the control gate and the drain of the selected memory cell to flow a channel current and thereby to inject electrons from the channel region to the floating gate of the selected memory cell. In the conventional NOR type flash EEPROM as described above, however, when electrons are emitted from the floating gate of the memory cell excessively, the threshold voltage of the memory cell becomes a negative value, so each non-selected memory cell whose gate voltage is set to 0 V is rendered conductive, disabling a selecting operation. In the conventional NOR type flash EEPROM, therefore, the emitting of electrons and the reading of data of the memory cell are performed repeatedly, and the electron-emitted state of the floating gate is checked in each read operation so that the emitting of electrons is stopped when the threshold voltage of the memory cell reaches a proper value. To prevent electrons from being emitted excessively, a period of the emitting electrons is set to be short, and the emitting and the reading are repeated several times to obtain an appropriate threshold voltage. In this emitting of electrons, electrons are emitted from the floating gate to the source or drain of the memory cell by the electron tunnel effect, by applying 0 V to the control gate and a high voltage to the source or drain thereof. Accordingly, the thickness of the gate insulation film between the floating gate and the channel region is formed with an extremely, for example about 100 angstroms, so that the electron tunnel effect can be obtained. As a result, the threshold voltages of the memory cells obtained after electrons have been emitted are not uniform and thereby distribute within a range in all the memory cells, due to subtle variations in the manufacturing process. When the current flowing through the memory cell is large, the high data read speed is achieved. Accordingly, it is preferable that the threshold voltage of the memory cell is low. However, when electrons are emitted until an optimal threshold voltage can be obtained in the memory cell having the highest threshold voltage within the distribution, the threshold voltage of the memory cell having the lowest threshold voltage within the distribution becomes a negative value. To avoid this problem, in the EEPROM as described above, the threshold voltage of the memory cell having the lowest threshold voltage within the distribution is determined so as to become a positive value. Consequently, the data read speed of the memory cell having the highest threshold voltage within the distribution is delayed, and thereby it has been difficult to get a high data read speed.

FIGS. 33(a) to (d) show an example of the memory cell array of the conventional NOR type flash EEPROM, in which FIG. 33(a) is a plan view; FIG. 33(b) is a cross-sectional view taken along the line A—A'; FIG. 33(c) is a cross-sectional view taken along the line B—B'; and FIG. 33(d) is a cross-sectional view taken along the line C—C'. Further, FIG. 34 is a symbolic diagram thereof. In FIGS. 33(a) to (d), numeral 1 shows the row lines which form control gates of the memory cells. Numeral 2 shows the floating gates; 3 shows the channel regions; and 4 shows the gate insulation films. Numeral 5 shows the column lines formed of aluminum, for instance, which are connected to the drains 6 used in common for the two adjacent memory cells. Numeral 8 shows a wire formed of aluminum, for instance, for supplying a reference potential (e.g., a ground potential) when data are read and a high voltage when electrons are emitted from the floating gates, which is connected to source 7 of the memory cell at junction point 9 so as to be used in common for the two adjacent memory cells.

In the conventional nor type flash EEPROM constructed as described above, when electrons are emitted excessively from the floating gate and thereby the threshold voltage of the memory cell becomes a negative value, the non-selected memory cells whose control gates are at 0 V are turned on. Consequently, the column line 5 and the wire 8 are connected through the non-selected memory cell, so that current flows from the column line 5 to the wire 8 through the non-selected memory cell. Thus, when data are read or written, even if a voltage is applied to the column line 5, since current flows through the non-selected memory cell, the applied voltage drops. Accordingly, even if the selected memory cell is turned off in the data read operation, since current flows through the non-selected memory cell, erroneous data are to be read and further it is impossible to supply a necessary and sufficient voltage in data writing. As a result, as already explained, in the dispersion range of all the memory cells after electrons have been emitted from the floating gates, since it is necessary to set the threshold voltage of the memory cell having the lowest threshold voltage to a positive value, the data read speed is determined by that of the memory cell having the highest threshold voltage, with the result that it is impossible to get a high data read speed.

As already explained, in the EEPROM, data are programmed by injecting and emitting electrons to and from the floating gates through the oxide film with a thickness of about 100 angstroms which is far thinner than that of the gate oxide film. FIG. 35 is a symbolic diagram showing a memory cell of a conventional EEPROM for programming data in further a different way. Here, the control gate voltage is showed by VCG; the drain voltage is showed by VD; the source voltage is showed by VS; and the drain current is showed by ID. The drain current ID relative to the control gate voltage VCG can be represented by the characteristics as shown in FIG. 36. In FIG. 36, curve A represents the initial characteristics; curve B represents the characteristics when electrons are injected to the floating gate, in which the threshold voltage is raised due to the injection of electrons; and curve C represents the characteristics when electrons are emitted from the floating gate, in which the threshold voltage change to negative due to the emission of electrons. In the memory cell, data of a logic "0" and a logic "1" are stored by use of the characteristics represented by the curves B and C.

FIG. 37 shows an example of the circuit configuration of the EEPROM constructed by arranging the memory cells as shown in FIG. 35 into a matrix pattern. As shown in FIG. 37, selecting MOS transistor ST is connected in series to memory cell transistor CT, and one memory cell 14 is composed of two transistors CT and ST. In the configuration as described above, when electrons are injected to the floating gate of the memory cell transistor CT, high voltages VG and VCG are applied to the gate of the selecting transistor ST and the control gate of the memory cell transistor CT, respectively, and in addition the column line 15 is set to 0 V. On the other hand, when electrons are emitted from the floating gate, the gate of the selecting transistor ST and the column line 15 are set to high voltages and the control gate of the memory cell transistor CT is set to 0 V. Thus, the high voltage is applied to the drain of the memory cell transistor CT, so that electrons are emitted from the floating gate to the drain.

FIG. 38(a) is a pattern plan view of region 16 enclosed by dot-dashed lines in the circuit shown in FIG. 37, and FIG. 38(b) shows a cross section taken along the line A— A' in FIG. 38(a). In both FIGS. 38(a) and (b), the same reference numerals have been retained for the parts or elements corresponding to those shown in FIG. 37, and further the numeral 17 shows the source region of the memory cell transistor CT; 18 shows the drain of the memory cell transistor CT and the source region of the selecting transistor ST; 19 shows the drain region of the selecting transistor ST; 20 shows the floating gate of the memory cell transistor CT; 21 shows the control gate of the memory cell transistor CT; 22 shows the gate of the selecting transistor ST; 23 shows a thin gate insulation film; and 24 shows a contact portion between the column line 15 and the drain of the selecting transistor ST.

In the EEPROM as described above, in order to shorten the time required to program the data to the memory cells, as shown in FIG. 39, latch circuits L are provided for each column line 15. Further, data to be programmed to the memory cells 14 connected to the respective corresponding column line 15 are first latched by the latch circuits L respectively, and data are simultaneously programmed to the memory cells 14 for one row in accordance with the latched data of the latch circuit. In the EEPROM as constructed above, although it is possible to shorten the time required to program the data, since the latch circuits are provided for each column line, there exists a drawback in that the chip size increases to the extent required for the latch circuits, and thereby the chip cost increases.

In the semiconductor memory device already explained by FIGS. 28 to 32, the current flowing through the memory block differs according to the ratio of the number of the memory cells (constituting the memory block) having the positive threshold voltages to that having the negative threshold voltages. Accordingly, when the memory cells of the memory block include many MOS transistors having the positive voltages, the data read speed is delayed. In addition, since the current flowing through the memory block of FIG. 32(a) is the minimum, it is necessary to determine the current driving capability of the load transistor L1 in accordance with the minimum current of the memory block, for this reason it is impossible to increase the current driving capability of the load transistor L1. Consequently, the charging speed at the node N1 is also lowered.

SUMMARY OF THE INVENTION

With the above described situation in mind, therefore, it is an object of the first aspect of the present invention to provide a non-volatile semiconductor memory device in which large current can be flowed through the memory block to improve the data read speed.

Furthermore, as already described, in the conventional semiconductor memory device, since one column line is formed in correspondence to the memory block of one column, there exist various problems.

With the above described situation in mind, therefore, another object of the second aspect of the present invention is to provide a program method for realizing a non-volatile semiconductor memory, by which the number of the column lines in common for two adjacent memory cell blocks, to allow the area occupied by the memory cell array not to be decided by the junction portions between the column line and each of the two adjacent memory cell blocks.

Further, in the conventional non-volatile semiconductor memory cell already described on the basis of FIGS. 28 and 29, there exists a drawback in that the electron injection rate to the floating gate of the memory cell disperses due to the dispersion in thickness of the gate insulation film of the memory cell and crystal defects caused by the dispersion during the manufacturing process.

With the above described situation in mind, therefore, another object of the third aspect of the present invention is to provide a non-volatile semiconductor memory by which the dispersion in the threshold voltage of the memory cell in which electrons are injected to the floating gate can be reduced.

Furthermore, in the conventional NOR type flash EEPROM described with reference to FIGS. 33 and 34, among the memory cells in which electrons are emitted from the floating gates, since it is necessary to set the threshold voltage of the memory cell having the lowest threshold voltage to a positive value, the data read speed is decided by the memory cell having the highest threshold voltage, so that there exists a drawback in that it is impossible to increase the data read speed.

With the above described situation in mind, therefore, another object of fourth aspect of the present invention is to provide a non-volatile semiconductor memory cell higher in data read speed.

Further, in the EEPROM as described with reference to FIGS. 35 to 39, as already stated, since the latch circuit is provided for each column line, the chip size increases to the extent of the latch circuits, so that there exists a drawback in that the chip cost is high.

With the above described situation in mind, therefore, another object of the fifth aspect of the present invention is to provide a non-volatile semiconductor memory which is low in cost and short in program time in the same way as with the case of the conventional memory.

To achieve the above stated object, the first aspect of the present invention provides a non-volatile semiconductor memory, comprising: a memory cell block having a plurality of memory cells each formed as a transistor having a floating gate being connected in series, each memory cell storing one or the other data of binary data on the basis of a first status where electrons are injected to the floating gate or a second status where electrons are emitted from the floating gate; a selecting transistor connected in series to one end of said memory cell block, for selecting said memory cell block; switching means connected to the other end of said memory cell block; and a bit checking transistor provided in said memory cell block and connected in series to the memory cells, for deciding a logic status of each memory cell in which electrons are injected to the floating gate and each memory cell in which electrons are emitted from the floating gates in the memory cell block.

Furthermore, the second aspect of the present invention provides a data programming method for programming data to memory cells in a non-volatile semiconductor memory having:

a plurality of memory cell blocks each having a plurality of memory cells each formed as a transistor having a floating gate, said memory cells being connected in series; a plurality of selecting transistors each connected in series to one end of each of the memory cell blocks, for selecting each memory cell block; first row lines each connected to the memory cells on the same row in a plurality of memory blocks arranged in a matrix pattern, each of said memory blocks being composed of the memory cell block and the selecting transistor; column lines each connected to at least two adjacent memory blocks; a second row line connected to the selecting transistor of one memory block of the two adjacent memory blocks; and a third row line connected to the selecting transistor of the other memory block of the two adjacent memory block; and a plurality of switching means each connected between the other end of each of said memory cell blocks and a reference potential, which method comprises the steps of:

turning off a plurality of said switching means; setting the selected first row line to a first potential; setting the non-selected first row lines to a second potential lower than the first potential; setting the second and third row lines to the first potential and setting the column line to a third potential lower than the first potential, to charge the memory cell block beginning from the third potential; turning off the non-selected transistor of the selecting transistors connected to the second and third row lines; and setting the column line to the third potential or 0 V according to data to be programmed to the memory cell.

Further, the third aspect of the present invention provides a non-volatile semiconductor memory cell, comprising: a plurality of memory cell blocks having a plurality of memory cells each formed as a transistor having a floating gate and a control gate connected in series; a plurality of selecting transistors each connected in series to one end of each of said memory cell blocks, for selecting each of said memory cell blocks; row lines each connected to the control gates of the memory cells arranged in the same row of the matrix-arranged selecting transistors and the memory cells; programming means for programming data to the memory cell by applying a program voltage to the row line to inject electrons to the floating gate thereof; and program voltage supplying means for repeatedly checking electron injections and electron injection rates in sequence during programming, by applying a programming voltage higher than the preceding programming voltage to the row line.

Further, the fourth aspect of the present invention provides a non-volatile semiconductor memory, comprising: row lines; a plurality of memory cells each selectively driven by each of said row lines and each formed as a transistor having a floating gate and a control gate respectively, for storing either of binary data on the basis of an electron status in the floating gate thereof; column lines to each of which one end of each of said corresponding memory cells in connected; a plurality of transistors each connected between the other end of each of said memory cells and a reference potential, the gate of each of said transistors being connected to each of said row lines; data erasing means for emitting electrons from the floating gate of each of said memory cells; first writing means for storing one bit data of binary data by injecting electrons to the floating gate of said memory cell in such a way that said memory cell is turned on when selected and off when not selected; and second writing means for storing the other bit data of binary data by injecting electrons to the floating gate of said memory cell in such a way that said memory cell is turned off both when selected and not selected.

Furthermore, the fifth aspect of the present invention provides a non-volatile semiconductor memory, comprising: row lines; memory cells each selectively driven by each of said row lines; column lines connected to each of said memory cells; a column decoder; a plurality of column gate transistors one end of each of which is connected to each of said column lines, for selecting one of said column lines under switching control by said column decoder; and data programming means connected to the other end of each of said column gate transistors, for programming data to said memory cells, by turning on one of said column gate transistors to supply potential to one of said column lines according to data to be programmed to said memory cells, turning off the column gate transistor and holding the applied potential at the column line to program data to said memory cell on the basis of the held potential.

In the first aspect of the present invention, in each memory cell block, the logic status of the memory cells can be decided by the bit checking transistor on the basis of the memory cells in which electrons have been injected to or emitted from the floating gates.

Therefore, in the memory cells constituting the memory cell block, the number of the memory cells which store the "0" data is compared with the number of the memory cells which store the "1" data, for instance; and the memory cells storing the more bit data are determined so as to have a negative threshold voltage, and the memory cells storing the less bit data are determined so as to have a positive threshold voltage. The determined threshold voltages of the memory cells can be stored in the bit checking transistors. In other words, with respect to the respective memory cell block, it is possible to determined the threshold voltages of the memory cells in such a way that the number of the memory cells of a negative threshold voltage becomes more than that of the memory cells of a positive threshold voltage, with the result that current flowing through the memory cell block can be increased and thereby the read speed can be improved.

In the second aspect of the present invention, the two adjacent memory cell blocks are connected in common by a single column line. The non-selected memory cell block is charged beginning from a potential lower than the first potential in such a way that the electron tunnel effect will not be caused between the floating gates of the memory cells and the substrate. After that, the selecting transistors of the non-selected memory cell blocks are turned off so that the charged potential can be held in the non-selected memory cell blocks. Accordingly, it is possible to use in common a single column line for the two adjacent memory cell blocks. In other words, since the number of the column lines can be reduced half, it is possible to reduce the ratio of an area occupied by the junction portions between the column line and each of the two adjacent memory cell blocks, to the area occupied by the memory cell array.

In the third aspect of the present invention, when data are programmed to the memory cells, a program voltage is applied to the row line. In this program, the electron injection and emission to and from the floating gates are repeatedly checked in sequence. Here, the program voltage higher than before is applied one after another. By doing this, irrespective of the dispersion during the manufacturing process, electrons are injected to the respective memory cells under optimal conditions, thus reducing the dispersion of the threshold voltages of the memory cells.

In the fourth aspect of the present invention, after electrons have been once emitted from the floating gates of the memory cells to lower the threshold voltages to a negative value, electrons are injected to the floating gates of the memory cells in such a way that the memory cells are turned on when selected and off when not selected through the first writing means, so that one of a binary data can be stored in the memory cells.

After that, electrons are selectively injected to the floating gates of the memory cells in such a way that the memory cells are turned on both when selected and not selected through the second writing means, so that the other of a binary data can be stored.

In the fifth aspect of the present invention, the column lines are connected to the data programming means through the column gate transistors. By the column decoder, the column gate transistors are selectively turned on. After that, the column line is set to a potential according to data to be programmed by the data programming means. The memory cells can be programmed on the basis of the potentials. In the program potentials, current hardly flows and thereby power is hardly consumed. Consequently, it is possible to form the data latch circuits of the data programming means at any positions freely remote from the memory cell array.

BRIEF DESCRIPTION OF THE DRAWINGS

FIG. 1 is a circuit diagram showing the essential portion of an embodiment of the first aspect of the present invention;

FIG. 2 is a table showing various modes of the circuit shown in FIG. 1;

FIG. 4 is a truth table of the circuit shown in FIG. 3;

FIG. 5 is an illustration for assistance in explaining the read operation of the device shown in FIG. 3;

FIG. 6 is a truth table of various signals;

FIGS. 29(a) and (b) are a circuit diagram showing the essential portion of the NAND type EEPROM and a voltage waveform diagram showing the signals at the respective nodes thereof, respectively;

FIGS. 32(a) and (b) are illustrations for assistance in explaining the different threshold value statues in the respective memory cells of the NAND type EEPROM;

FIG. 33(a) is a plane view showing the essential portion of the conventional EEPROM; FIG. 33(b) is a cross-sectional view taken along the line A—A' in FIG. 33(a);

FIG. 33(c) is a cross-sectional view taken along the line B—B' in FIG. 33(a); and FIG. 33(d) is a cross-sectional view taken along the line C—C' in FIG. 33(a);

DETAILED DESCRIPTION OF THE PREFERRED EMBODIMENTS

Figure 3:
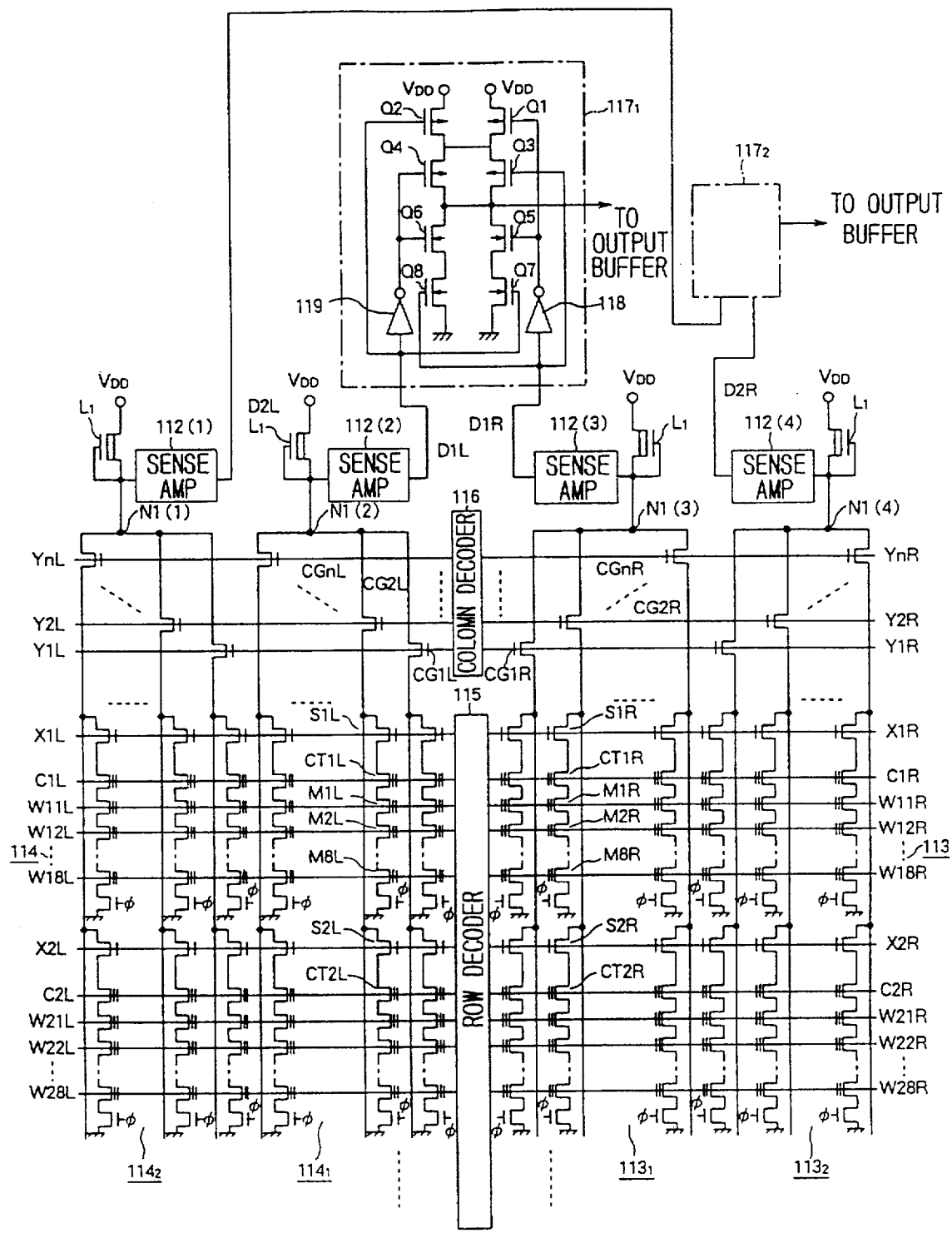
FIG. 3 is a semiconductor memory device configured with the use of the circuits shown in FIG. 1.

A first embodiment of the first aspect of the present invention will be described hereinbelow with reference to the drawings. FIG. 1 is a circuit in which a bit checking transistor CT whose conduction state is controlled by signal C is connected between the select transistor ST and the memory cell M1. The bit checking transistor stores data indicative of whether a negative threshold voltage represents a logic "0" or a logic "1" in a memory cell that is in a memory block different from the memory block including this bit checking transistor. In other words, the bit checking transistor corresponds to the states of memory cells in a different block than the memory block it is a part of, as described below. In each of the memory blocks, the memory cell having the negative threshold voltage corresponds to a logic "1" and the memory cell having the positive threshold voltage corresponds to a logic "0" if the number of the data of a logic "1" are larger than the number of the data of a logic "0", on the other hand, the memory cell having the negative threshold voltage corresponds to a logic "0" and the memory cell having the positive threshold voltage corresponds to a logic "1" if the number of the data of a logic "0" are larger than the number of the data of a logic "1". That is, for each memory cell block 111, the data of a logic "1" are stored in the negative threshold voltage memory cells or differently in the positive threshold voltage memory cells. By the allocation in this way, a half or more of the memory cells M1 to M8 in the memory block 111 have the negative threshold voltage.

This will be explained in further detail with reference to FIG. 2. An example of FIG. 2 shows the case where there are 8 memory cells in the memory block 111, in which the numbers of a logic "1" and a logic "0" of 8 memory cells, the threshold voltages of the memory cells corresponding to a logic "1" and a logic "0", and the threshold voltage of the bit checking transistor are listed. For instance, in the case of no. 3, the number of data "1" is 2; and the number of data "0" is 6. In this case, the data of a logic "0" are allocated to the memory cells having the negative threshold voltages, and the data of a logic "1" are allocated to the memory cells having the positive threshold voltages. Further, this allocation is stored by setting the bit checking transistor CT to a positive threshold voltage. Further, in the case of no. 6, the number of data "1" is 5; and the number of data "0" is 3. In this case, the data of a logic "1" are allocated to the memory cells having the negative threshold voltages, and the data of a logic "0" are allocated to the memory cells having the positive threshold voltages. Further, this allocation is stored by setting the bit checking transistor CT to a negative threshold voltage. Further, as with the case of no. 5, when the number of data "1" is the same as that of "0", the data of a logic "1" are allocated to the memory cells having the negative threshold voltages, and the data of a logic "0" are allocated to the memory cells having the positive threshold voltages. Further, the bit checking transistor is set to the negative threshold voltage. In the construction as described above, it is possible to always obtain half or more MOS transistors in each of which electrons are emitted from the floating gate and thereby the whose threshold voltages are negative, in the memory block 111. Accordingly, the current flowing through the memory block 111 can be increased, and further a transistor of large current driving capability can be used as the load transistor, so that it is possible to improve the data read speed.

Further, in FIG. 2, the case where the number of the memory cells is 8 in the memory block 111 has been explained by way of example. However, without being limited to only this example, it is of course possible to determine the number of the memory cells to another number such as 16 or 32 memory cells.

FIG. 3 shows a semiconductor memory device formed by arranging the memory blocks 111 shown in FIG. 1 into a matrix pattern. In FIG. 3, numerals 113 and 114 show memory cell arrays. These memory cell arrays 113 and 114 are divided into a plurality of arrays 1131, 1132, and 1141, 1142, respectively. Further, the turn-on and -off of select transistors S1R, S2R, . . . and S1L, S2L, . . . for these memory cell arrays 113 and 114 are controlled by output signals X1R, X2R, . . . and X1L, X2L, . . . of row decoder 115, respectively. Further, the turn-on and -off of bit checking transistors CT1R, CT2R, . . . and CT1L, CT2L, . . . are controlled by output signals C1R, C2R, . . . and C1L, C2L, . . . of the row decoder 115, respectively. In the same way, the turn-on and -off of memory cell M1R, M2R, . . . , M8R and M1L, M2L, . . . , M8L are controlled by output signals W11R, W12R, . . . , W18R and W11L, W12L, . . . , W18L of the row decoder 115, respectively. Numeral 116 shows a column decoder The turn-on and -off of column gate transistors CG1R, CG2R, . . . , and CGnR and CG1L, CG2L, . . . , and CGnL are controlled by output signals Y1R, Y2R, . . . , YnR and Y1L, Y2L, . . . , YnL of the column decoder 116, respectively. One ends of the column gate transistors CG1R, CG2R, . . . , and CGnR and CG1L, CG2L, . . . , and CGnL are connected in common to node N1 for each array 1131, 1132, 1141 and 1142, respectively. Load transistors L1, L1, . . . are connected between these common junction points (node N1(i)) and power supply voltage VDD, respectively. The nodes N1(1) to N1(4) are connected to sense amplifiers 112(1) to 112(4), respectively. Output D1R of the sense amplifier 112(3) and output D1L of the sense amplifier 112(2) are supplied to data discriminating circuit 1171. This data discriminating circuit 1171 has inverters 118 and 119, P-channel type MOS transistors Q1 to Q4 and N-channel type MOS transistors Q5 to Q8. This discriminating circuit 1171 discriminates data stored in the selected memory cell according to whether the threshold voltage of the bit checking transistor CT is positive or negative. When the memory cell of the array 1131 is selected and the data is read from the selected memory cell by the sense amplifier 112(3), the corresponding bit checking transistor of the array 1141 is also selected and the data stored in the bit checking transistor is read by the sense amplifier 112(2). The discriminating circuit 1171 determines whether the data from the sense amplifier 112(3) is inverted or not inverted, in response to the data stored in the bit checking transistor from the sense amplifier 112(2). The stored data read from the selected memory cell is outputted to an output buffer through the discriminating circuit 1171. Thus, the inverted data or the non-inverted data is outputted to an output buffer (not shown). In the same way, the discriminating circuit 1171 discriminates data stored in the selected memory cell as to whether the stored data read from the selected memory cell of the array 1141 is inverted or not inverted, in response to the data stored in the bit checking transistors CT of the other array 1131. The inverted data or the non-inverted data is outputted to an output buffer (not shown). Output D2R of the sense amplifier 112(4) connected to the node N1(4) and output D2L of the sense amplifier 112(1) connected to the node N1(1) are supplied to data discriminating circuit 1172. The data discriminating circuit 1172 is the same in construction as with the case of the above mentioned data discriminating circuit 1171. This discriminating circuit 1172 discriminates data stored in the selected memory cell as to whether the stored data read from the selected memory cell of one array 1132 is inverted or not inverted, in accordance with the data stored in the bit checking transistor CT of the other array 1142. Thus, the inverted data or the non-inverted data are outputted to an output buffer (not shown). In the same way, the discriminating circuit 1172 discriminates data stored in the selected memory cell of the array 1142 as to whether the stored data read from the selected memory cell is inverted or not inverted, in response to the data stored in the bit checking transistor CT of the other array 1132. The inverted data or the non-inverted data is outputted to an output buffer (not shown).

As shown, in the circuit shown in FIG. 3, the two memory cell arrays 113 and 114 are arranged on both right and left sides of the row decoder 115. The bit checking transistors CT for checking data of the right side memory cell array 113 are incorporated in the corresponding left side memory cell array 114. In contrast with this, the bit checking MOS transistors CT for checking data of the left side memory cell array 114 are incorporated in the corresponding right side memory cell array 113. For instance, the bit checking transistor CT1R is used to check the memory cells M1L to M8L. The bit checking transistor CT1L is used to check the memory cells M1R to M8R. As described above, in the example shown in FIG. 3, the configuration is symmetrical with respect to the right and left sides, with the row decoder 115 interposed between the memory cell arrays. Further, one of a pair of the memory cell blocks existing in symmetrical positional relationship with respect to each other has the bit checking transistors CT for the other. However, this is true in a symbolic circuit, so that it is not necessary to form the actual pattern in symmetrical positional relationship with respect to each other, in particular.

The circuit operation of the above-mentioned configuration will be described with reference to a truth table shown in FIG. 4. In FIG. 4, D1L and D1R are data read by the sense amplifiers 112(2) and 112(3), respectively. When the memory cells having negative threshold voltages are selected, the sense amplifiers output data of a logic "0"; and when the memory cells having positive threshold voltages are selected, the sense amplifiers output data of a logic "1". Now, when address signal A0 is a logic "0", data are read from the memory cells of the left side memory cell array 114, and the check data are read from the bit checking transistors of the right side memory cell array 113. In this case, the data D1L are data read from the left side memory cell array; and the data D1R are data read from the right side memory cell array. Further, Z1 is a data outputted from the data discriminating circuit 1171. The data discriminating circuit 1171 shown in FIG. 3 is so configured as to satisfy this truth table. When the data D1L read by the sense amplifier 112 is a logic "0" and further the data D1R is also a logic "0", the memory cell and the bit checking transistor have both negative threshold voltages. Therefore, the memory cell stores the data of a logic "1" shown in FIG. 2, so that the output Z1 is determined to be a logic "1". On the other hand, when the data D1L is a logic "1" and the data D1R is a logic "0", the memory cell has a positive threshold voltage and the bit checking transistor has a negative threshold voltage. Since the bit checking transistor has a negative threshold voltage, the memory cell stores a logic "0", so that the output Z1 is determined to be a logic "0". Further, when the data D1L is a logic "0" and the data D1R is a logic "1", the selected memory cell has a negative threshold voltage and the bit checking transistor has a positive threshold voltage. So, since the memory cell stores a logic "0", the output Z1 is determined to be a logic "0". Further, when the data D1L and D1R are both a logic "1", the memory cell and the bit checking transistor have both positive threshold voltages, the memory cell stores a logic "1", so that the output Z1 is determined to be a logic "1".

The same as above can be applied to when the address signal A0 is a logic "1". The D1R is the data stored in the memory cell, and the D1L is the data stored in the bit checking transistor. As described above it is possible to detect as to whether the data "1" or "0" is stored in the memory cell, in accordance with the bit check data stored in the bit checking transistor for each memory block.

Further, in the above description, when the address signal A0 is a logic "0", the memory cell of the left side memory cell array 114 is selected. When the address signal A0 is logic "1", the memory cell of the right side memory cell array 113 is selected.

Without being limited to only this mode, what is essential is to construct the memory device in such a way that whenever data are read from a certain memory block, the bit check data can be read simultaneously from the bit checking transistor having the bit check data corresponding to the memory cell block.

The case where data is read from the memory cell M1R of FIG. 3 will be explained with reference to FIG. 5. In this case, output signals Y2R and Y2L of the column decoder 116 are a logic "1", and the other output signals Y1R, Y1L, YnR, YnL are all a logic "0". Therefore, the column select transistors CG2R, CG2L are turned on. Further, output signals X1R and X1L of the row decoder 115 are set to a logic "1", and output signals X2R, ..., X2L, ... are set to a logic "0". Accordingly the transistors S2R, ..., and S2L, ... to which signals X2R, ..., and X2L, ... are supplied, respectively, are turned off. On the other hand, the transistors S1R and S1L to which the signals X1R and X1L are supplied are turned on. The signal C1R for controlling the bit checking transistor CT1R connected to the selected memory cell M1R is a logic "1". The signal C1L for controlling the bit checking transistor CT1L corresponding to the memory cell M1R is a logic "0". The signal W11R applied to the selected memory cell M1R is a logic "0", and the other signals W12R to W18R are all a logic "1". On the other hand, signals W11L to W18L symmetrically opposite to the signals W11R to W18R with respect to the row decoder 115 are all a logic "1". Since the signal W11R is a logic "0". The memory cell M1R of the right side memory cell array 113 is selected. The sense amplifier 112(3) detects the data stored in the memory cell M1R. In contrast with this, in the left side memory cell array 114, the bit checking transistor CT1L is selected because the signal C1L which is applied to the gate of the bit checking transistor CT1L is a logic "0". The sense amplifier 112(2) detects the data stored in the bit checking transistor CT1L.

Figure 6:
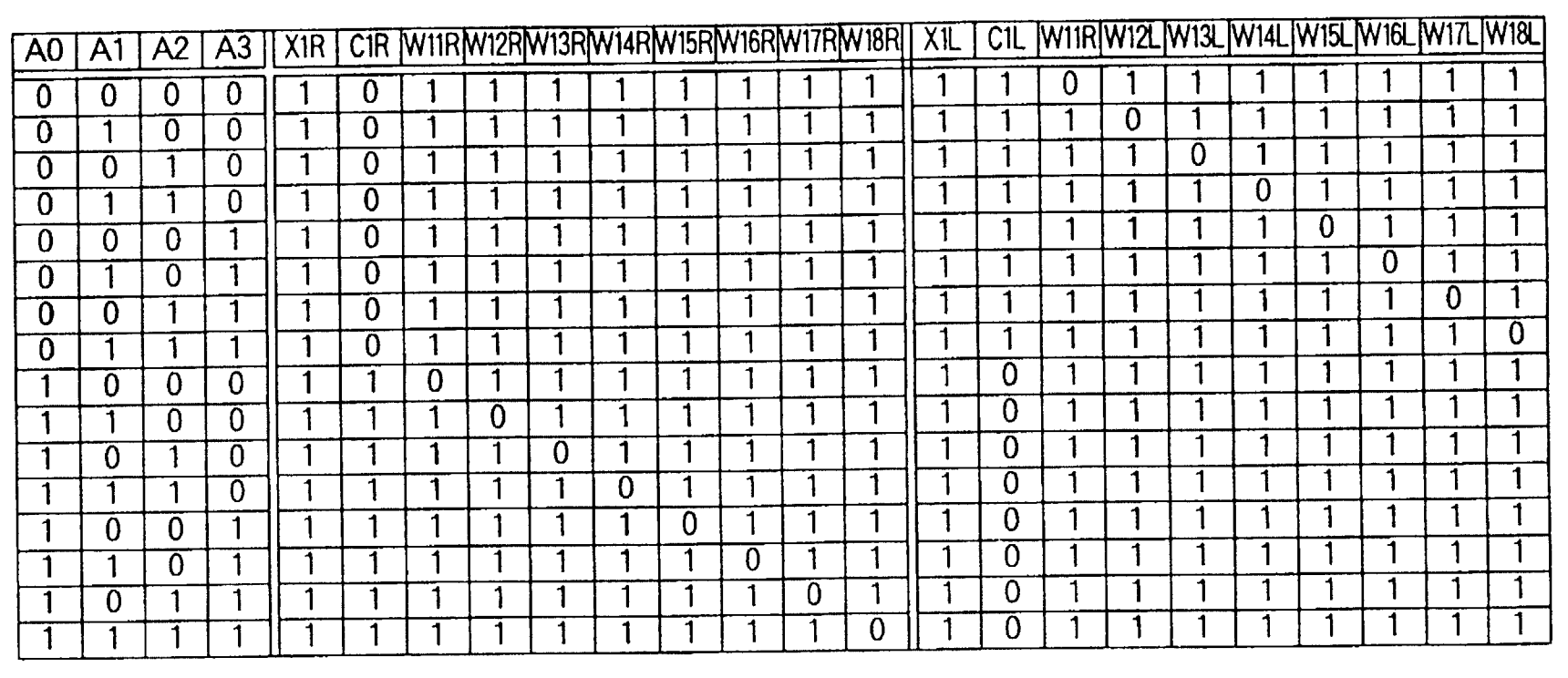

FIG. 6 is a truth table of the above-mentioned respective signals X1R, C1R, W11R to W18R; and X1L, C1L, and W11L to W18L. In this example, the respective signals are formed by the address signals A0, A1, A2 and A3, the row decoder circuit is so configured as to satisfy this truth table. A truth table for outputting the signals X1R, X2R, ..., X1L, X2L, ... is not shown. In order to generate the signals X1R, X2R, ..., X1L, X2L, ..., the addresses such as address signals A4 and A5, for instance are added in such a way that any one of the addresses can be selected according to the number of the memory blocks. Further, in FIG. 6, one memory block is formed of 8 memory cells. However, when one memory cell block is formed of 16 or 32 memory cells, address signals are added in correspondence to the number of the memory cells so that the same function can be obtained.

In the above-mentioned embodiment, since half or more memory cells for constituting one memory block can be constituted so as to have negative threshold voltages, it is possible to set a large current flowing through the memory block, as compared with the conventional memory block. In addition, since a transistor having a large current driving capability can be used as the load transistor L1, a high speed data read can be realized.

Figure 7:
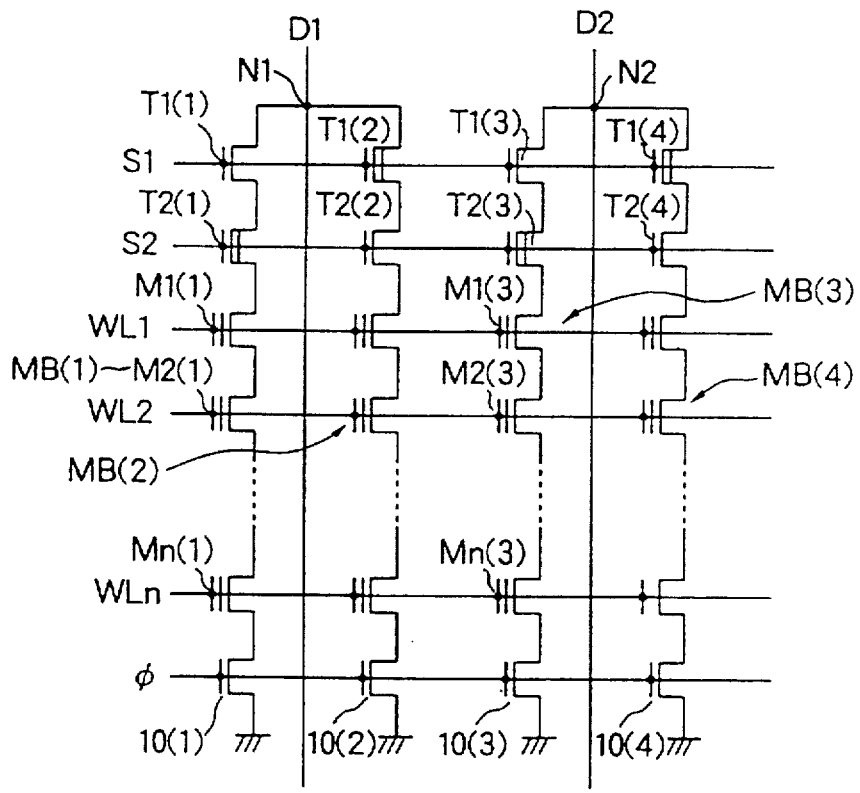
FIGS. 7(a) and (b) are a circuit showing an essential portion of an embodiment of the second aspect of the present invention and the timing chart thereof, respectively.
Figure 7:
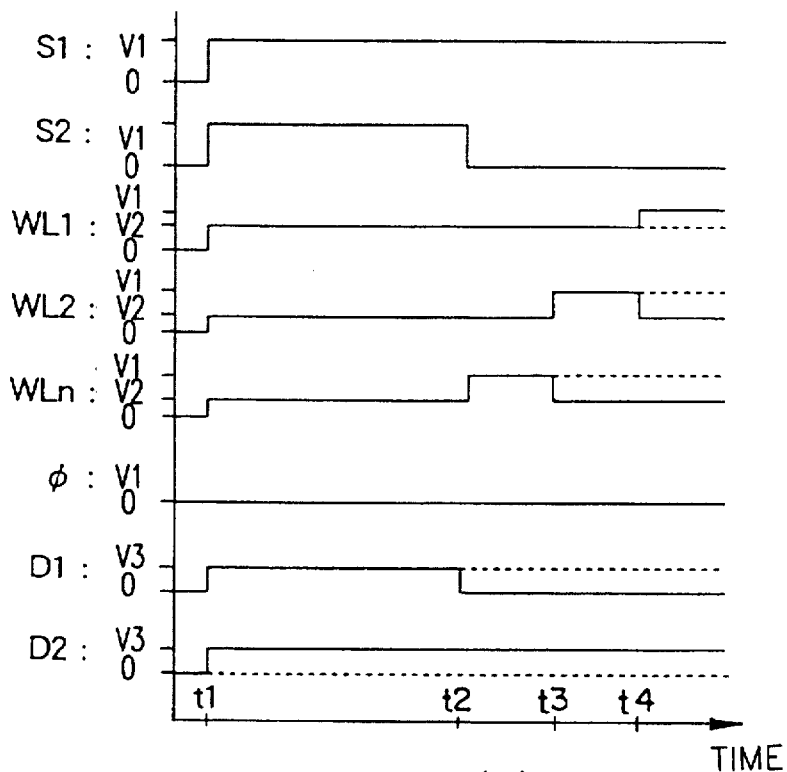

An embodiment of the second aspect of the present invention will be described hereinbelow with reference to FIG. 7. In this embodiment, one column line is used in common for two memory blocks. In more detail, column line D1 is connected to the memory cell blocks MB(1) and MB(2) through the select transistors T1(1) and T2(2) at the node N1. Further, column line D2 is connected to the memory blocks MB(3) and MB(4) through the select transistors T1(3) and T2(4) at the node N2. Further, the other ends of the respective memory blocks are connected to a reference potential through transistors 10, respectively. In a data read mode, if the signals S1 and S2 are a logic "1" and a logic "0", respectively, the transistors T1(1) and T1(3) are turned on and the transistors T2(2) and T2(4) are turned off, so that the left side memory blocks MB(1) and MB(3) are selected. Further, the transistors T2(1), T1(2), T2(3) and T1(4) are all of a depletion type transistor, and these transistors are kept turned on if the signals S1 or S2 is a logic "0". However, it is possible to use a wire of a diffusion layer, for instance, instead of the depletion type transistor.

In this embodiment, in the same way as with the case of the conventional memory device, when data are programmed to the memory cells, first all the row lines WL1 to WLn connected to the control gates of the memory cells are set to 0 V and further the substrate is set to a high voltage, to emit electrons from the floating gates of all the memory cells to the substrate. When data are programmed to the memory cells, in the same way as in the conventional device, the signal φ is set to 0 V to turn off the transistors 10 and thereby to disconnect the memory block from the reference potential. After that, as shown FIG. 7(b), signals S1 and S2 supplied to the select transistors T1 and T2 are both set to a high potential V1 (at the time t1). Further, all the row lines WL1 to WLn corresponding to the selected memory block are set to the potential V2. Further, the potential V3 is supplied to the column lines D1 and D2 to charge the memory blocks to the potential V3. After that, the signal S2 is set to 0 V to turn off the select transistors T2(2), T2(4) . . ., in order to write a data into the memory blocks MB(2), MB(4) . . . (at the time t2). In other words, in FIG. 7(a), when data are not programmed to the right side memory blocks MB(2) and MB(4), the signal S2 is set to 0 V to turn off the right side select transistors T2(2) and T2(4). Since the transistors 10 are also turned off, the potential charged by the potential V3 are kept at the right side memory blocks MB(2) and MB(4). After that, the data is programmed to the left side memory blocks MB(1) and MB(3) by setting the potentials of the column lines D1 and D2 to either of 0 V or the potential V3, in the same way as is conventional. Since the right side memory blocks MB(2) and MB(4) are charged to the potential V3, even if the row line WL is set to the high potential V1, the potential difference between the floating gate and the channel region of the memory cell of the right side memory block substrate is large enough to cause the electron tunnel effect, so that electrons are not injected to the floating gate thereof. At the time t2, the row line WLn is set to the high potential V1 and the non-selected row lines WL are set to a potential V2 lower than the V1. The column line D1 is set to 0 V and the column line D2 is set to the potential V3. Consequently, the potential difference between the floating gate of only the memory cell Mn(1) and the channel region thereof is large enough to cause the electron tunnel effect, so that electrons are injected to the floating gate of the memory cell Mn(1). In the same way, electrons are injected to the floating gate of the memory cell M2(1) at time t3 and to the floating gate of the memory cell M1(1) at time t4.

As explained above, in the present embodiment, the programming procedure specific to this embodiment is added; in other words, there is added such a program procedure that: the two adjacent memory blocks are connected in common to one column line; the non-selected memory blocks are charged to the potential V3 so that the electron tunnel effect will not occur between the floating gate and the channel region in the non-selected memory block; and after that the select transistors of the non-selected memory blocks are turned off to allow the non-selected memory blocks to keep the charged potential V3. As a result, it has become possible to use the one column line in common for the two adjacent memory blocks in the same row. Therefore, it is possible to reduce the number of the column lines down to half of that of the conventional case, and further it is possible to allow the area occupied by the memory cell array to be not determined by the junction portions between the column line and each of the two adjacent memory blocks.

Further, the potential of the column lines is not limited to only the above-mentioned 0 V. In order to prevent the potential charged to the potential V3 from being discharged to the adjacent memory block of 0 V through a parasitic field transistor, it is desirable to keep this potential at about 1 or 2 V.

An embodiment of the third aspect of the present invention will be described hereinbelow. In this embodiment, the distribution of the threshold voltages of the memory cells to which electrons injected can be suppressed.

Prior to the description of this embodiment, the third aspect of the present invention will be summarized as follows:

In this third aspect of the present invention, the above-mentioned object can be achieved by increasing the high voltage supplied to the control gates of the memory cells to another value higher than the preceding voltage value, whenever the data is programmed after the data are read to check the threshold voltages of the memory cells. In more detail, as described above, the thickness of the gate insulation film is not uniform but different from each other due to the dispersion caused during the manufacturing process, for instance. The amount of electrons injected to the floating gate differs due to the dispersion of the film thickness. Accordingly, in order to equalize the threshold voltages of the respective memory cells, the voltage value applied to the row line (i.e., the control gates of the memory cells) must be changed according to the difference in the gate insulation film thickness. However, in the conventional device, since the same voltage is applied to the control gates of all the memory cells to inject electrons, there exists a distribution in the threshold voltages of the memory cells. In this third aspect of the present invention, when electrons are injected to the floating gates of the memory cells, the row line is set to a high voltage, and further the column lines to which the memory cells required to inject electrons are connected are set to 0 V. On the other hand, the column lines to which the memory cells not required to inject electrons are connected are set to a predetermined voltage V3, in order to reduce the electric field between the floating gate and the channel region of the memory cell to such an extent that the electron tunnel effect will not be caused. As described above, the row line is set to a high voltage; the respective column lines are set to 0 V or the voltage V3; and electrons are injected to the floating gates of the memory cells, which are connected to the column lines of 0 V, during a predetermined period. After that, data are read from each memory cell for checking the injecting state of electrons. When the threshold voltage of the memory cell reaches a predetermined value, in order to prevent electrons from being further injected to this memory cell, the potential of the column line connected to this memory cell is set to the voltage of the V3. After that, electrons are injected to the floating gates of other memory cells whose threshold voltages do not reach the predetermined value. In the case of data read for the checking, in the same way as with the case of the ordinary read operation, the selected row line is set to 0 V to check whether the memory cells can be turned off. After the data read for checking has been completed, a voltage higher than the preceding voltage is applied to the row line for further injecting electrons. For instance, this voltage is about 0.5 or 1 V higher than the preceding voltage. The column lines to which the memory cells of insufficient electron injection are connected are set to 0 V to inject electrons. Further, the column lines to which the memory cells not required to inject electrons are connected and to which the memory cells of sufficient electron injection are connected are set to the potential V3, to prevent electrons from being further injected to the floating gates thereof. After that, after the checking read, the row line is set to a still higher voltage. After this, in the same way as above, the column lines to which the memory cells of insufficient electron injection are connected are set to 0 V for injecting electrons, and further the column lines to which the memory cells not required to inject electrons and to which the memory cells of sufficient electron injection are connected are set to the potential V3 to prevent electrons from being further injected to the floating gates thereof. The above-mentioned operation is repeated in sequence to increase the row line potential each time the above operation is repeated. When the electron injection has been completed in the memory cell, the column line potential is increased to prevent further electron injection. If the electron injection is not sufficient in the memory cell, there exists a possibility that the gate insulation film is formed thick. So the row line potential is further increased for injecting electrons. As described above, since electrons are injected to the floating gate by increasing the row line potential in sequence, it is possible to inject electrons to the respective memory cells at the optimal row line potential.

Figure 8:
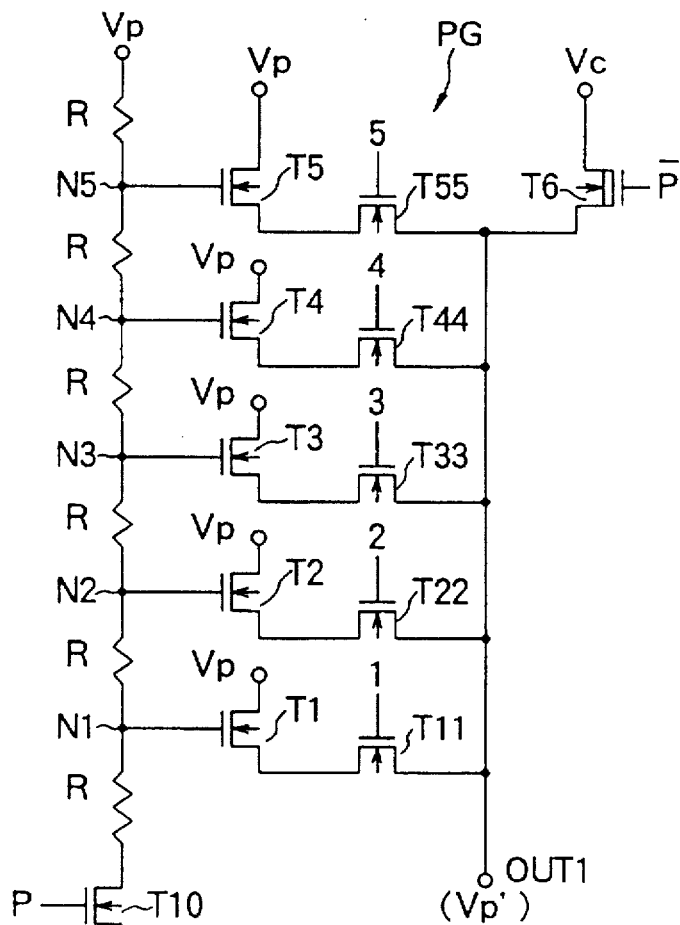
FIGS. 8(a) and (b) are a circuit for generating a row line potential and a column decoder of an embodiment of the third aspect of the present invention, respectively.
Figure 8:
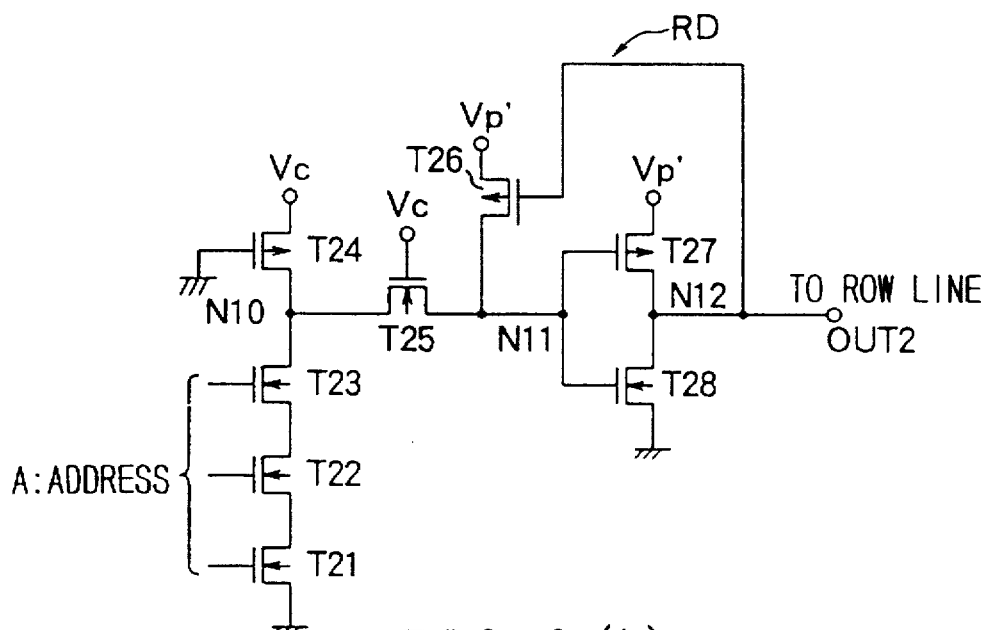

A circuit for generating row line potentials according to the above-mentioned third aspect of the present invention will described with reference to FIGS. 8(a) and 8(b), in which FIG. 8(a) shows potential generating circuit PG for generating the row line potential, and FIG. 8(b) shows an example of row decoder RD. The output Vp' of the potential generating circuit PG is applied to the row decoder RD. The output Vp' is applied to selected row line by the row decoder Vp'. The circuit PG shown in FIG. 8(a) generates a predetermined stepwise potential ranging from a low potential to a high potential by using series connected resistances, and outputs as the potential Vp'. The value of the potential Vp' changes from the low potential to the high potential in sequence, for each progress step, by setting signals 1 to 5 which are applied to the gates of the transistors T11, T22, T33, T44 and T55, respectively, to a logic "1" in sequence. When the signals 1 to 5 are a logic "1", the potentials of the signals 1 to 5 are potential Vp; and when the signals 1 to 5 are a logic "0", the potentials of the signals 1 to 5 are ground potential, that is, 0 V.

In the potential generating circuit PG shown in FIG. 8(a), resistors R, R, . . . and a transistor 10 are connected in series between the high voltage side reference potential Vp and the ground potential. Nodes N1 to N5 of junction points between the two resistors R and R are connected to gates of transistors T1 to T5, respectively. One ends of these transistors T1 to T5 are connected to the high voltage side reference potential Vp, and the other ends thereof are connected to output terminal OUT1 for outputting the potential Vp' through transistors T11 to T55, respectively. Further, the depletion type transistor T6 is connected between the output terminal OUT1 and power supply potential Vc. The transistors T1 to T6, T11, T22, T33, T44, T55 and T10 are N channel type.

In the row decoder RD shown in FIG. 8(b), transistors T21 to T24 are connected in series between the ground potential and the supply potential Vc. Address signals are applied to the gates of the transistors T21 to T23. The gate of the transistor T24 is grounded. Node N10 between the transistor T24 and T23 is connected to node N11 through transistor T25 whose gate is connected to Vc. The gates of transistors T27 and T28 are connected to the node N11. The transistors T27 and T28 are connected in series between the potential Vp' and the ground potential. The junction point (node N12) between these transistors T27 and T28 is output terminal OUT2 and is connected to a row line. Further, transistor T26 is connected between the potential Vp' and the node N11. The node N12 is connected to the gate of the transistor T26. Further, here the transistors T24, T26 and T27 are of P channel type. The transistors T21 to T23, T25 and T28 are N channel type.

When electrons are injected to the floating gate of the memory cell, signal P which is applied to the gate of the transistor T10 is set to a logic "1", and signal /P which is applied to the gate of the transistor T6 is set to a logic "0". After that, signals 1 to 5 are set to a logic "1" in sequence, and the potential Vp' changes from the low potential to the high potential in sequence for each program step and is outputted. The potential Vp' is lowest, when the signal 1 is a logic "1" and the signals 2 to 5 are a logic "0". The potential Vp' is highest, when the signals 1 to 5 are a logic "1".

Figure 9:
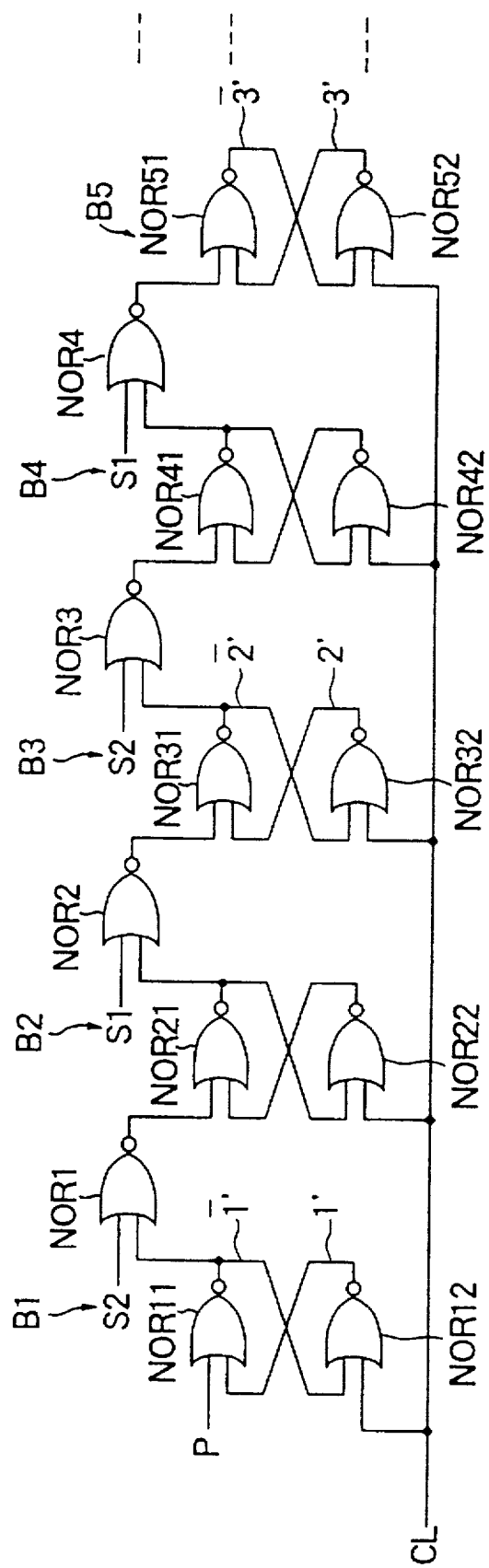
FIG. 9 is a circuit diagram showing a circuit for forming signals n' and /n'.
Figure 10:
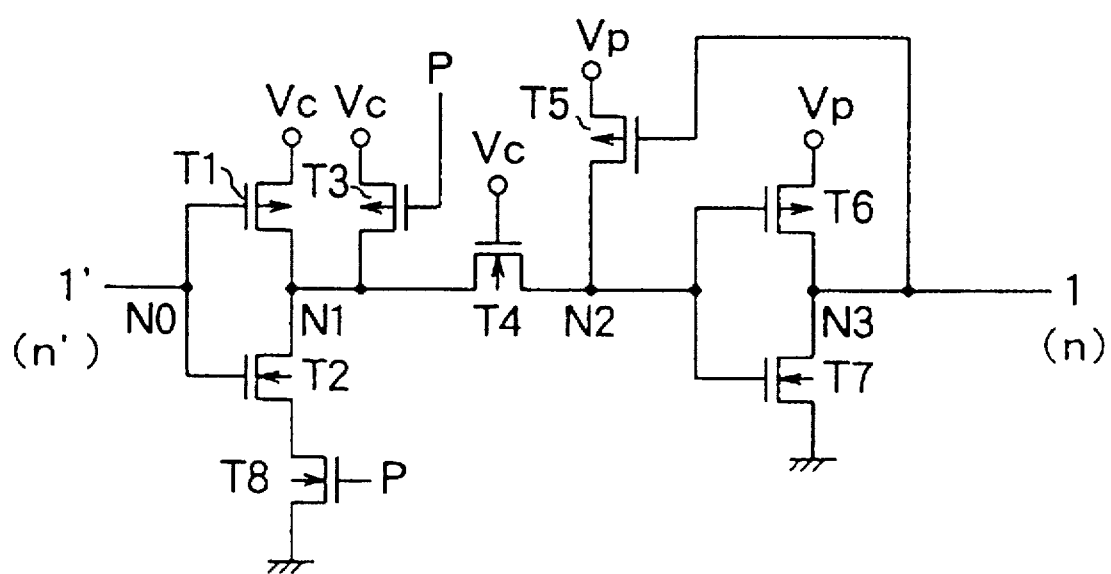
FIG. 10 is a circuit diagram showing a circuit for forming the signal n' from the signal /n'.
Figure 11:
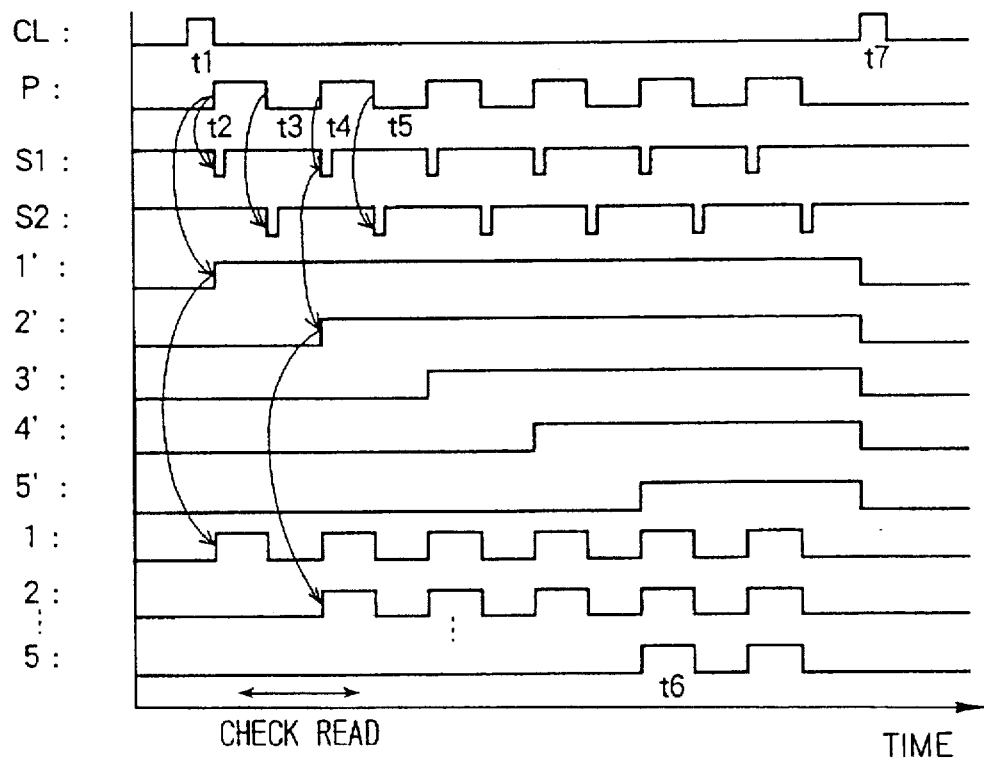
FIG. 11 is a waveform diagram of signals at the respective nodes in FIGS. 9 and 10.

In the data read for checking the electron injection state of the floating gate and in the ordinary data read mode, the signal P is set to a logic "0" and the signal /P is set to a logic "1", and the power supply potential Vc is outputted as Vp'. FIGS. 9 and 10 are circuits for generating the signals 1 to 5, and FIG. 11 shows the signal waveforms at the respective nodes shown in FIG. 9 and FIG. 10. In the circuit shown in FIG. 9, circuit blocks B1, B2, . . . are connected in series in multistage manner. Each of the circuit blocks B1, B2, . . . has three NOR gate circuits. In the block B1, a pair of NOR circuits NOR11 and NOR12 forms a flip-flop circuit by connecting an output terminal of one of the NOR circuits to an input terminal of the other of the NOR circuits, respectively. The signal P is applied to the input terminal of the other of the NOR circuit NOR11. Signal CL is applied to the input terminal of the other of the NOR circuit NOR12. The output of the NOR circuit NOR11 is applied to one input terminal of NOR circuit NOR1, signal 82 is applied to the other input terminal of the NOR circuit NOR1. The block B1 is formed as described above. The other blocks B2, B3, . . . are formed in the same way as above, except that signal S1 is inputted to the even numbers of the circuit blocks B2, B4, . . . instead of the signal S2. To connect these blocks B1, B2, . . . in series, in FIG. 9, the outputs of the upper-stage NOR circuits NOR1, NOR2, . . . of the respective circuit blocks are applied to the input terminals of the middle-stage NOR circuits NOR21, NOR31, . . . of the succeeding blocks, respectively. The signals 1', /1'; 2', /2'; . . . are obtained from the lower-stage NOR12, NOR32, . . . and the middle-stage NOR circuits NOR11, NOR31, . . . of the odd numbers of the blocks B1, B3, . . . , respectively.

FIG. 10 shows a circuit for forming signal n in response to signal n'. In this circuit, an input terminal (node NO) is connected to the gates of P-channel type transistor T1 and N-channel type transistor T2. A series circuit of the transistors T1 and T2 and the N-channel type transistor T8 are connected between the power supply potential Vc and the ground potential. The signal P is applied to the gate of the transistor T8. Node N1 between two transistors T1 and T2 is connected to node N2 through N-channel type transistor T4. The gates of P-channel type transistor T6 and N-channel type transistor T7 are connected to the node N2. The supply potential Vc is supplied to the gate of the transistor T4. The transistors T6 and T7 are connected in series between the high potential Vp and the ground potential. The node N3 between the transistors T6 and T7 is an output terminal, and the signal n is outputted therefrom. The P-channel type transistor T3 is connected between the supply potential Vc and the node N1, and the signal P is applied to the gate thereof. Further, The P-channel type transistor T5 is connected between the potential Vp and the node N2, and the gate thereof is connected to the node N3.

As shown in FIG. 11, to start injecting electrons to the floating gate, the signal CL is set to a logic "1" (at the time t1) to initialize the flip-flop of the circuit shown in FIG. 9. After that, the signal P is set to a logic "1" (at the time t2), so that the signal S1 is set to a logic "0" (at the time t2). The signal 1' is set to a logic "1" in response to the signal P, and the Vp is outputted as the signal 1 by the circuit shown in FIG. 10. As described above, the circuit for outputting the signals 2 to 5 are the same construction as above, and the signals 2', 3', 4' and 5' are outputted as the signals 2, 3, 4 and 5. When a predetermined time has elapsed, the signal P changes to a logic "0" (at t3), so that the electron injection to the floating gate stops. In response to the signal P of a logic "0", the signal S2 changes to a logic "0". When the signal P is kept at a logic "0" (at the time t3), the memory cell is read to check the injection state of electrons to the floating gate (at the time t3). As already described, the column lines to which the memory cells of sufficient electron injection are connected are set to the potential V3 to prevent further electron injection to the floating gates. In this embodiment, although electrons are injected only once when the signals 1, 2, 3 and 4 change to a logic "1", it is possible to repeat the electron injection twice or three times.

After the data read ends and further the column lines to which the memory cells of sufficient electron injection to the floating gates are connected have been set to the potential V3, the signal P changes again to a logic "1" (at the time t4). In response to this, the signal S1 changes to a logic "0", and then the signal 2' is set to a logic "1". Consequently, the signal 2 is set to a logic "1", so that the Vp' is set to a voltage value higher than before because the transistor T22 (shown in FIG. 8(a)) is turned on. After a predetermined time has elapsed, the signal P is set to a logic "0" (at the time t5). In response to this, the signal S2 changes to a logic "0". After that, again the column lines to which the memory cells of sufficient electron injection are connected are set to the potential V3 to prevent further electron injection to the floating gates. The above-mentioned electron injection and the electron injection status checking are repeated. Then, when the potential Vp' to set the signal 5 to a logic "1" becomes the highest (at the time t6), the electron injection and the electron injection status checking are repeated in the state where the signal 5' is a logic "1", until electrons are sufficiently injected to the floating gates of all the memory cells so that the threshold voltages of the memory cells reach the predetermined value. In the example shown in FIG. 11, the signal 5 changes twice to a logic "1", and electrons are injected twice in the state where Vp' is at the highest potential.

When the threshold voltages of all the memory cells to which electrons must be injected reach a predetermined value, the electron injection and the read for electron injection status checking are both stopped. The signal CL changes to a logic "1" (at the time t7), so that the flip-flops of the circuit shown in FIG. 9 are returned to the initial state.

As described above, in the present embodiment, since the voltage value for injecting electrons is increased in sequence, since the electron injection status is checked on all such occasions, and since the electron injection is stopped in order beginning from the memory cell which reaches a predetermined threshold voltage, it is possible to absorb the dispersion of the gate insulation film thickness caused during the manufacturing process, with the result that the memory cell can be set to an optimal threshold voltage. Therefore, it is possible to reduce the distribution of the threshold voltages of the memory cells to which electrons have been injected, as compared with the conventional memory cells, so that it is possible to provide the non-volatile semiconductor memory higher in read speed than that of the conventional memory.

Figure 12:
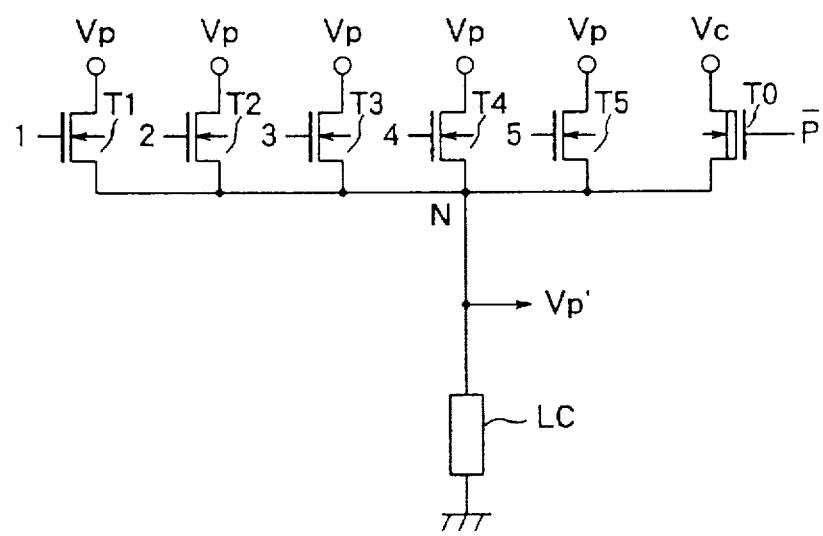
FIG. 12 is a circuit diagram showing another circuit for generating a voltage Vp'.

FIG. 12 shows another embodiment for generating the voltage Vp' of the third aspect of the present invention. In this embodiment, the potential level of the Vp' is determined by the proportion of the current flowing the N-channel type transistors (T1 to T5) to the current flowing the leak circuit LC. The signals 1 to 5 are applied to the gates of the transistors T1 to T5, respectively. The transistors T1 to T5 are connected between the high voltage supply potential Vp and the node N, and further the N-channel depletion type transistor T0 is connected between the power supply potential Vc and the node N. The signal /P is applied to the gate of the transistor T0. The leak circuit LC is connected between the node N and the ground potential. The potential Vp' is outputted from the node N. In this circuit, the signals 1 to 5 change to a logic "1" in sequence. When the signal 1 is a logic "1", the potential Vp' is the lowest, and when the signals 1 to 5 are all a logic "1", the potential Vp' is the highest. These signals 1 to 5 are supplied by the circuit as shown in FIGS. 9 and 10.

In the above-mentioned embodiment, the potential Vp' which is 5 sorts of potential levels for injecting electrons to the floating gates of the memory cells are set, and the potential Vp' changes to become higher in sequence. However, it is not necessary to set the 5 sorts. An optimal number of potentials can be set according to the manufacturing process. The essential concept of the present invention is to increase the electron injecting voltages in sequence so that electrons can be injected to the respective memory cells at an optimum voltage, so various modifications can be made to the circuits of the above-mentioned embodiment.

The fourth aspect of the present invention will be explained hereinbelow. This embodiment is related to a flash EEPROM which is a high data read speed.

Before to the description of the embodiment, the fourth aspect of the present invention will be summarized with reference to the attached drawings.

In this aspect of the present invention, electrons are injected to the floating gate of the memory cell by flowing a channel current by applying a high voltage to the control gate and the drain of the memory cell. By doing this, hot electrons are generated and electrons are injected. So, it is possible to reduce the distribution width of the threshold voltages of the memory cells, as compared with the conventional case where electrons are emitted from the floating gate by using a electron tunnel effect, thus realizing a flash EEPROM of a high read speed.

In the present invention, as a pattern layout and a circuit configuration of a memory cell array, it has been adopted such a circuit which can write data to the memory cells even when the threshold voltages of the memory cells are negative.

In the present invention, first the control gates of the memory cells are set to 0 V, and a high voltage is applied to the drains of the memory cells or a semiconductor substrate on which the memory cells are formed. By doing this, electrons are emitted from the floating gate to the drain or the channel region by utilizing the electron tunnel effect. In this case, there exists no problem even if threshold voltages of the memory cells are negative, electrons are emitted in such a way that the threshold voltages of all the memory cells become negative. After that, a high voltage is applied to a row line of the memory cells and drains of a predetermined number of the memory cells to flow the channel current through the memory cells, so that electrons are injected from the channel to the floating gate to write one of a binary data in the memory cell.

After that, the row line of the memory cells in which data are written is set to a predetermined voltage value, and data are read simultaneously from a plurality of the memory cells in which data have been written. The data write and data read are repeated, and the data write is stopped when the memory cells reach a predetermined threshold voltage. In general, when the channel current is flowed by applying a high voltage to the drain and the control gate of the memory cell and thereby electrons are injected from the channel to the floating gate, the threshold voltage of the memory cell to which electrons have been injected is proportional to the voltage value applied to the control gate. In other words, the higher the voltage applied to the control gate, the more will be the electrons injected to the floating gate, so that the threshold voltage after electron injection is increased. On the other hand, when the voltage applied to the control gate is lower, the amount of electrons injected to the floating gate decreases, and the threshold voltage after electron injection also decreases. In the present invention, when electrons are injected to the floating gate of the memory cell, the voltage applied to the control gate of the memory cell is reduced to a certain low degree. Accordingly, it is possible to reduce the distribution of the threshold voltages of the memory cells and further to control the threshold voltages of the memory cells to a positive small value. In addition, since a small number of the memory cells is read after electrons are injected and further since the injecting electrons and the reading are repeated, it is possible to further reduce the distribution of the threshold voltages among the memory cells. After the electron injection to the floating gates of all the memory cells has been completed and thereby one of a binary data have been written in all the memory cells, then a still higher voltage is applied to the control gates and further a high voltage is selectively applied to the drains to inject electrons to the floating gates, so that the other of a binary data is selectively written in the memory cell. As described above, data corresponding to a binary data to be written can be written in all the memory cells. The threshold voltage value of the memory cell after the first electron injection to the floating gate is set in such a way that the memory cell is turned off when 0 V is applied to the control gate thereof (non-selected status) and the memory cell is turned on when 5 V, for instance, is applied to the control gate thereof (selected status). Thus, all the memory cells have the threshold voltage. And then, the voltage of the control gate of the second electron injection is set to a voltage higher than a voltage of the first injection, and the threshold voltage of the memory cell after electron injection is raised to such a high value that the memory cell is not turned on when selected. As described above, one of a binary data and the other of a binary data are stored depending on whether memory cells are turned on or turned off when selected.

Figure 13:
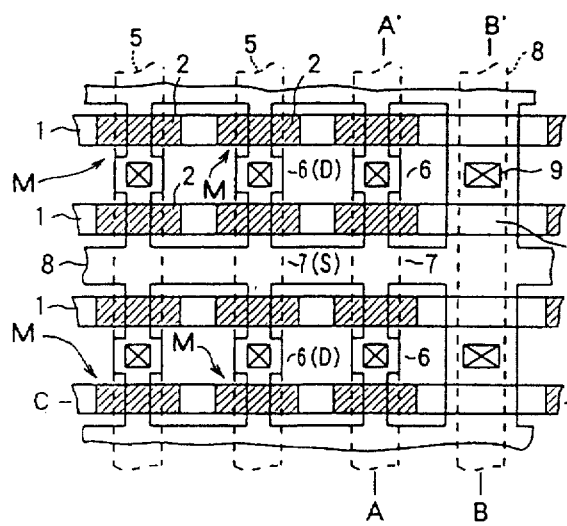
FIG. 13(a) is a plane view showing the essential portion of an embodiment of the fourth aspect of the present invention.
FIG. 13(b) is a cross-sectional view taken along the line A—A' in FIG. 13(a)
FIG. 13(c) is a cross-sectional view taken along the line B—B' in FIG. 13(a)
FIG. 13(d) is a cross-sectional view taken along the line C—C' in FIG. 13(a)
FIG. 13(e) is a symbolic diagram of the embodiment shown in FIG. 13(a)
Figure 13:
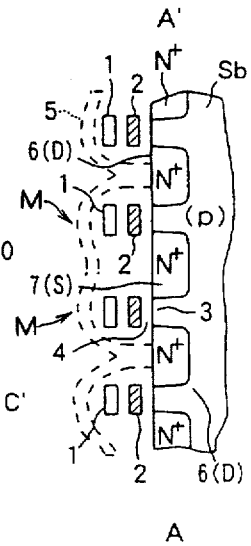
Figure 13:
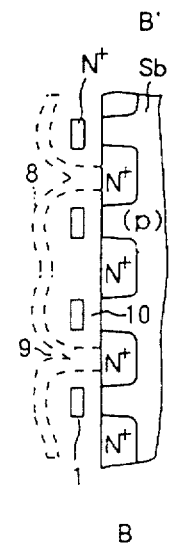
Figure 13:
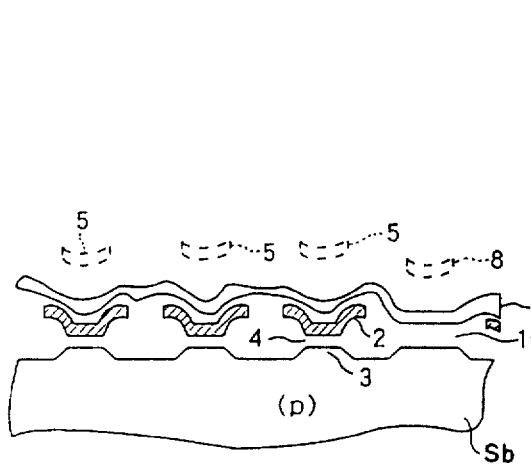
Figure 13:
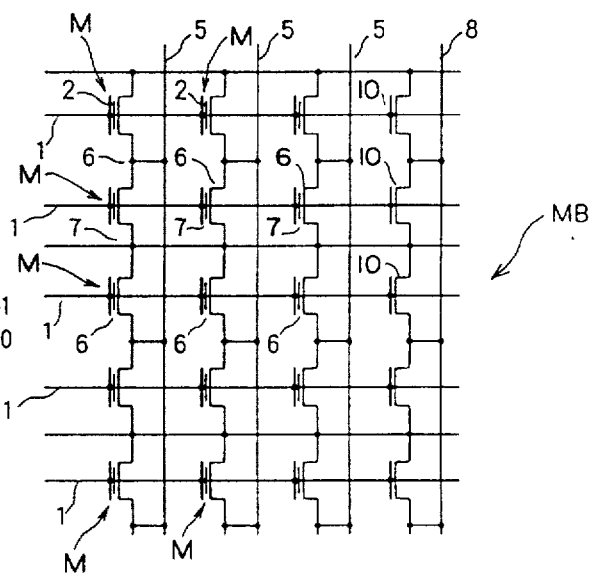

An embodiment of the fourth aspect of the present invention will be described with reference to FIGS. 13(a) to (e), which show an example of the embodiment of the flash EEPROM memory cell array. FIG. 13(a) is a plane view thereof; FIG. 13(b) is a cross-sectional view thereof taken along the line A—A'; FIG. 13(c) is a cross-sectional view taken along the line B—B'; FIG. 13(d) is a cross-sectional view taken along the line C—C'; and FIG. 13(e) is a symbolic diagram thereof. The same reference numerals have been retained for the similar elements as with the case of that shown in FIG. 33. The numeral 1 shows row lines which are control gates of the memory cells; 2 shows floating gates; 3 shows channel regions; 4 shows gate insulation films; and 5 shows column lines formed of aluminum, for instance. The drains 6 used in common for the adjacent memory cells are connected to the column lines 5. The numeral 8 shows a wire formed of aluminum, for instance to supply a reference potential (e.g., ground potential), which is connected to the sources 7 of the memory calls used in common for the adjacent memory cells through transistors 10 at junction positions 9. Further, the symbol Sb shows P-type semiconductor substrate.

In the embodiment of the fourth aspect of the present invention as configured above, since the source of the memory cell is connected to the reference potential through the transistor 10, even if the threshold voltage of the memory cell becomes negative, the potential of the column line is not dropped. When electrons are injected to the memory cell in which electrons have been emitted and thereby the threshold voltage thereof is a negative value, electrons are injected simultaneously to two adjacent memory cells arranged with the source 7 of the memory cells interposed therebetween. The wire 8 is provided for each block of the memory cells to which electrons are injected simultaneously. The wire 8 and the block having the memory cells which are connected to this wire 8 and to which electrons are injected simultaneously are separated from the other block with respect to the source regions 7. In the non-selected block whose row lines are 0 V, since the transistors 10 are turned off, even if the threshold voltages of the memory cells are negative and thereby the memory cells are turned on, a current path will not be formed between the column line and the wire 8 corresponding to the non-selected block. In the selected memory cells by setting the row line to a high voltage, current flows through the memory cells turned on simultaneously, so that electrons are injected to the floating gates of the memory cells. In the present invention, since electrons are injected simultaneously to the memory cells arranged side by side with a plurality of the sources 7 interposed therebetween, it is possible to turn on only the transistor 10 corresponding to the memory cells to which electrons are simultaneously injected, so that it is possible to connect the reference potential to only the selected memory cells. As explained above, although electrons can be injected simultaneously to the memory cells arranged with the sources therebetween, it is also possible to inject electrons to the memory block connected to the same row corresponding to the transistor 10.

Figure 14:
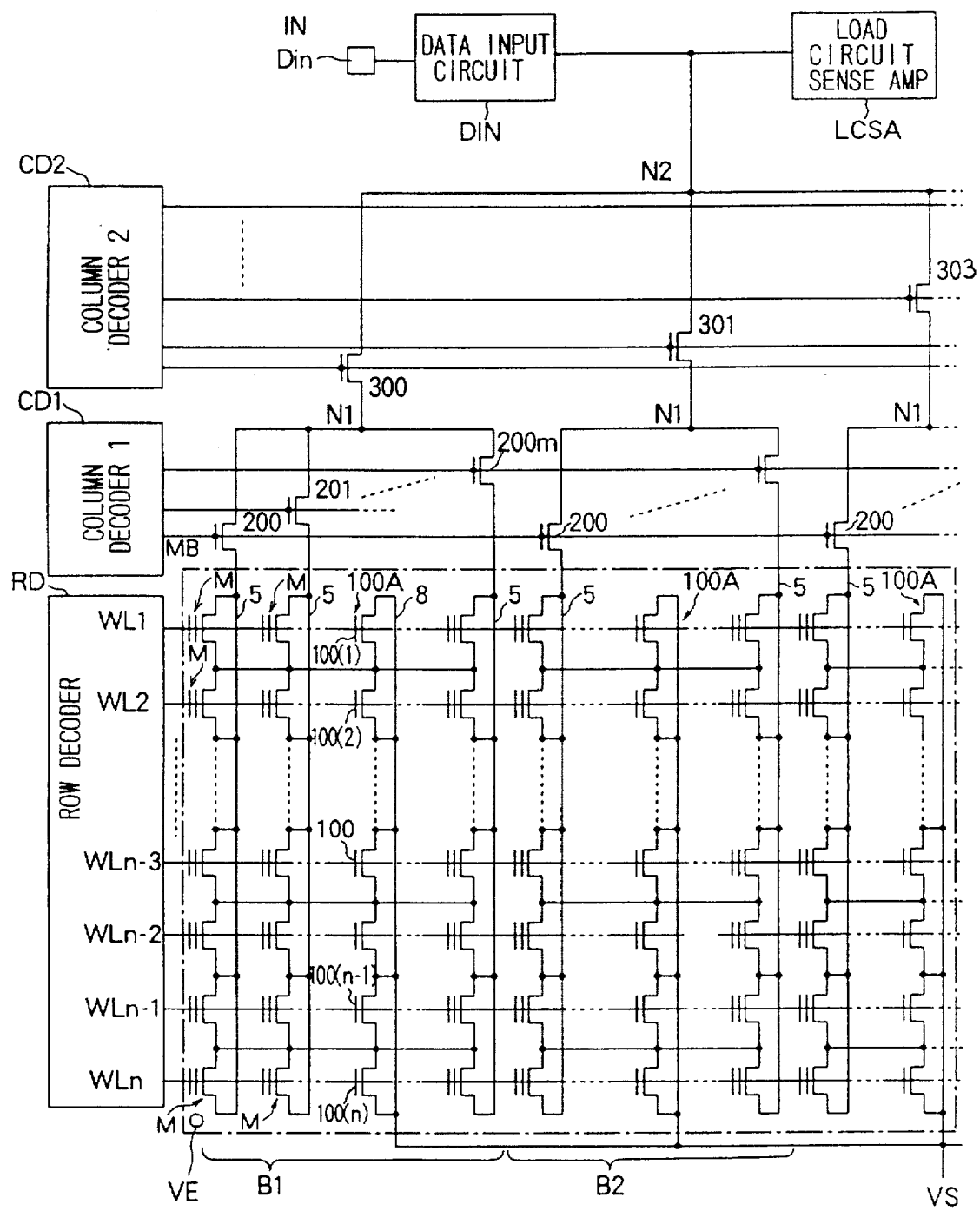
FIG. 14 is a circuit diagram showing the embodiment shown in FIG. 13(a) in more detail.

With reference to FIG. 14, an embodiment of the fourth aspect of the present invention will be described in further detail. FIG. 14 shows a memory device constructed by the use of the memory block MB equivalent to that shown in FIG. 13. This memory block MB is formed on a P well region enclosed by dot dashed lines. To this P well, a voltage is supplied from terminal VE. Row lines WL1, WL2, . . . , WLn of this memory block MB are connected to row decoder RD. The memory cells in this memory block MB are divided into a plurality of blocks B1, B2, . . . The respective blocks B1, B2, . . . have transistor groups 100A, 100A, . . . for supplying the reference potential, respectively. These transistor groups 100A, 100A, . . . are connected in common to the reference potential VS. Each respective transistor group 100A includes transistors 100, 100, . . . The respective column lines 5, 5, . . . of each block B1, B2, . . . are connected in common to node N1 through transistors 200, 201, . . . The gates of these transistors 200, 201, . . . , are connected to the column decoder CD1. Further, the nodes N1, N1, . . . are connected to node N2 through transistors 300, 301, . . . The node N2 is connected to load circuit/sense amplifier LCS and data input circuit DIN. To this date input circuit DIN, data Din are applied through input terminal IN.

In the device shown in FIG. 14, when electrons are emitted from the floating gates of the memory cells, the row lines WL1 to WLn are set to 0 V, and a high voltage is applied to VE to set the P well to a high voltage. Owing to this, the electrons of the floating gates of the memory cells are emitted from the floating gates to the P well. As a result, the threshold voltages of all the memory cells change to a negative value. After that, electrons are injected to the floating gates of these memory cells. In this electron injection, by adjusting the voltage value supplied to the control gates of the memory cells, electrons are injected to the floating gates in such a way that the memory cells are turned off when not selected but turned on when selected. The reference potential VS is supplied to the memory cells through the transistors 100. The reference potential supplied through the transistors 100 is used in common. For instance, electrons are injected simultaneously to the memory cells connected to the row lines WL1 and WL2. In this case, the transistors 200, 201, . . . , 200m controlled by the column decoder CD1 are turned on simultaneously. In the transistors 300, 301, 302, . . . controlled by the outputs of the column decoder CD2, only one transistor is turned on among these transistors, and the other remaining transistors are turned off. As described above, in order to inject electrons to the floating gates of the memory cells, a high voltage is applied from the data input circuit DIN to the drains of the memory cells. In this case, the transistors 100(1) and 100(2) connected to the row lines WL1 and WL2 are turned on, and the reference potential VS is supplied to the sources of the memory cells connected to the row lines WL1 and WL2 through the turned-on transistors 100(1) and 100(2). By the high voltage outputted by the data input circuit DIN, current flows from the data input circuit DIN to the reference potential VS through the transistor 300, transistors 200, 201, . . . 200m, the memory cells and the turned-on transistors 100(1) and 100(2), so that electrons are injected to the floating gates thereof. Since the row lines WL1 and WL2 are set to an appropriate high voltage, electrons are not injected to the floating gates excessively; that is, electrons are injected to the floating gates up to the value determined on the basis of the capacitive coupling between the floating gate and the control gate, the capacitive coupling between the floating gate and the drain, the capacitive coupling between the floating gate and the channel, the capacitive coupling between the floating gate and the source, and the potentials of the control gate and the drain. Therefore, although it is possible to inject electrons until the electron injection is saturated, in order to shorten the electron injection time, it is advantageous to stop the electron injection when the amount of electrons reaches an appropriate value, by setting the electron injection time to a short time and by checking the amount of injected electrons on all such occasions. In this checking, the potential at the two row lines for electron injection is set to a predetermined value lower than the potential for the normal data read, and the electron injection is stopped when the memory cells (to which electrons have been injected) are turned off. This checking can be effected simultaneously for a plurality of memory cells (to which electrons have been injected) or separately for each memory cell.

The non-selected row lines, for instance WLn and WLn-1 are set to 0 V. So, the transistors 100(n) and 100(n-1) connected to these two row lines are turned off, and thereby the sources of the memory cells connected to the row lines WLn and WLn-1 are disconnected from the reference potential VS. Therefore, no current flows through the memory cells connected to the non-selected row lines, and the drain potentials of the selected memory cells are not lowered, thus allowing electrons to be injected to the floating gates efficiently.

Further, in the embodiment shown in FIG. 14, although only a single transistor 100 is provided for one row line in each of the respective blocks B1, B2, . . . , without being limited to only one, it is desirable to provide an appropriate number of transistors under consideration of the resistance of the source side of the memory cell. In the same way, in each block, the number of memory cells connected to one row line must be determined to such the number that electrons can be injected most efficiently. In this case, however, although the electron injection efficiency can be improved by reducing the number of memory cells connected to a single row line, on the contrary since the chip size increases and thereby the cost rises, an optimum number of the memory cells must be determined under due consideration from the standpoint of the cost thereof.

Further, as already explained, it is unnecessary to inject electrons simultaneously to the memory cells related to the two row lines, that is, it is possible to set only one row line to a high voltage to inject electrons to the memory cells related to one row line. For instance, assuming that the row line WL1 is selected and set to a high voltage, and the other non-selected row lines WL2, . . . WLn are set to 0 V, current will not flow through the non-selected row lines other than the row line WL2, as already explained. However, since the row line WL1 is set to a high voltage, the transistors 100 connected to the row line WL1 are kept turned on. Therefore, the reference potential VS is supplied to the sources of the memory cells connected to the row line WL1, so that the reference potential VS is supplied to the sources of the memory cells connected to the row line WL2. After the high voltage VE is supplied to the P well to emit electrons from the floating gates, the threshold voltages of the memory cells are kept at a negative value. Accordingly, current flows to the references potential VS through the memory cells connected to the row line WL2. However, in comparison with the current flowing through the memory cells connected to the row line WL2 when electrons are injected by applying a high voltage to the row line WL2 (for setting the two row lines to the high voltage at the same time), since the row line WL2 is set to 0 V, the current flowing to the reference potential VS through the memory cells connected to the row line WL2 is far smaller. Therefore, even if electrons are injected to the floating gates of the memory cells by setting one row line to the high voltage, there exists no such problem that the drain voltages of the memory cells drop.

As described above, after one of a binary data have been written by setting the threshold voltages of all the memory cells to such the value for turning on the memory cells when selected but turning off when not selected, the binary data corresponding thereto are stored in all the memory cells by selectively writing the other of a binary data for each memory cell. In this case, data are written in the same way as with the case of the conventional NOR type EEPROM or the ultraviolet-erasure type ordinary EPROM. That is, by setting one selected row line to still a higher voltage, one of the transistors 200, 201, . . . , 200m is turned on by the column decoder CD1 and one of the transistors 300, 301, 302, . . . is turned on by the column decoder CD2, to select one column line. Further, a high voltage is applied to the control gate and the drain of the memory cell arranged at the intersection between the selected row line and the selected column line, to raise the threshold voltage to such a degree that the selected memory cell can be turned off by further injecting electrons to the floating gate of the memory cell. As described above, the other of a binary data are written selectively in the respective memory cells. Further, in this embodiment, although the memory cells are formed on the P well and further the threshold voltage of the memory cell is set to the negative value by applying the high voltage to the P well to emit electrons from the floating gate thereof, it is also possible to emit electrons from the floating gate to the drain thereof by setting the control gate (i.e., row line) of the memory cell to 0 V as is conventional and by applying the high voltage to the drain (i.e., column line) of the memory cell, without using the well region. Alternatively, various application can be enabled, for instance such that: it is possible to emit electrons from the floating gate to the drain and source of the memory cell and the substrate, by setting the semiconductor substrate (on which the drain and source of the memory cell and the memory cell are formed) to 0 V and by supplying a negative voltage from the row decoder to the control gate (i.e., row line) of the memory cell.

Figure 15:
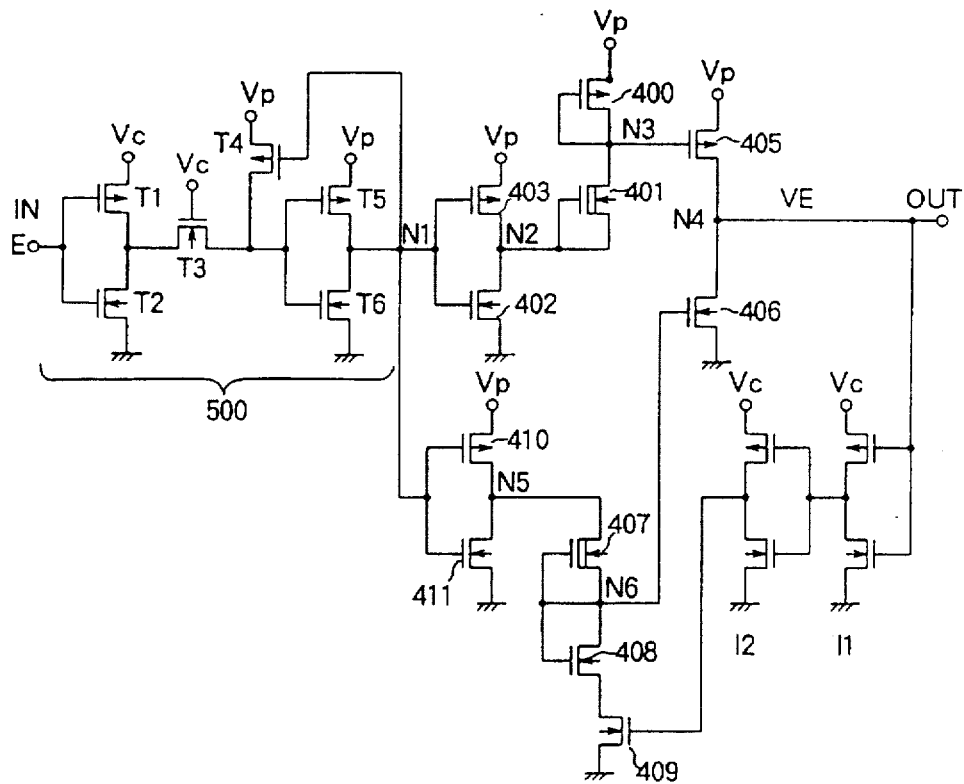
FIGS. 15(a) and (b) are circuit diagrams showing two different circuits each for generating voltage VE, respectively.
Figure 15:
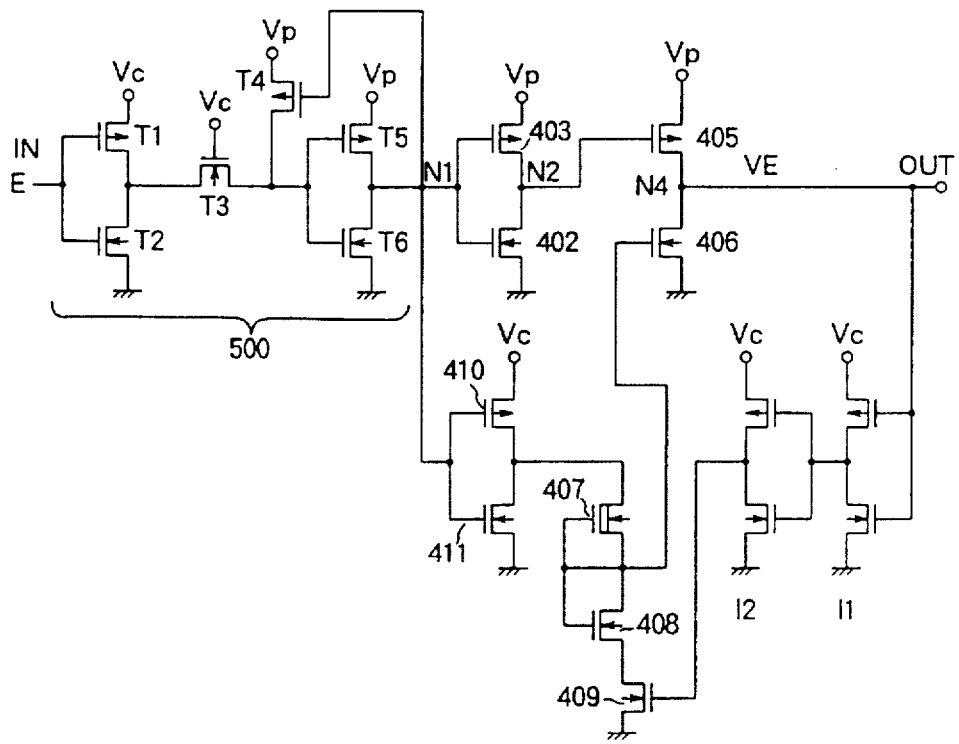

FIGS. 15(a) and (b) show examples of two different circuits suitable for generating the voltage VE used when electrons are emitted from the floating gate of the memory cell. For instance, when electrons are injected or emitted to and from the floating gate through a gate insulation film formed an extremely thin as about 100 angstroms by the utilization of the tunnel effect, it is necessary to apply an electric field which is high to such an extent that the tunnel effect can be caused. However, when a high electric field is applied to the gate insulation film suddenly, it is well known that the gate insulation film deteriorates soon. Accordingly, when electrons are injected to the floating gate, it is necessary to gradually increase the voltage applied to the control gate. In addition, even when electrons are emitted from the floating gate, it is also necessary to raise the voltage VE applied to the well gradually. The circuits as shown in FIGS. 15(a) and (b) are suitable for generating the voltage VE as described above.

First, in FIG. 15(a), to input terminal IN to which signal E is applied, level shift circuit 500 having transistors T1 to T6 is connected. The circuit 500 is equivalent to the circuit shown in FIG. 10, from which transistors T3 and T8 are removed. This circuit 500 is used to shift a signal of the voltage supply (e.g., 5 V) level to a signal of the high voltage Vp level. To node N1 of the output side of this circuit 500, the gates of N-channel type transistor 402, P-channel type transistor 403, P-channel type transistor 410, and N-channel type transistor 411 are connected. The transistors 403 and 402 are connected in series between the high voltage Vp and the ground potential, N-channel depletion type transistor 401 and P-channel type transistor 400 are connected in series between node N2 (a junction point between the transistors 403 and 402) and the high voltage Vp. The gate of the transistor 400 is connected to the node N2. The gate of the transistor 400 is connected to node N3 (a junction point between the transistors 401 and 400). This node N3 is connected to the gate of P-channel type transistor 405.

This transistor 405 and N-channel transistor 406 are connected in series between the high voltage Vp and the ground potential. On the other hand, transistors 410 and 411 are connected in series between the high voltage Vp and the ground potential. N-channel depletion type transistor 407, N-channel transistor 408 and N-channel transistor 409 are connected in series between node N5 (a junction point between the transistors 410 and 411) and the ground potential. The gates of the transistors 407 and 408 are connected to node N6 (a junction point between these transistors 407 and 408). This node N6 is connected to the gate of the transistor 406. Further, to the gate of the transistor 409, an output terminal of inverter I2 connected between the supply voltage terminal of the ground potential is connected. To the input of the inverter I2, an output terminal of inverter I1 connected between the supply voltage Vo and the ground potential is connected. The input of the inverter I1 is connected to the node N4. This node N4 is a junction point between the transistors 405 and 406, from which the voltage VE is outputted. When electrons are emitted from the floating gate, the signal E supplied to the input terminal IN is set to a logic "1".

The signal VE is shifted to the high voltage Vp level by the circuit 500. In other words, when the signal E becomes a logic "1", the node N1 is level-shifted to a logic "1", and outputted as the voltage Vp. Therefore, the transistor 402 is turned on, and the transistor 403 is turned off.

That is, current flows from the voltage Vp to the ground potential through the transistors 400, 401, and 402. This current value is determined by the depletion type N-channel transistor 401, and current value flowing through the transistor 405 whose gate is connected to the drain of the P-channel type transistor 400 (whose gate and drain are connected to each other) is decided by the current flowing through the transistor 400. The transistors 400 and 405 constitute a mirror current circuit, and the current flowing through the transistor 405 is decided according to a ratio in size of the transistor 405 to the transistor 400. That is, the rise speed of the potential of VE charged by the transistor 405 is adjustable by the current flowing through the transistor 401. In the same way, when VE is discharged, the current flowing through the transistor 406 can be changed by adjusting the current flowing through the transistor 407, so that the discharge speed of VE can be adjusted freely on the basis of the size of the transistor 407.

When the signal E changes to a logic "1" to discharge VE, since the node N1 becomes a logic "0", the transistor 411 is turned off and the transistor 410 is turned on.

When VE is being charged, since this VE is transmitted to the gate of the transistor 409 through the inverter I1 and the inverter I2, the transistor 409 is turned on. By this, a current path can be formed from the high voltage VE to the ground potential through the transistors 410, 407, 408 and 409. When VE is discharged below a predetermined potential, since the inverter I1 detects this voltage drop and changes the output to a logic "1". Therefore, the output of the inverter I2 changes to "0" to turn off the transistor 409. Accordingly, when VE drops below a predetermined potential, since no current path is formed through the transistors 410, 407, 408 and 409, the gate of the transistor 406 is charged up to Vp through the transistors 410 and 407, so that VE is discharged to the ground potential.

When Vp is a supply voltage supplied from the outside, it is considered that the current supplying capability is large. Therefore, even if current flows through the transistors 410, 407, 408 and 409, Vp will not drop in potential. However, when the high voltage Vp is generated within the chip by use of Vc, the current supplying capability is small. Therefore, there exists a possibility that Vp drops in potential due to the current flowing through the above-mentioned current path, so that a sufficiently high voltage cannot be obtained.

FIG. 15(b) shows an example of the circuit for generating an optimum VE, which circuit is used for generating a high voltage inside thereof and for injecting and emitting electrons to and from the floating gate by use of the generated high voltage. The points different between the circuit shown in FIG. 15(b) and that shown in FIG. 15(a) are that the transistors 400 and 401 are both removed and the node N2 is directly connected to the gate of the transistor 405, and that the source of the transistor 410 is connected to Vc instead of the supply voltage Vp. The other points are the same in construction between both. In this circuit, it is unnecessary to adjust the potential rise speed by the transistors 400 and 401 as shown in FIG. 15(a), because the voltage rise speed of Vp generated internally by an internal boosted potential generating circuit is slow. Therefore, it is possible to omit these transistors 400 and 401, so that no current flows outside through these transistors. Further, although the source of the transistor 410 is connected to Vp in FIG. 15(a), since the source of the transistor 410 is connected to Vc in the case of the circuit shown in FIG. 15(b), the current path of the transistors 410, 407, 408 and 409 is formed between Vc and the ground potential, so that there are no current flowing paths from Vp to the outside. As a result, it is completely possible to use the internal high voltage generated by the voltage boosting circuit formed inside the chip.

Figure 16:
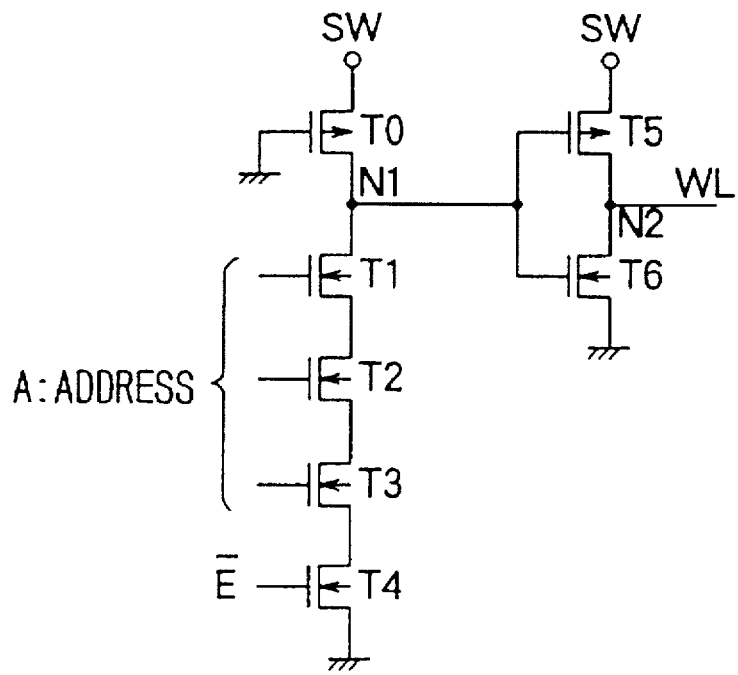
FIG. 16 is a circuit diagram showing an example of a row decoder.

FIG. 16 is an example of a row decoder circuit. In FIG. 16, transistors T0 to T4 are connected in series between supply voltage SW and ground potential. The gate of the transistors T0 is grounded. To the gates of the N-channel type transistors T1 to T3, an address A is inputted, respectively. To the gate of the N-channel type transistor T4, signal /N is inputted. Node N1 of a junction point between the two transistors T0 and T1 is connected to the gates of P-channel type transistor T5 and N-channel type transistor T6, respectively. These transistors T5 and T6 are connected between the supply voltage SW and the ground potential. A decode signal is outputted from node N2 of a junction point between the transistors T5 and T6. When electrons are omitted from the floating gate, the signal /E changes to a logic "0" to set all the row lines WL to a logic "0", that is, 0 V.

Figure 17:
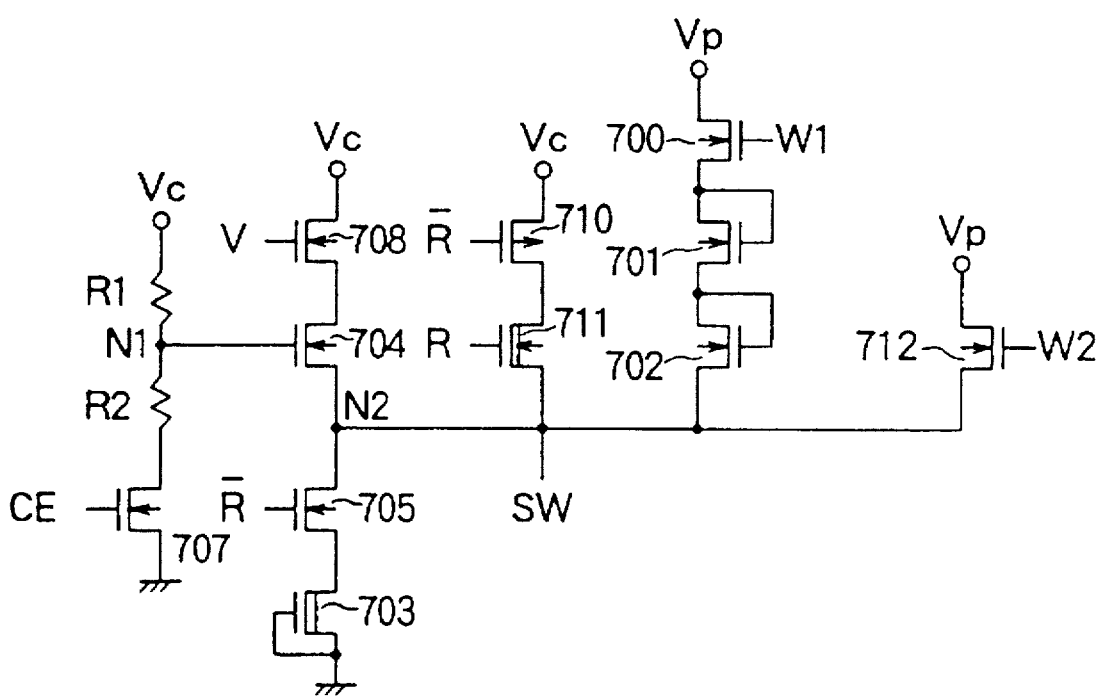
FIG. 17 is a circuit diagram showing an example of a circuit for generating supply voltage SW.

FIG. 17 is an example of the circuit for generating the supply voltage SW for the row decoder circuit shown in FIG. 16. The signal waveforms at the respective nodes are shown in FIG. 18.

As understood by FIG. 17, in this circuit, resistors R1 and R2 and N-channel type transistor 707 are connected in series between the supply voltage Vc and the ground potential. To the gate of this transistor 707, signal CE is applied. Further, between the supply voltage Vc and the ground potential, P-channel type transistor 708, P-channel type transistor 704, N-channel type transistor 705 and N-channel depletion type transistor 703 are connected in series. To the gate of the transistor 708, signal V is applied. The gate of the transistor 704 is connected to node N1 of a junction point between the resistors R1 and R2. To the gate of the transistor 705, signal /R is applied. The gate of the transistor 703 is connected to the source thereof. Further, between the supply potential Vc and node N2 of a junction point between the transistors 704 and 705, P-channel type transistor 710 and N-channel depletion type transistor 711 are connected in series. To the gates of these transistors 710 and 711, signals /R and R are supplied, respectively. Further, between the high supply potential Vp and the node N2, N-channel type transistors 700 to 702 are connected. To the gate of the transistor 700, signal W1 is supplied. The gates of the transistors 701 and 702 are connected to the drains thereof, respectively. Further, between the high supply potential Vp and the node N2, N-channel type transistor 712 is connected, and signal W2 is supplied to the gate thereof. Further, voltage source SW can be obtained from the node N2.

Figure 18:
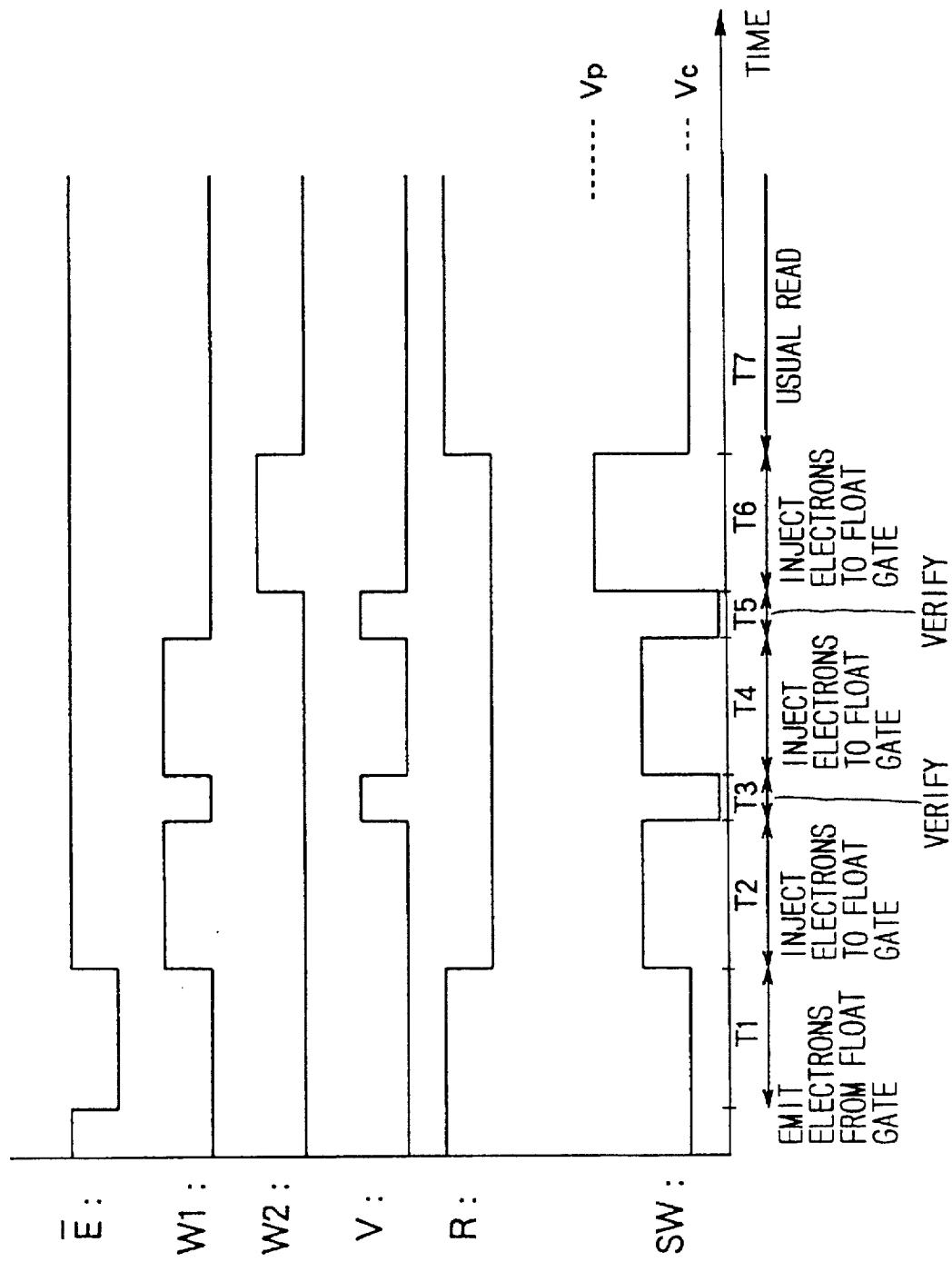
FIG. 18 is a signal waveform diagram showing the signals at the respective nodes shown in FIGS. 16 and 17.

As understood by FIG. 18, during period T1 when electrons are emitted from the floating gate of the memory cell, the signal /E is set to a logic "0"; the signal R is set to a logic "1"; the signal /R is set to a logic "0", respectively. At this time, the Vc potential is developed at the voltage source SW, so that the row decoder circuit operates on the basis of this potential Vc.

When one of a binary data are stored in all the memory cells by injecting electrons to the floating gates thereof, to obtain such threshold voltages that the memory cells are turned off when not selected but turn on when selected, the signal /E is set to a logic "1"; the signal W1 is set to a logic "1"; the signal R is set to a logic "0"; and the signal /R is set to a logic "1", respectively. The potential corresponding to the a logic "1" of this signal W1 is Vp or a value higher than Vp by the threshold voltage of the N-channel enhancement type transistor. When the signal W1 is at the potential Vp, the potential of the voltage source SW is a value lower than Vp by an addition of the threshold voltages of the N-channel enhancement type transistors 700, 701 and 702. This SW potential is so set as to satisfy the threshold voltages of the memory cells as described above. As already explained, when the memory cell threshold voltages are checked and the electrons are injected repeatedly in sequence by setting this period short, the signal V is set to a logic "1" (periods T3 and T5) and the signal W1 is reset to a logic "0". The signal CE is at a logic "1" when the chip is selected; the gate potential of the transistor 704 is determined by the ratio of the resistor R1 to the resistor R2; and the potential SW is set to a potential lower than the potential at the node N1 of a junction point between the two resistors R1 and R2 by the threshold voltage of the N-channel enhancement type transistor. To the control gate of the selected memory cells, this potential SW is supplied. In this case, if the memory cells can be turned off, the circuit is all right.

Further, period T6 is a time interval during which the threshold voltage is increased to such a value that the memory cell selected by injecting electrons to the floating gate thereof can be turned off. In this case, the signal W2 is at a logic "1"; that is, set to a value higher than Vp by the threshold voltage of the N-channel enhancement type transistor. In this case, the potential Vp is outputted to SW as it is, so that sufficient electrons for turning off the selected memory cell are injected to the floating gate thereof.

Period T7 indicates the ordinary read mode, during which the signal R is set to a logic "1"; the signal /R is set to a logic "0"; and Vc is outputted from SW. During the period T2 to T6, the signal /R is at the logic "1", so that the transistor 705 shown in FIG. 17 is turned on, and SW is discharged through the transistor 703. These transistors 705 and 703 are provided to prevent SW from being floated electrically. However, there transistors can be omitted.

Figure 19:
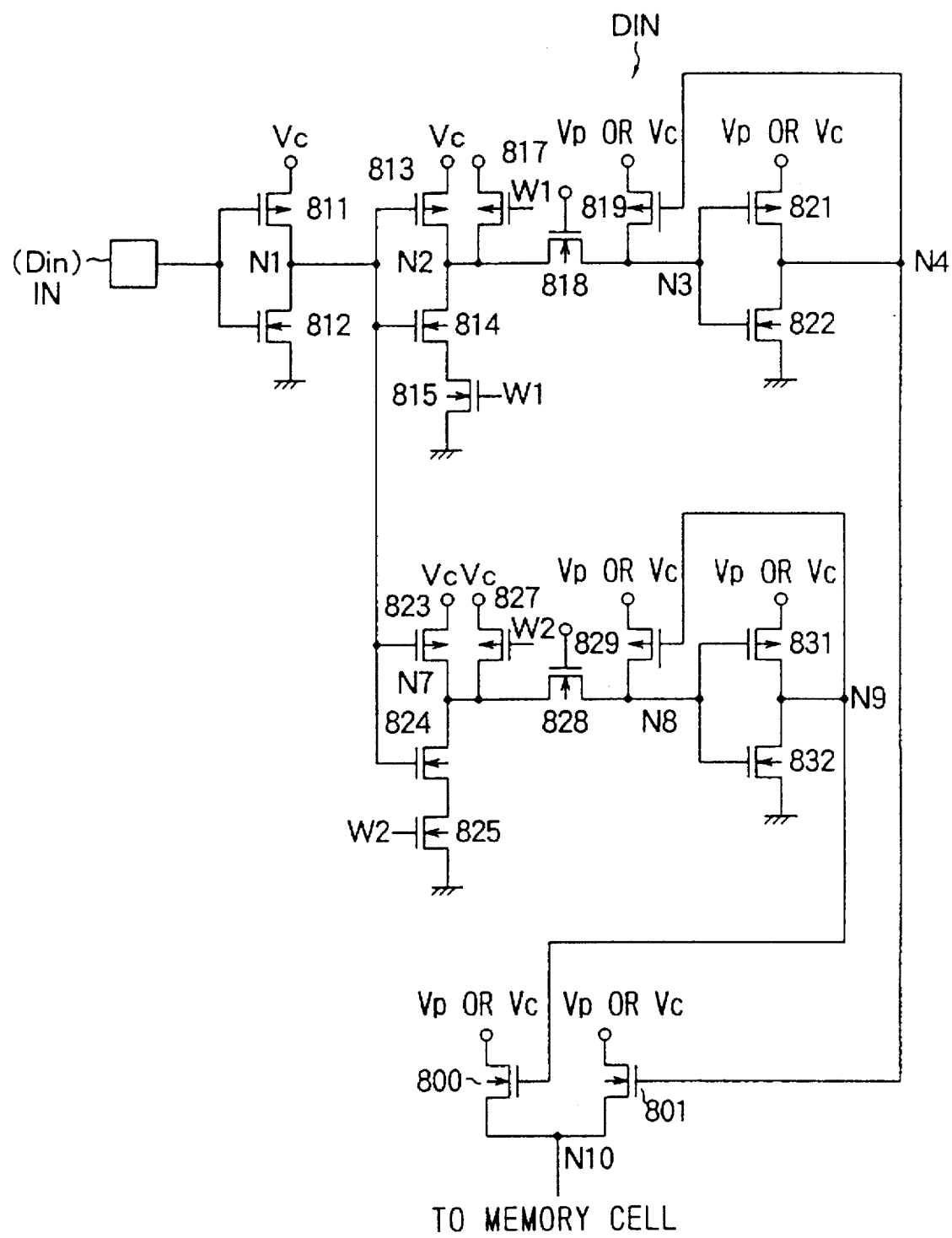
FIG. 19 is a circuit diagram showing an example of a data input circuit.

FIG. 19 is an example of the data input circuit DIN of the present invention.

Input terminal IN to which data Din are inputted is connected to the gates of P-channel type transistor 811 and N-channel type transistor 812. These transistors 811 and 812 are connected in series between supply potential Vc and ground potential. The node N1 of a junction point of these transistors 811 and 812 is connected to the gates of P-channel type transistor 813 and N-channel type transistor 814. These transistors 813 and 814 and N-channel type transistor 815 are connected in series between supply potential Vc and the ground potential. To the gate of the transistor 815, signal W1 is supplied. Node N2 of a junction point between the transistors 813 and 814 is connected to node N3 through N-channel type transistor 818.

The gate of the transistor 818 is connected to the supply potential Vc. Between the supply potential Vc and the node N2, P-channel type transistor 817 is connected, and the signal W1 is supplied to the gate thereof. Further, between the supply potential Vc and the node N3, P-channel type transistor 819 is connected, the gate thereof is connected to node N4. The node N3 is connected to the gates of P-channel type transistor 821 and N-channel type transistor 822, and these transistors 821 and 822 are connected in series between the supply potential Vp (or Vc) and the ground potential. The junction point of these transistors 821 and 822 is connected to the node N4.

Further, the node N1 is connected to the gates of P-channel type transistor 823 and N-channel type transistor 824. These transistors 823 and 824 and N-channel type transistor 825 are connected in series between the supply potential Vc and the ground potential. To the gate of the transistor 825, the signal W2 is supplied. Node N7 of a junction point between the transistors 823 and 824 is connected to node N8 through N-channel type transistor 828.

The gate of the transistor 828 is connected to the supply potential Vc. Between the supply potential Vc and the node N7, P-channel type transistor 827 having the gate to which the signal W2 is supplied is connected. Between the supply potential Vp (or Vc) and the node N8, P-channel type transistor 829 is connected. To the gate of the transistor 829, node N9 is connected. The node N8 is connected to the gates of P-channel type transistor 831 and N-channel type transistor 832. These transistors 831 and 832 are connected in series between the supply potential Vp (or Vc) and the ground potential. The junction point between these transistors 831 and 832 is connected to the node N9. This node N9 is connected to the gate of N-channel type transistor 800. This transistor 800 is connected between the supply potential Vp (or Vc) and the node N10. Further, between the supply potential Vp (or Vc) and the node N10, N-channel type transistor 801 is connected. To the gate of this transistor 801, the node N4 is connected. Further, the node N10 corresponds to the node N2 shown in FIG. 14, and data is transmitted from this node N10 to the memory cell.

In the above-mentioned circuit, when electrons are injected to the floating gate, since there exists no problem even if the potential of the floating gate is lower than that of the control gate, Vc can be used as the voltage applied to the drain of the memory cell, instead of Vp. When one of a binary data are stored by injecting electrons to the floating gates, since electrons are injected to a plurality of the memory cells at the same time, a larger current flows. Therefore, in this embodiment, the transistors for applying voltage to to the memory cells are changed between when one of a binary data are written and when the other of a binary data thereof are written. That is, the current supplying capability of the transistors used for writing one of a binary data is determined larger than that of the transistors used for writing the other of a binary data. In more detail, when one of a binary data are written by selecting a plurality of the memory cells, input Din is set to a logic "0" and the signal W1 is set to a logic "1". At this time, the transistor 801 is turned on, so that a voltage is applied to the drain of the memory cells. Further, when the other of a binary data are written, the input Din is set to a logic "1", and the signal W2 is set to a logic "1", to turn on the transistor 800, so that a voltage is applied to the drains of the memory cells. As described above, by setting the current supplying capability of the transistor 801 larger than that of the transistor 800, when electrons are injected to the floating gates of a plurality of the memory cells, the voltage at the drains of the memory cells can be maintained at a sufficiently high level.

As explained above, in the embodiment of the present invention, after electrons have been emitted from the floating gates of the memory cells to set the threshold voltages of the memory cells to the negative value, since one of a binary data are written by injecting electrons to the floating gates of all the memory cells, it is possible to suppress the dispersion width of the threshold voltages of the memory cells, with the result that the read speed from the memory cells can be increased.

An embodiment of the fifth aspect of the present invention will be described hereinbelow. In this embodiment, the circuit is so configured as to prevent an increase in chip size caused when latch circuits are provided.

Prior to the description of the embodiment of the fifth aspect of the present invention with reference to the attached drawings, the fifth aspect of the present invention will be summarized below:

This aspect of the present invention has been made to hardly consume current, when electrons are injected to or emitted from the floating gates of the memory cells of the EEPROM by the utilization of the electron tunnel effect.

In the conventional EEPROM, as already stated, the latch circuit is provided to each of the columns of the memory cell array. Consequently, the respective latch circuits must be arranged in the arrangement pitch of the memory cells. Therefore, the pattern layout is restricted, so that the pattern area has increased. In this fifth aspect of the present invention, by placing the latch circuits remote from the memory cell array, the layout of the latch circuits can be freed, so that any vacant places on the chip can be effectively utilized. As a result, it has become possible to reduce the chip size, as compared with the conventional one.

An embodiment of the fifth aspect of the present invention will be described hereinbelow with reference to FIG. 20.

Figure 20:
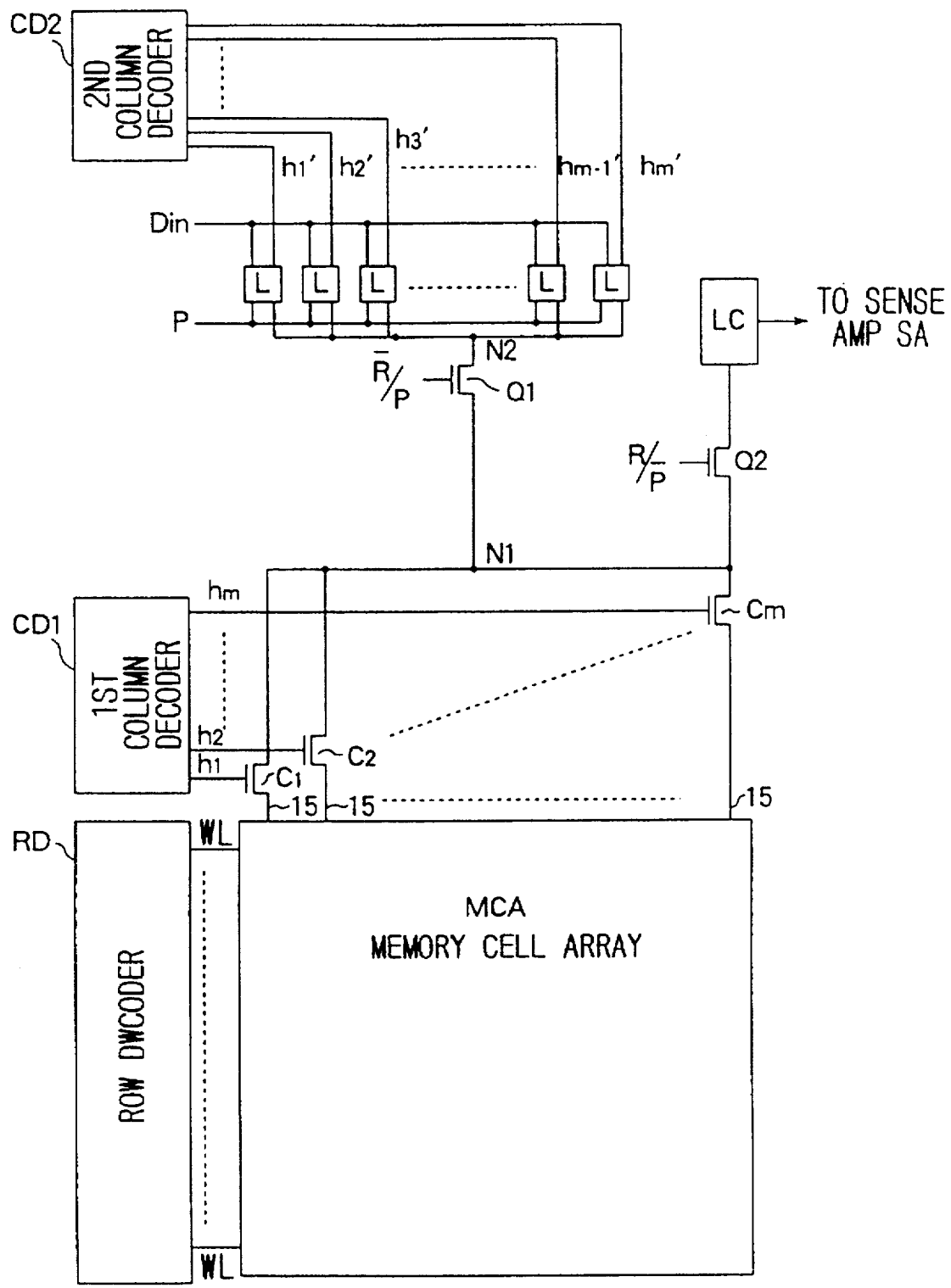
FIG. 20 is a block diagram showing a first embodiment of the fifth aspect of the present invention.

As shown in FIG. 20, row decoder RD for selecting a row of the memory cell array MCA is connected to the memory cell array MCA. The respective column lines 15 of the memory cell array MCA are connected to the node N1 through the column gate transistors C1, C2, .... The respective transistors C1, C2, ... are selectively turned on or off in response to the signals h1, h2, ... applied by the first column decoder CD1. The node N1 is connected to load circuit LC through transistor Q2. Signal (R)/(/P) is supplied to the gate of the transistor Q2. The load circuit LC is connected to sense amplifier SA. Further, the node N1 is connected to node N2 thorough transistor Q1. Signal (/R)/(P) is applied to the gate of the transistor Q1. The transistors Q1, Q2 and C1 to Cm are all of N-channel type. Latch circuits L, L, ... are connected to the node N2. The input data Din are supplied to the latch circuits L, L, .... Signals h1', h2', ... are applied to the latch circuits L, L, ..., respectively, by the second column decoder CD2 and the signal P is supplied to the latch circuits. In this embodiment, data to be written in the memory cells are latched by the latch circuits L, L, .... These latch circuits L, L, ... are arranged at a position different from the memory cell array MCA. Data written in the memory cell arranged in the same row are latched by the latch circuits L, L, ... for each address in correspondence to the outputs h1', h2', ... of the second column decoder CD2. After that, the signal (/R)/(P) is set to a high potential to turn on the transistor Q1. Column gate transistors C1, C2, ... are turned on in sequence in response to the output signals of the first column decoder CD1. As described above, the latch circuits L, L, ... are controlled by the second column decoder CD2. Data are transmitted from the latch circuits L, L, ... to the respective columns of the memory cell array. The respective column lines 15 are charged to a high voltage or discharged to ground potential, in response to data supplied by the latch circuits L. By the charged potential, electrons are emitted from the floating gate of the memory cell. The charged potential is gradually discharged due to a leak current, for example, between the P-N junction. Therefore, for each predetermined period, data are transmitted again from the latch circuits L, L, . . . to the corresponding respective column lines by turning on the column gate transistors C1, C2, . . . in sequence in response to the first column decoder CD1 and the second column decoder CD2. In the above-mentioned construction, it is not necessary to arrange the latch circuit L, L, . . . adjacent to the memory cell array MCA. The latch circuits L, L, . . . are arranged at any desired positions.

Figure 23:
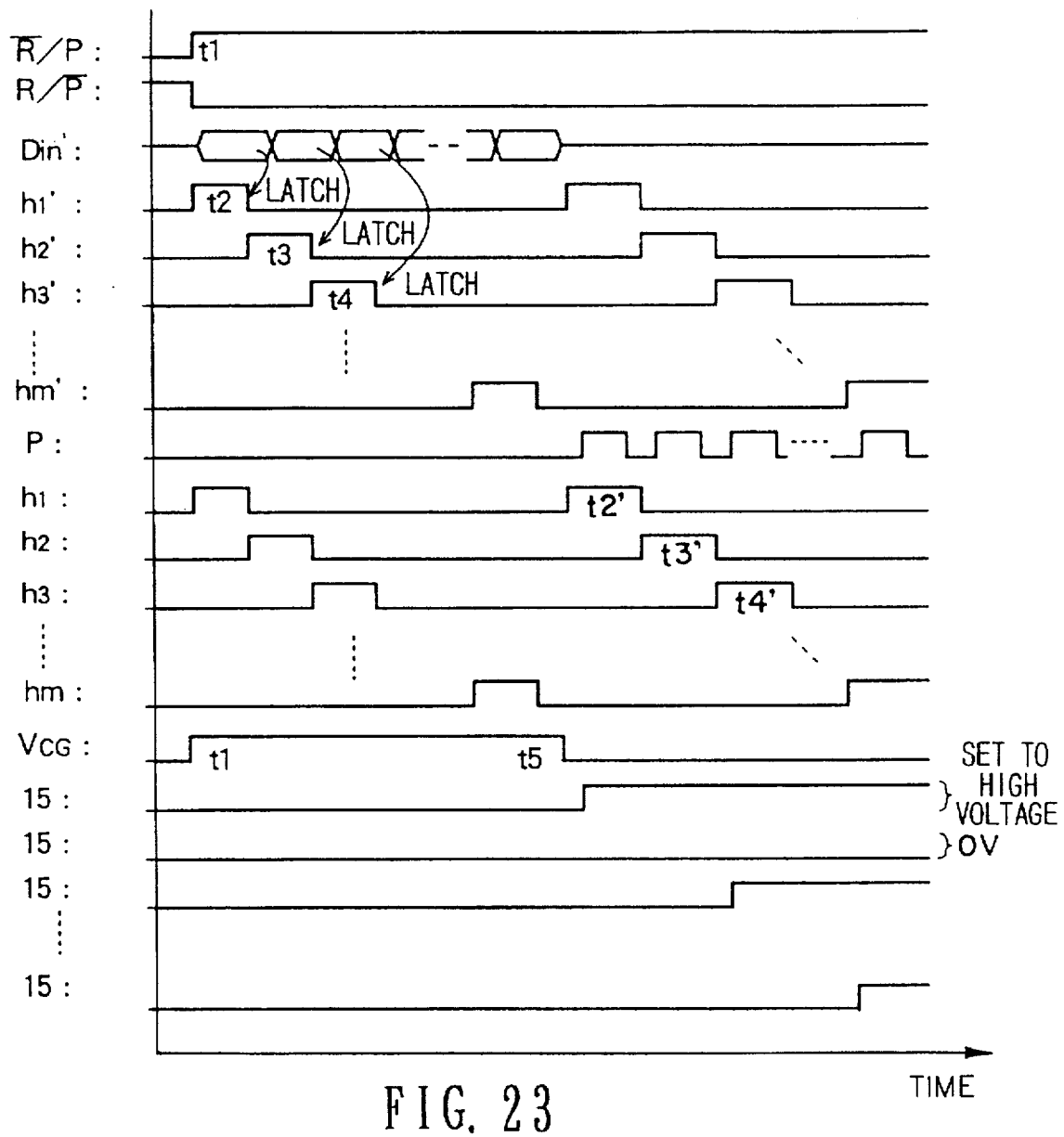
FIG. 23 is a signal waveform diagram showing the respective signals shown in FIG. 20.

FIG. 23 shows the waveforms of the respective signals. When data are written, the signals (/R)/(P) is set to a high voltage (a logic "1") (at t1). When the output signals h1', h2', . . . , hm' of the second column decoder CD2 are a logic "1", the inputted data Din are latched by the latch circuits L, L, . . . (at the times t2, t3, t4, . . . ), respectively. At these times, the gates (i.e., VCG) of all the memory cells are set to the high voltage to inject electrons to the floating gates of all the memory cells (at t1). After electrons are injected to the floating gates, VCG is set to 0 V for preparation of the succeeding electron emission (at t5). Then, the signals h1', h2', . . . , hm' and the signals h1, h2, . . . , hm are set to a high voltage (a logic "1") in sequence to transmit the data latched by the latch circuits to the corresponding column lines (at t2', t3', t4') when the signal P is a logic "1". The column lines 15 are set to either the high voltage or 0 V according to the latched data. In the selected memory cells connected to the column lines 15 set to the high voltage, electrons are emitted from the floating gates thereof, and in the selected memory cells connected to the column lines 15 set to 0 V, electrons injected to the floating gates thereof are kept. Data can be written in the memory cells, as described above.

Figure 21:
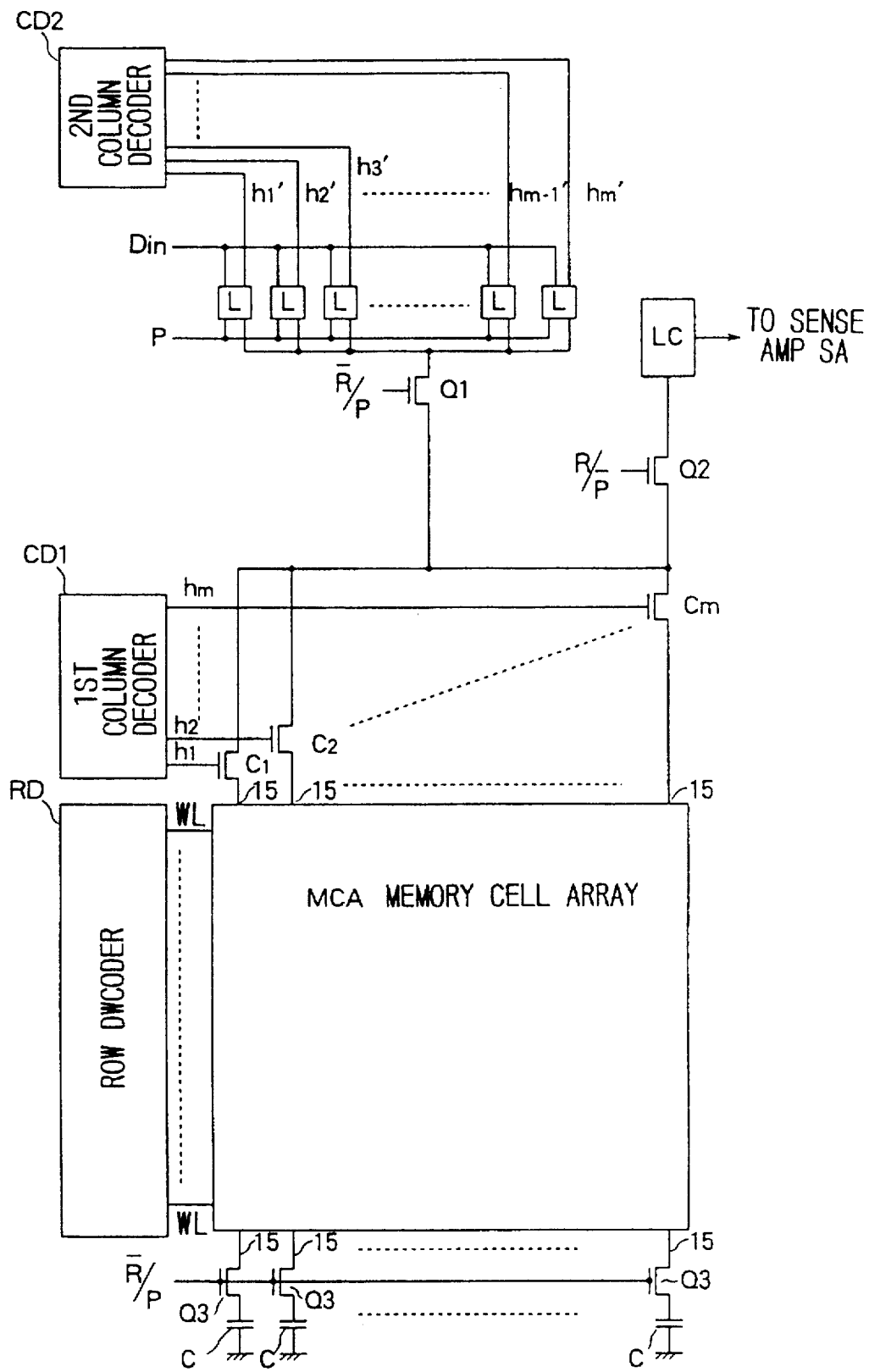
FIG. 21 is a block diagram showing a second embodiment of the fifth aspect of the present invention.

FIG. 21 is another embodiment of the fifth aspect of the present invention. The point different from that shown in FIG. 20 is that capacitances C are connected to the column lines 15 via N-channel type transistor Q3, respectively. The other points are quite the same as in FIG. 20. To the gate of the transistor Q3, the signal (/R)/(P) is applied.

When data are written, after data have been transmitted from the latch circuits L to the corresponding column lines, the column gate transistors C1, C2, . . . are turned off, so that the respective column lines 15 are set an electrically floating condition. The capacitance C is provided for holding the data transmitted from the latch circuit L as long as possible. When data are read, the transistors Q3 are turned off. Therefore, the data read speed is not influenced by the capacitances C.

Figure 22:
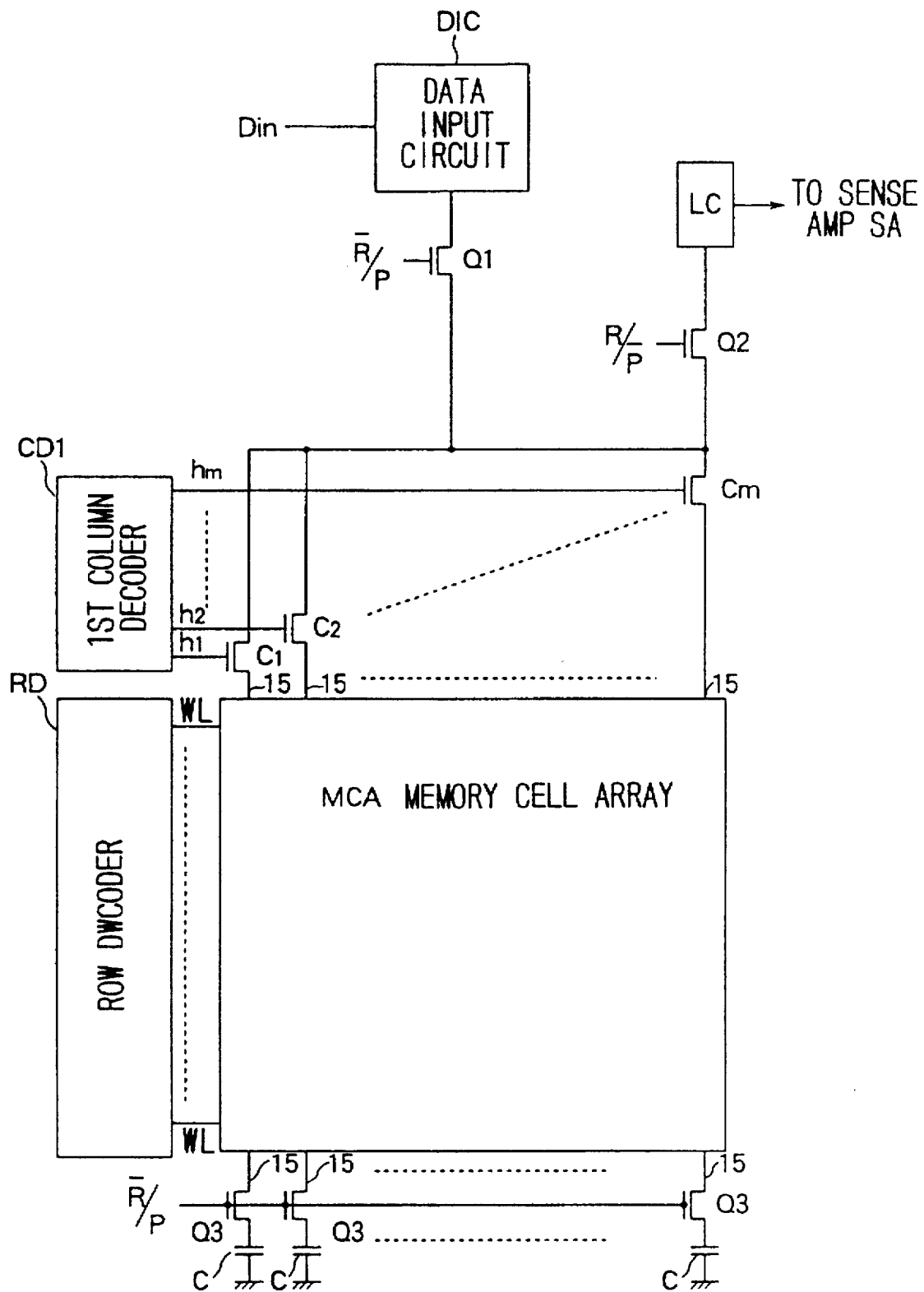
FIG. 22 is a block diagram showing a third embodiment of the fifth aspect of the present invention.

FIG. 22 shows another embodiment of the fifth aspect of the present invention. In the example shown in FIG. 22, the latch circuits are omitted from that shown in FIG. 21. In the cases shown in FIGS. 20 and 21, the data to be written are once latched by the latch circuits L. In contrast with this, in the example shown in FIG. 22, the latch circuits L are not provided, and the input data Din are transmitted to the respective column lines 15 from the data input circuit DIC. To write data to the memory cells corresponding to the respective columns, the input data are given in sequence, and the column gate transistors C1, C2, . . . are turned on in sequence to transmit data to the column lines 15, respectively.

Figure 24:
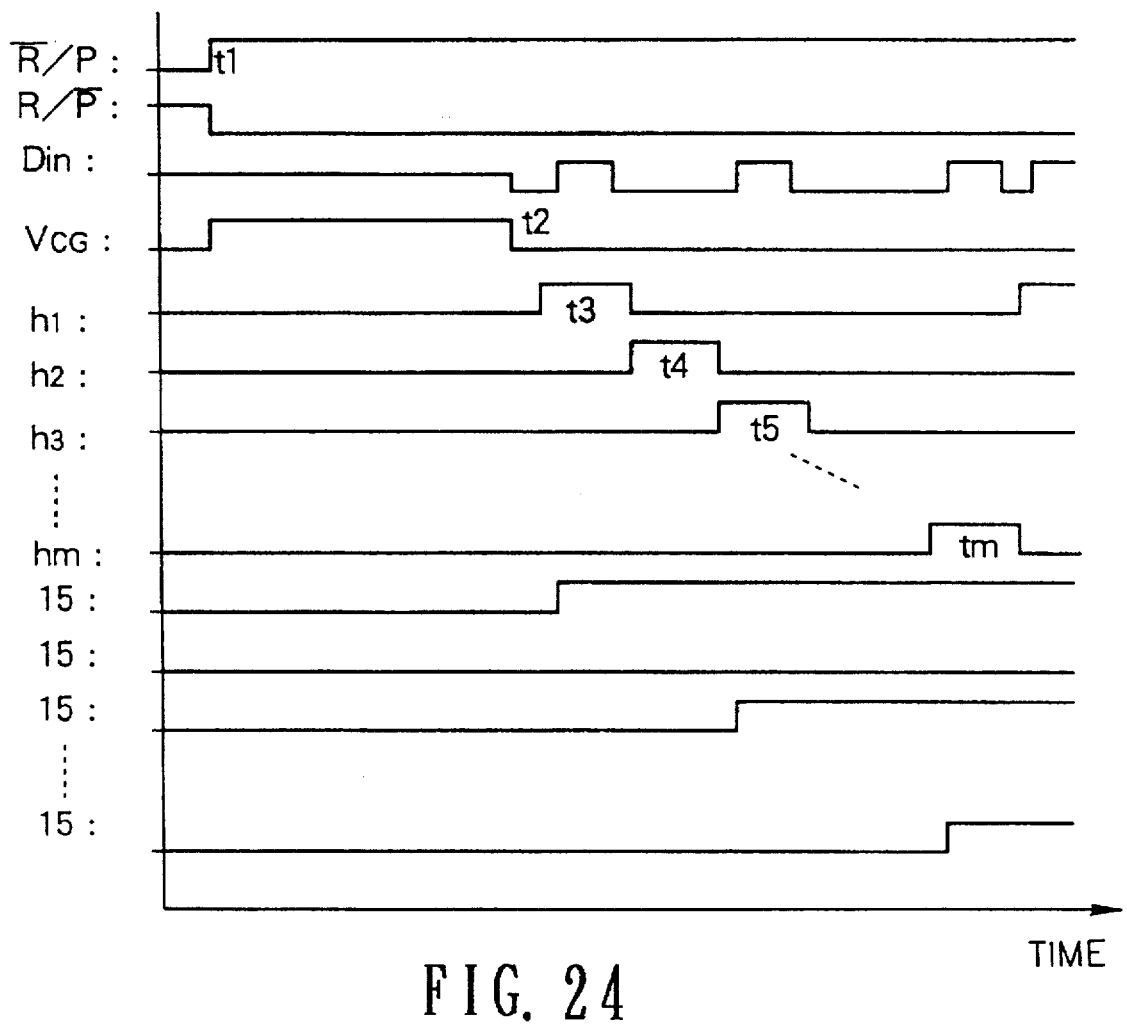
FIG. 24 is a signal waveform diagram showing the respective signals shown in FIG. 22.

FIG. 24 shows the waveforms of the respective signals of the non-volatile semiconductor memory shown in FIG. 22.

As shown in FIG. 24, when data are written to the memory cells, the signal (/R)/(P) is set to a high voltage (a logic "1"), and the signal (R)/(/P) is set to a logic "0" (at t1). Then, the control gates (i.e., VCG) of all the memory cells are set to a high voltage to inject electrons to the floating gates of all the memory cells. After electrons are injected to the floating gates of all the memory cells, VCG is set to 0 V for preparation of the succeeding electron emission (at t2). Then, the signals h1, h2, . . . , hm from the first column decoder CD1 are set to a high voltage (a logic "1") in sequence to transmit inputted data to the corresponding column lines (at t3 to tm). Although the column lines 15 are set to the high voltage or kept at 0 V as they are, according to the inputted data. In the selected memory cells connected to the column lines 15 set to the high voltage, electrons are emitted from the floating gates thereof, and in the selected memory cells connected to the column lines 15 set to 0 V, electrons are kept injected to the floating gates thereof. After one of a binary data is written to all the memory cell by injecting electrons to the floating gate of all the memory cells, the other of a binary data is selectively written to the memory cells by selectively emitting electrons from the floating gate of the memory cells. Data can be written in the memory cells, as described above.

Figure 25:
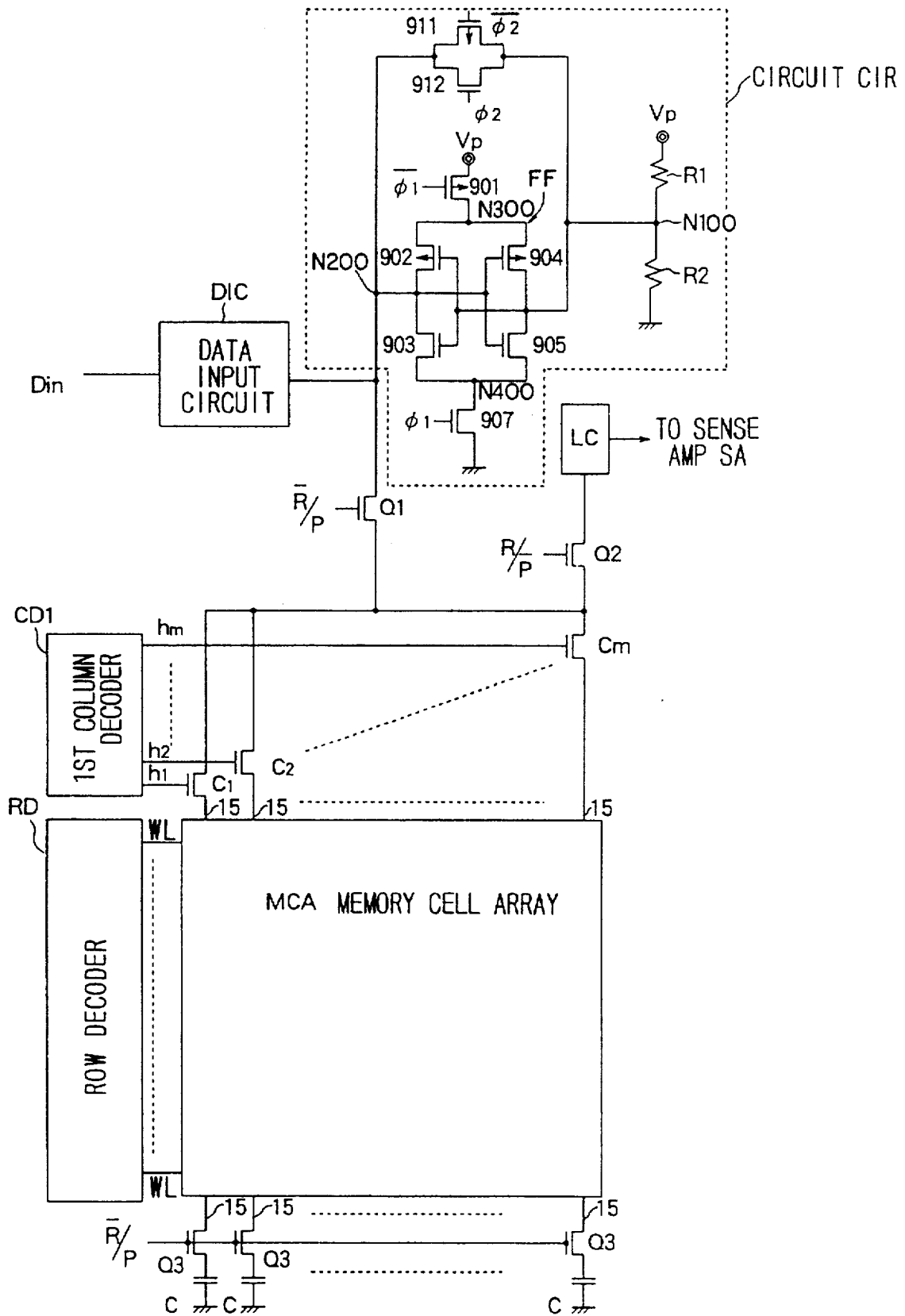
FIG. 25 is a block diagram showing a fourth embodiment of the fifth aspect of the present invention.

FIG. 25 is still another embodiment of the fifth aspect of the present invention. In the same way as with the case of the embodiment shown in FIG. 22, the latch circuits L are not used and further a circuit CIR is added to the embodiment shown in FIG. 22.

In the circuit CIR shown in FIG. 25, P-channel type transistor 901 is connected between high voltage supply Vp and node N300. The signal /ϕ1 is applied to the gate of the transistor 901. Between node 300 and node 400, a series circuit of P-channel type transistor 902 and N-channel type transistor 903 and another series circuit of P-channel type transistor 904 and N-channel type transistor 905 are connected in parallel to each other. N-channel type transistor 907 is connected between the node 400 and the ground potential. The signal ϕ1 is applied to the gate of the transistor 907. A junction point (node N200) between the transistors 902 and 903 is connected to the gates of the transistors 904 and 905. A junction point (node N100) between the transistors 904 and 905 is connected to the gates of the transistors 902 and 903. Between the nodes N100 and N200, P-channel type transistor 911 and N-channel type transistor 912 are connected in parallel to each other. To the gates of these transistors 911 and 912, signals /ϕ2 and ϕ2 are supplied, respectively. The signal /ϕ2 is gotten by inverting the signal ϕ2. A junction point between resistors R1 and R2 is connected to the node N100. The resistors R1 and R2 are connected in series between the high supply voltage Vp and the ground potential. The node N200 is connected to an output terminal of the data input circuit DIC.

In the embodiment shown in FIG. 22, in order to prevent the potential at the column lines 15 from being lowered due to the leak current, data must be inputted many times. In contrast with this, in this embodiment shown in FIG. 25, the potential at the column lines 15 is detected and amplified again by the circuit CIR. Accordingly, the data are inputted only once.

Figure 26:
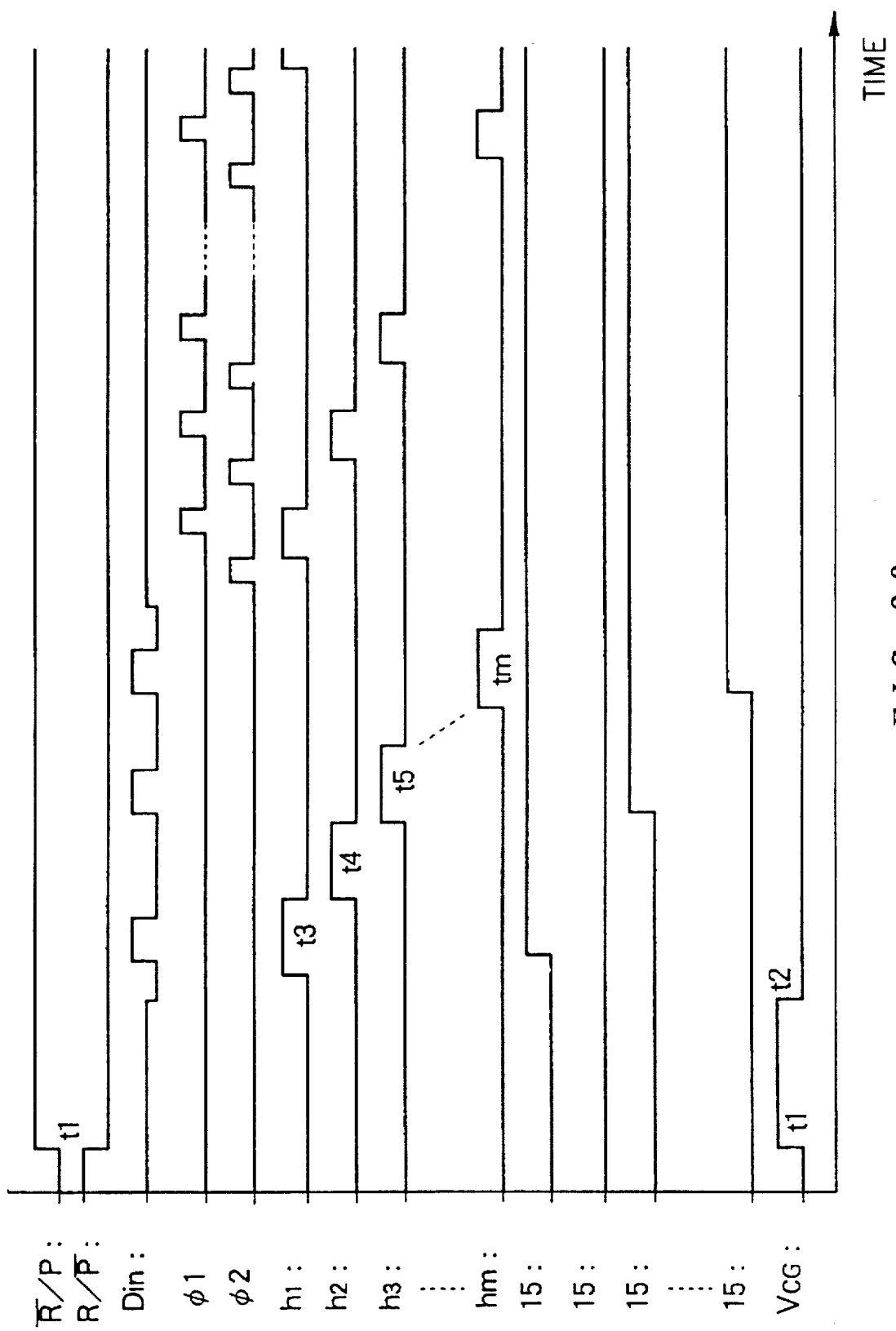
FIG. 26 is a signal waveform diagram showing the respective signals shown in FIG. 25.
Figure 27:
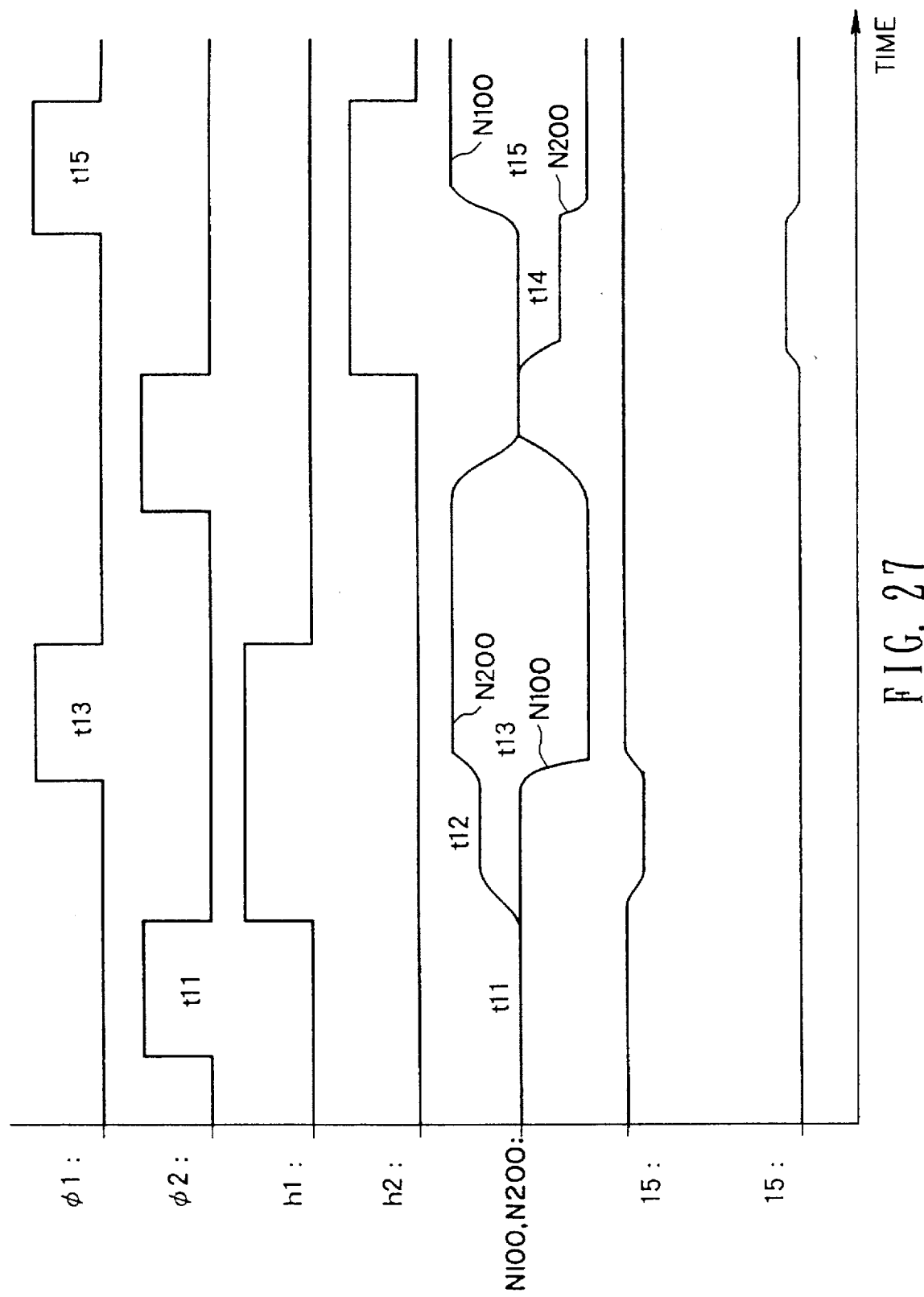
FIG. 27 is a signal waveform diagram showing the respective signals shown in FIG. 25.
Figure 28:
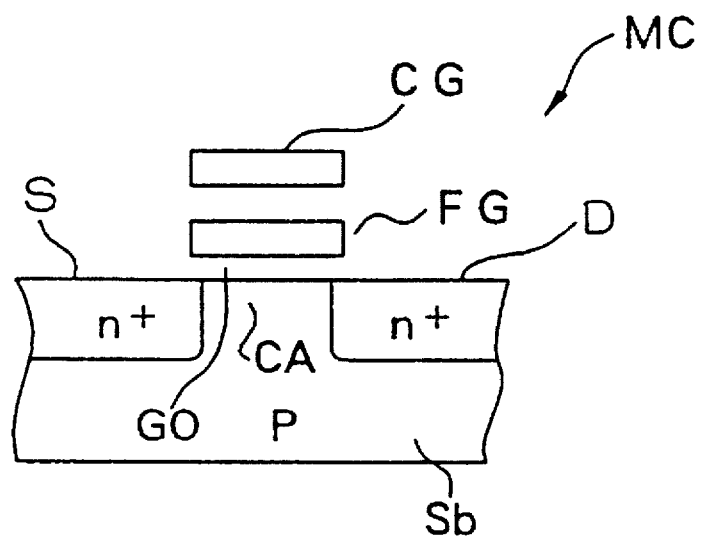
FIG. 28 is a cross-sectional view showing the conventional NAND type EEPROM memory cell.
Figure 30:
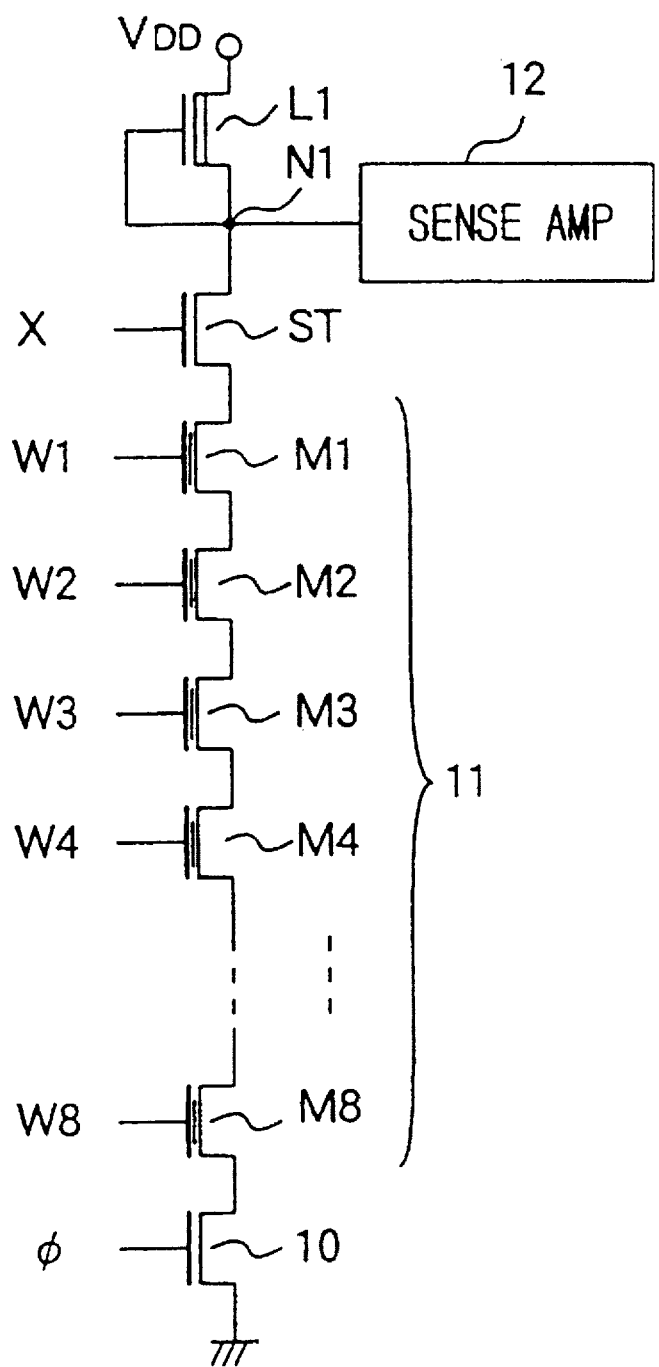
FIG. 30 is an illustration for assistance in explaining the data read from the NAND type EEPROM.
Figure 31:
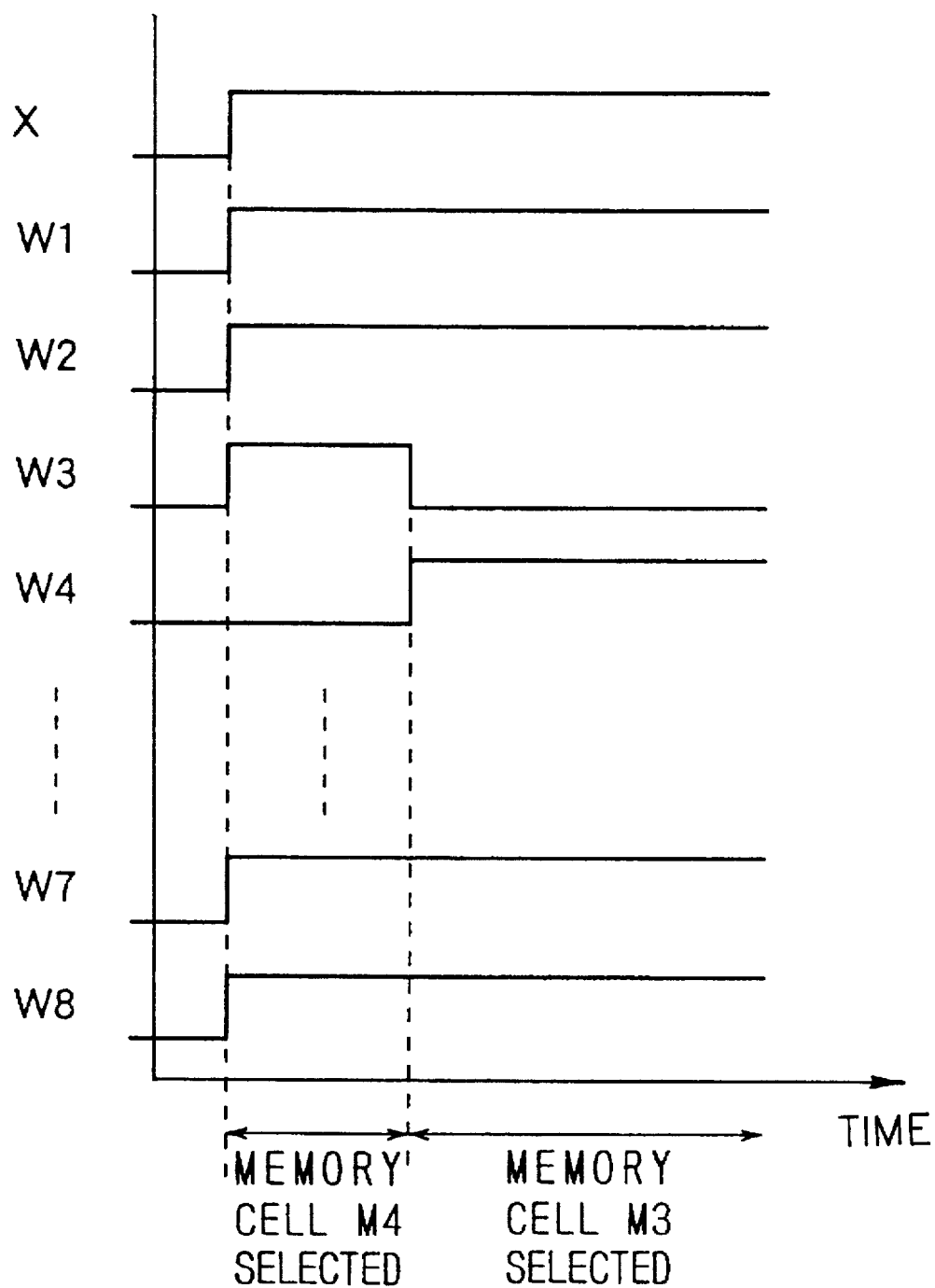
FIG. 31 is a timing chart thereof.
Figure 34:
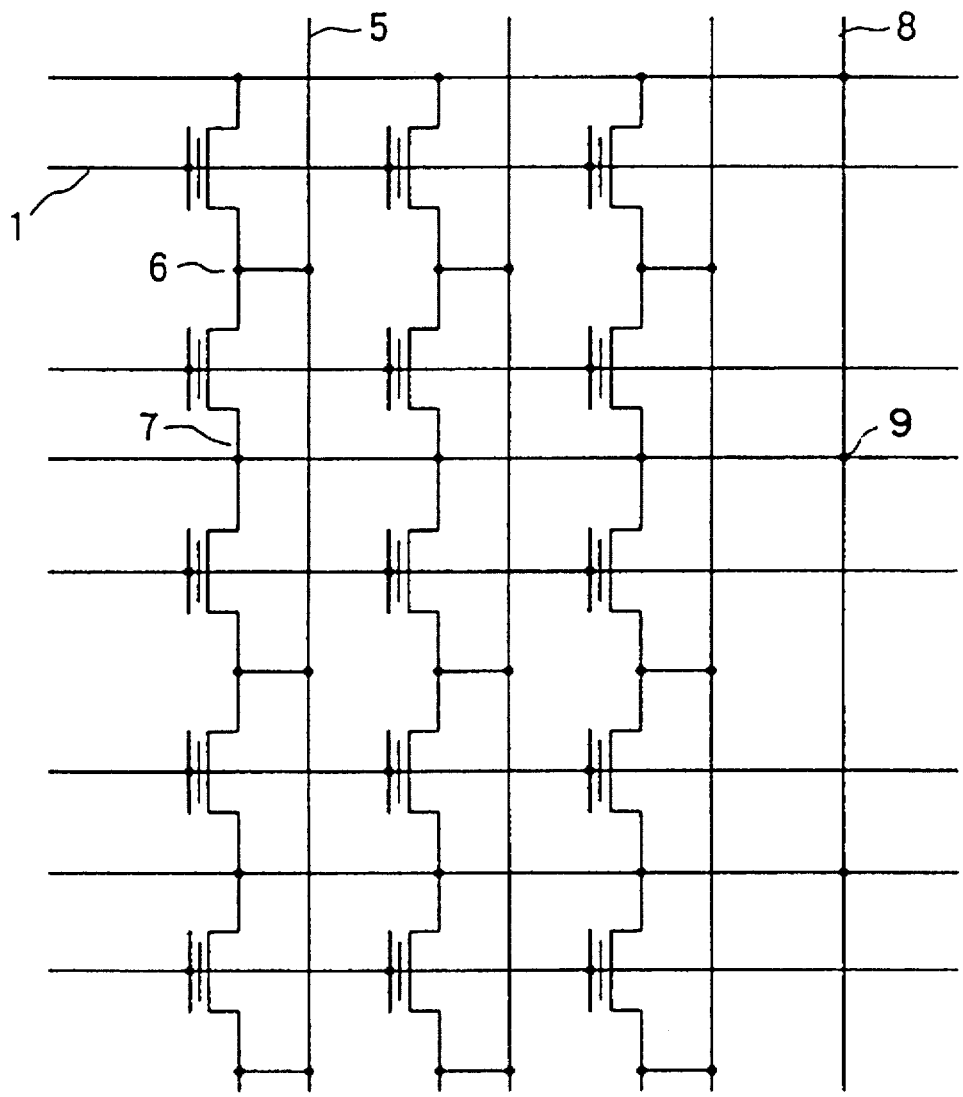
FIG. 34 is a symbolic diagram of the EEPROM shown in FIG. 33.
Figure 35:
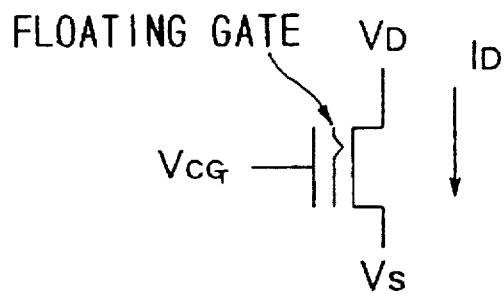
FIG. 35 is an EEPROM memory cell.
Figure 36:
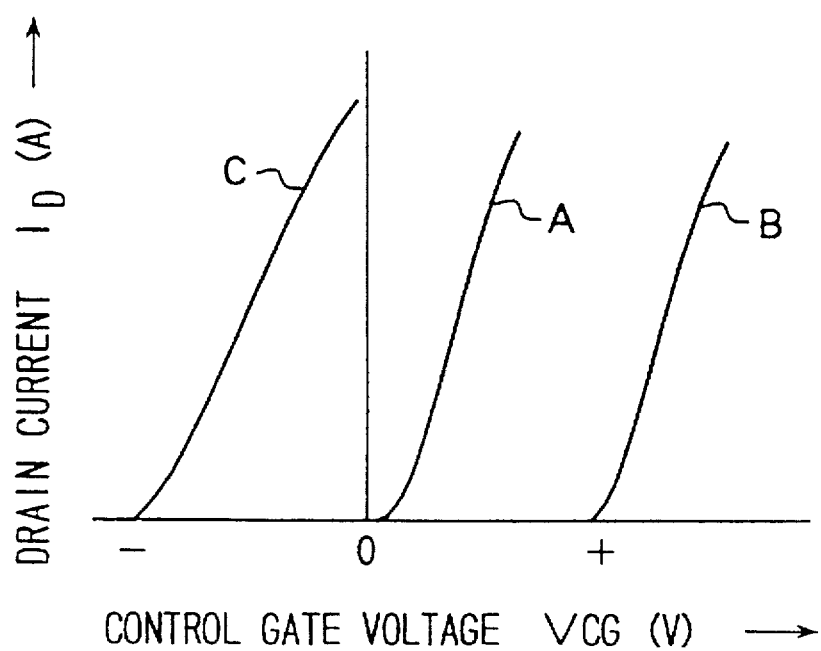
FIG. 36 is a characteristic diagram thereof.
Figure 37:
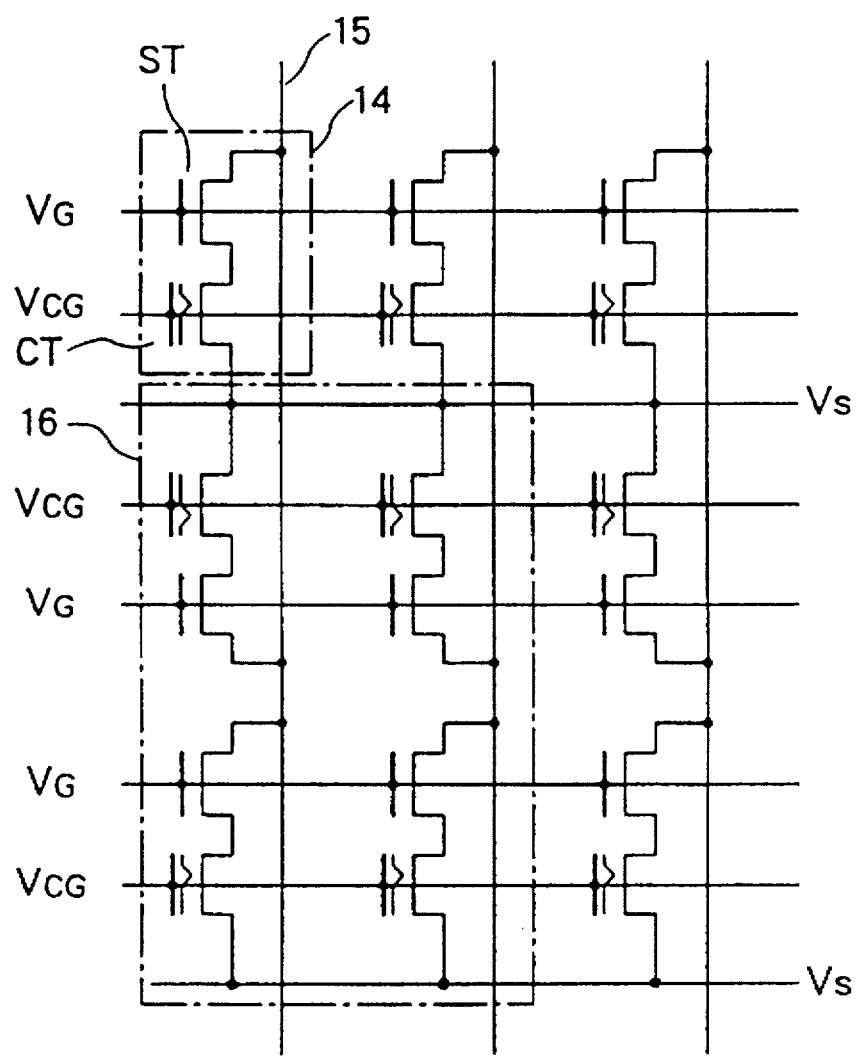
FIG. 37 is a circuit diagram showing an essential portion of the EEPROM using the memory cells shown in FIG. 35.
Figure 38:
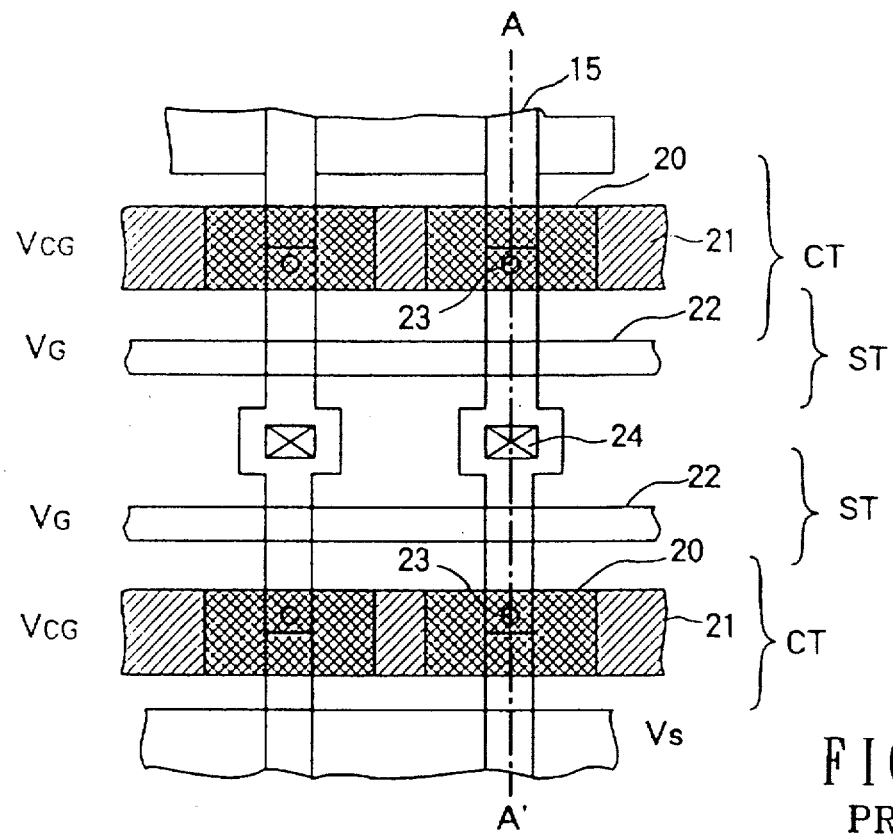
FIGS. 38(a) and (b) are a plane view showing a pattern of the circuit shown in FIG. 37 and a cross-sectional view taken along the line A—A' in FIG. 38(a)
Figure 38:
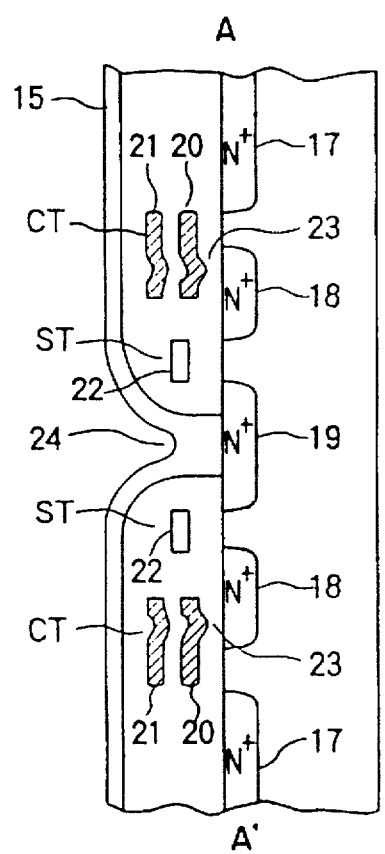
Figure 39:
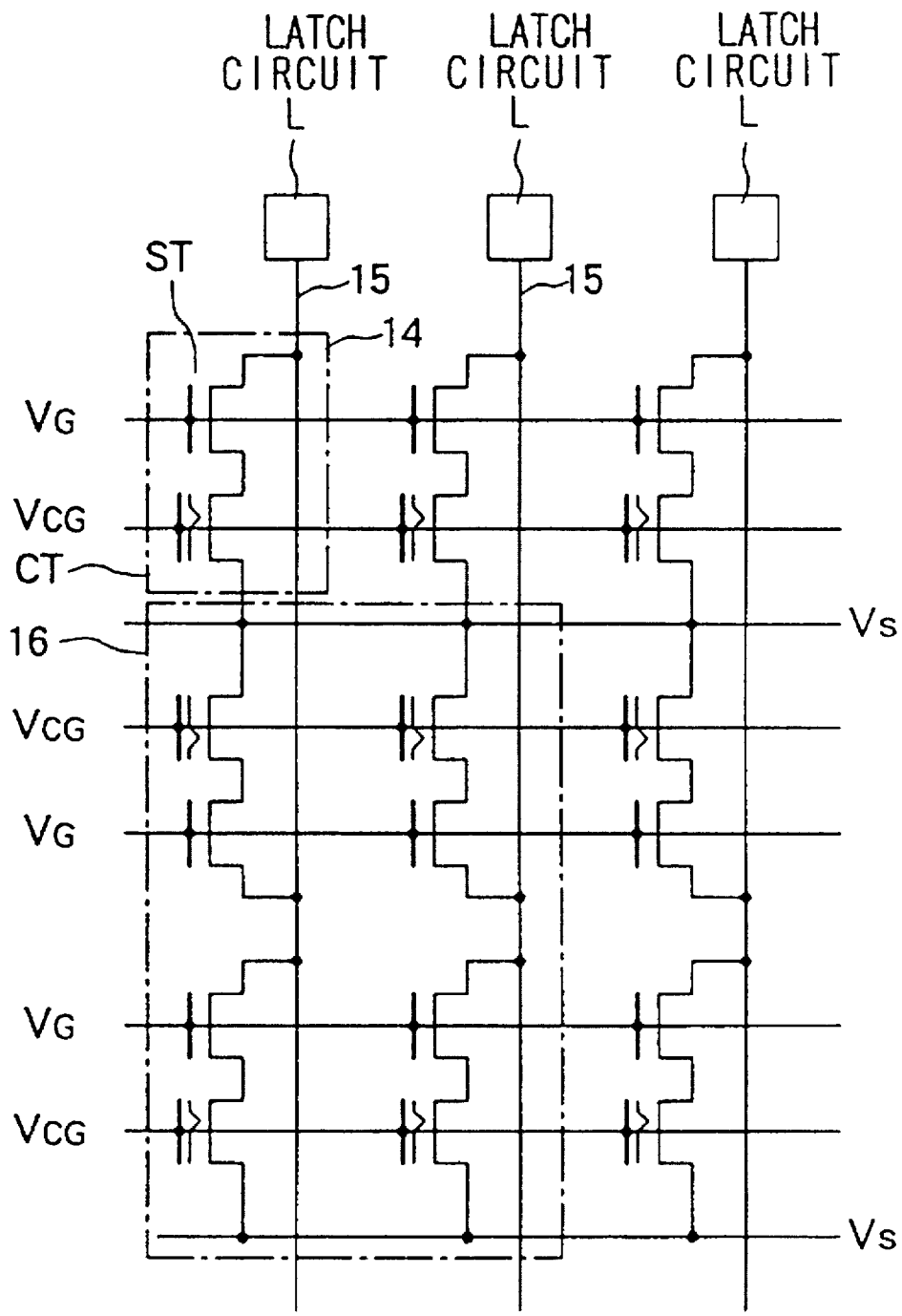
FIG. 39 is a circuit diagram showing the latch circuit portions of the EEPROM.

FIGS. 26 and 27 show the waveforms of the respective signals thereof. In the same way as in FIG. 22, when data are written, the signal (/R)/(P) is set to a high voltage (a logic "1"), and the signal (R)/(/P) is set to a logic "0" (at t1). Then, the control gates (i.e., VCG) of all the memory cells are set to a high voltage to inject electrons to the floating gates of all the memory cells (at t1). After electrons are injected to the floating gates of all the memory cells, the VCG is set to 0 V for preparation of the succeeding electron emission (at t2). The signals h1, h2, . . . , hm from the column decoder CD1 are set to a high voltage (a logic "1") in sequence to transmit inputted data to the corresponding column lines (at t3 to tm). Although the column lines 15 are set to a high voltage or kept at 0 V as they are, according to the inputted data. In the selected memory cells connected to the column lines 15 set to the high voltage, electrons are emitted from the floating gates thereof, and in the selected memory cells connected to the column lines 15 set to 0 V, electrons are kept injected to the floating gates thereof.

The circuit CIR compares the potential at the node N100 with that at the N200, and amplifies the potential at the node N200 according to the compared result. The potential at the node N100 can be obtained from the junction point between the resistors R1 and R2. The potential at the node N100 is an intermediate level between the high voltage level at the node N200 and the low voltage level. A sort of flip-flop circuit FF composed of transistors 902 to 905 amplifies the potential at the node N200. FIG. 27 is an enlarged waveform diagram showing the relationship between the signals $\phi1$, $\phi2$ and output signals h1, h2 of the column decoder CD1, together with the potentials at the nodes N100 and N200 and the column line 15. As shown in FIG. 27, when the signal $\phi2$ changes to a logic "1", since the nodes N100 and N200 are connected to each other through the transistors 911 and 912, the potential at the node N100 is roughly equal to that at the node 200 (at t11). And then, the signal $\phi2$ changes to a logic "0", so the transistors 911 and 912 are turned off. After that, the column line 15 is selected by the column decoder CD1, the potential at the selected column line 15 appears at the node N200. When the selected column line 15 is charged to the high voltage, the voltage at the node N200 rises (at t12). And then, since the signal $\phi1$ changes to a logic "1" and the signal /$\phi1$ is changes to a logic "0", the transistors 901 and 917 connected to the flip-flop FF are turned on. So, the flip-flop FF is enabled (at t13). Since the potential at the node N200 is higher than that at the node N100, the flip-flop FF raises the node N200 to the high voltage Vp and sets the node N100 to 0 V. On the other hand, when the selected column line is 0 V, the potential at the node N200 falls below that at the node N100 (at t14). Therefore, when the signal $\phi1$ changes to a logic "1", the flip-flop FF discharges the potential at the node N200 to 0 V (at t15). As described above, in the embodiment shown in FIG. 25, the column line 15 is selected; the potential at the selected column line 15 is monitored; and the potential is amplified to the original potential again. Therefore, the latch circuits L are not necessary. Here, if there exists a margin in chip size and thereby the circuit CIR as described above can be provided for each column line, since all the column lines can be amplified simultaneously, it is unnecessary to control the column decoder for each column line.

As described above, in the fifth aspect of the present invention, since it has been noticed that electrons are emitted from and injected to the floating gate of the memory cells by using the electron tunnel effect and since it has been utilized the fact that almost no current is consumed in the memory cell sections when data are programmed, the data latch circuits can be formed at any desired positions remote from the memory cell array, with the result that it is possible to provide a non-volatile semiconductor memory whose chip size can be reduced.

Further, in the fifth aspect of the present invention, since the potential at the column line 15 is monitored and further this potential is amplified to prevent the potential from being lowered at the column line 15, the latch circuits are not particularly required, so that it is possible to realize non-volatile semiconductor memory whose chip size can be further reduced.

Further, without being limited to only the non-volatile semiconductor memory having the memory cells as explained by way of the embodiments, the present invention can be applied to any semiconductor memory in which electrons are injected to and emitted from the floating gates thereof by using the electron tunnel effect. Since being related to the control of the potentials of the column lines executed when data are written in the memory cells, the present invention can be applied to any cases as far as electrons are emitted from or injected to the floating gates of the memory cells by the utilization of the column line potential, irrespective of the method of writing data. For instance, it is of course possible to apply the present invention to EEPROM having memory cells of NAND type. In this case, first electrons are emitted from the floating gates of all the memory cells to set the threshold voltages of the memory cells to negative values. After that, with respect to the memory cells to which electrons are injected, the column lines are set to 0 V; and with respect to the memory cells to which electrons are not injected, the column lines are set to an appropriate voltage V3 at which no tunnel effect is caused. At the same time, a selected row line is set to a high voltage. In this case, it is preferable that the voltage supplied to the flip-flop FF is V3 instead of the Vp of FIG. 25. As described above, when the method of applying voltage to the column lines is modified in various ways, it is possible to apply the present invention to any semiconductor memory.

As described above, in the first aspect of the present invention, it is possible to set the memory cells which correspond to the more bit side data of a binary data ("0" data or "1" data) in the memory cells constituting each memory block to the negative voltage, so that it is possible to increase the current flowing through the memory block and thereby to improve the data read speed.

In the second aspect of the present invention, it is possible to use in common one column line for at least two adjacent memory blocks in the same row as one column line. Accordingly, it is possible to reduce the area ratio occupied by the junction portions between the memory block and the column line to that occupied by the memory cell array and further to decrease the number of column lines to reduce the number of wires, so that it is possible to improve the production yield.

In the third aspect of the present invention, it is possible to reduce the threshold voltage of each memory cell after electrons have been injected to the floating gate thereof for data programming, so that the data read speed can be increased. In the fourth aspect of the present invention, after electrons have been emitted from the floating gates of the memory cells to set the threshold voltages thereof to the negative value, one of a binary data are stored by injecting electrons to the floating gates of the memory cells. Consequently, it is possible to suppress the distribution width of the threshold voltages of the memory cells and thereby to increase the data read speed.

In the fifth aspect of the present invention, it is possible to form the data latch circuits at any positions remote from the memory cell array, so that the chip size can be reduced.

What is claimed is:

1. A non-volatile semiconductor memory device, comprising:

a memory cell array including memory cells arranged in matrix form having row lines and column lines, each of the memory cells including a transistor having a floating gate and a control gate, and storing data in accordance with a storage state of charges of the floating gate, the memory cells in the same row being commonly connected to one of the row lines, the memory cells in the same column being commonly connected to one of the column lines; and programming means for programming data to a memory cell by applying a program voltage to the corresponding row line to inject electrons to the floating gate of the memory cell by using an electron tunnel effect, the memory cell having a threshold voltage varying in dependence upon the amount of charge on its floating gate, wherein if the threshold voltage of the memory cell is lower than a predetermined threshold voltage level after electrons have been injected to the floating gate of the memory cell by applying the program voltage having a first voltage value, electrons are injected to the floating gate of the memory cell again by applying the program voltage having a second voltage value higher than the first voltage value.

electrons are simultaneously injected to the floating gates of memory cells requiring injection of electrons and connected to one of the row lines, and when the program voltage having the second voltage value is applied to inject electrons to the floating gate of the memory cell whose threshold voltage is lower than the predetermined threshold voltage level, a predetermined voltage is applied to the column line connected to a memory cell whose threshold voltage becomes higher than the predetermined threshold voltage level by applying the program voltage having the first voltage value, in order to prevent electrons from further being injected to the floating gate of the memory cell whose threshold voltage is higher than the predetermined threshold voltage level.

2. A non-volatile semiconductor memory, comprising:

memory cells arranged in a matrix form;

row lines each connected to said memory cells lined in a same row, said row of memory cells being selectively driven by a corresponding one of said row lines;

column lines each connected to said memory cells lined in a same column;

a column decoder for selecting one of said column lines;

a plurality of column gate transistors, one end of each of which is connected to one of said column lines, for selecting one of said column lines under switching control by said column decoder, another end of each of said column gate transistors being connected in common; and data programming means, connected to the end of each said column gate transistors that is connected in common, for programming data to one of said memory cells connected to one of said column lines selected by said column decoder through said column gate transistor, said data programming means including latching circuits each for storing data to be programmed to each of said memory cells, a potential being supplied to each of said column lines on the basis of data stored in the latching circuits, wherein one of said column gate transistors is turned on by said column decoder, a potential is supplied to a selected one of said column lines through said selected one of said column gate transistors from said data programming means, the supplied potential corresponding to said latched data of a corresponding one of the latch circuits, said column gate transistor is turned off by said column decoder and the supplied potential at the selected column line is held as program data to a selected memory cell, and then next one of said column gate transistors is turned on by said column decoder, a potential is supplied to next selected one of said column lines through said next selected one of said column gate transistors from said data programming means, the supplied potential corresponding to the latched data of the corresponding next one of said latch circuits, and said next column gate transistor is turned off by said column decoder and the supplied potential at the next column line is held as program data to a next selected memory cell.

3. A non-volatile semiconductor memory, comprising:

memory cells arranged in a matrix form;

row lines each connected to said memory cells lined in a same row, said row of memory cells selectively driven by a corresponding one of said row lines;

column lines each connected to said memory cells lined in a same column;

a column decoder for selecting one of said column lines;

a plurality of column gate transistors, one end of each of which is connected to one of said column lines, for selecting one of said column lines under switching control by said column decoder; and data programming means, commonly connected to another end of each of said column gate transistors, for programming data to one of said memory cells connected to one of said column lines selected by said column decoder, wherein one of said column gate transistors is turned on by said column decoder and data to be programmed from said programming means is supplied to selected one of said column lines through selected one of said column gate transistors to supply potential corresponding to said data to selected one of said column lines, said column decoder turns off the selected column gate transistor and the supplied potential at the selected column line is held as program data to said selected memory cell, and said programming means includes an amplifier circuit for monitoring the potential at said column lines and amplifying the potential at said column lines in sequence for prevention of potential fluctuations in said column lines.

4. A data programming method for programming data to memory cells in a non-volatile semiconductor memory device having:

a plurality of memory blocks each having a plurality of memory cells and a selecting transistor, each of the memory cells including a transistor having a floating gate, the memory cells being connected in series, and the selecting transistor being connected to one end of the memory cells connected in series to select the memory block;

first row lines each connected to memory cells in the same row in a plurality of memory blocks arranged in a matrix pattern;

column lines each connected to at least two adjacent memory blocks;

a second row line connected to a selecting transistor in one memory block of the two adjacent memory blocks;

a third row line connected to a selecting transistor in the other memory block of the two adjacent memory blocks; and a plurality of switching means each connected between the other end of each of the memory blocks and a reference potential, which method comprises the steps of:
turning off a plurality of the switching means;
setting the second and third row lines to a first potential, setting the first row lines to a second potential lower than the first potential, and setting the column line to a third potential lower than the first potential, to charge the memory cell block from the third potential;
setting the second row line to a fourth potential to turn off the selecting transistor connected to the second row line when the third row line is selected, or setting the third row line to a fourth potential to turn off the selecting transistor connected to the third row line when the second row line is selected;
setting the column line to the third potential or 0 V according to data to be programmed to the selected memory cell; and
setting the selected first row line to the first potential.

* * * * *